(12) United States Patent
Vellianitis et al.

(10) Patent No.: US 12,206,024 B2
(45) Date of Patent: Jan. 21, 2025

(54) TRANSISTORS INCLUDING CRYSTALLINE RAISED ACTIVE REGIONS AND METHODS FOR FORMING THE SAME

(71) Applicant: Taiwan Semiconductor Manufacturing Company Limited, Hsinchu (TW)

(72) Inventors: Georgios Vellianitis, Heverlee (BE); Marcus Johannes Henricus Van Dal, Linden (BE); Gerben Doornbos, Kessel-Lo (BE); Mauricio Manfrini, Zhubei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 224 days.

(21) Appl. No.: 17/738,154

(22) Filed: May 6, 2022

(65) Prior Publication Data

US 2023/0012239 A1  Jan. 12, 2023

Related U.S. Application Data

(60) Provisional application No. 63/220,897, filed on Jul. 12, 2021.

(51) Int. Cl.
*H01L 29/786* (2006.01)
*H01L 27/06* (2006.01)
(Continued)

(52) U.S. Cl.
CPC .... *H01L 29/78693* (2013.01); *H01L 29/0847* (2013.01); *H01L 29/6675* (2013.01)

(58) Field of Classification Search
CPC ......... H01L 29/41725; H01L 29/41733; H01L 29/4175; H01L 29/41766; H01L 29/41775;
(Continued)

(56) References Cited

U.S. PATENT DOCUMENTS 9,246,006 B2 *  1/2016  Batude .............. H01L 21/26513
2011/0215328 A1 *  9/2011  Morosawa ........ H01L 29/78696
257/E21.411

(Continued)

FOREIGN PATENT DOCUMENTS

WO  2018125140 A1  7/2018

OTHER PUBLICATIONS

Taiwanese Patent and Trademark Office, Application No. 111124402, Office Action, mailed Nov. 8, 2022, 6 pages.

*Primary Examiner* — Sonya McCall-Shepard
(74) *Attorney, Agent, or Firm* — The Marbury Law Group, PLLC

(57) ABSTRACT

A transistor includes a vertical stack containing, in order from bottom to top or from top to bottom, a gate electrode, a gate dielectric, and an active layer and located over a substrate. The active layer includes an amorphous semiconductor material. A crystalline source region including a first portion of a crystalline semiconductor material overlies, and is electrically connected to, a first end portion of the active layer. A crystalline drain region including a second portion of the crystalline semiconductor material overlies, and is electrically connected to, a second end portion of the active layer.

20 Claims, 36 Drawing Sheets

(51) Int. Cl.
*H01L 27/088* (2006.01)
*H01L 29/08* (2006.01)
*H01L 29/66* (2006.01)
*H01L 29/78* (2006.01)

(58) Field of Classification Search
CPC ....... H01L 29/41783; H01L 21/823418; H01L 21/823814; H01L 21/823475; H01L 21/823871; H01L 21/76841; H01L 21/76843; H01L 21/76846; H01L 21/7685; H01L 21/76852; H01L 21/76853; H01L 21/76829; H01L 21/76831; H01L 23/5226; H01L 23/52267; H01L 23/5228; H01L 23/528; H01L 23/532; H01L 23/53223; H01L 23/53238; H01L 23/53252; H01L 23/53266; H01L 29/66636; H01L 29/78693; H01L 29/6675; H01L 29/0847; H01L 27/088; H01L 29/7833; H01L 29/78618; H01L 21/02667–02691; H01L 27/1274–1285
See application file for complete search history.

(56) References Cited

U.S. PATENT DOCUMENTS

2015/0031179 A1 1/2015 Thurmer et al.
2018/0114861 A1* 4/2018 Gluschenkov .... H01L 21/76846

* cited by examiner

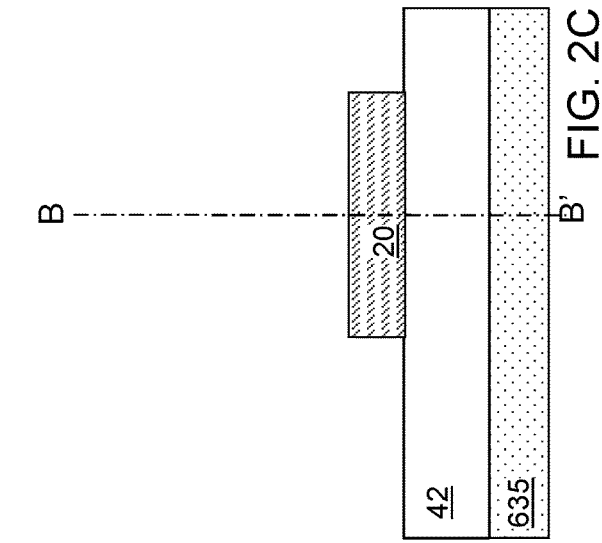
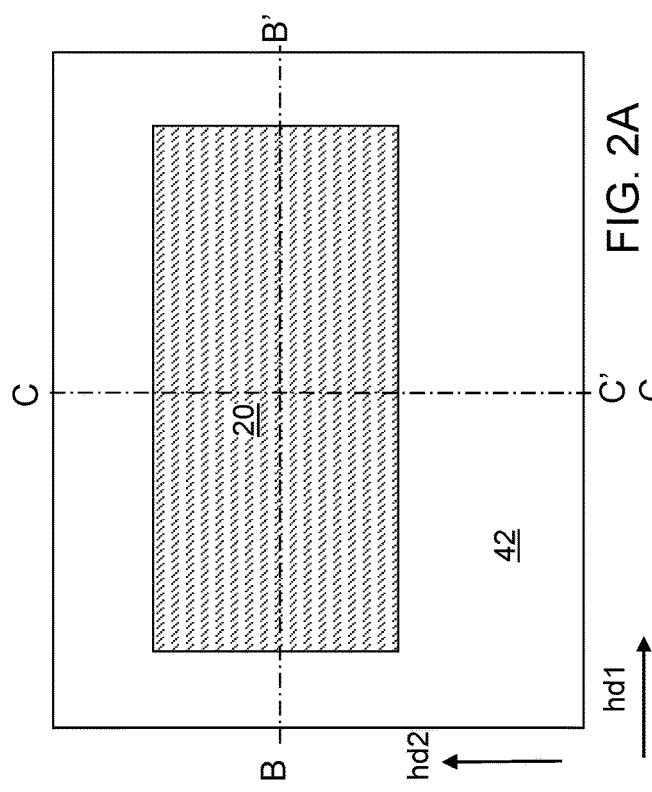

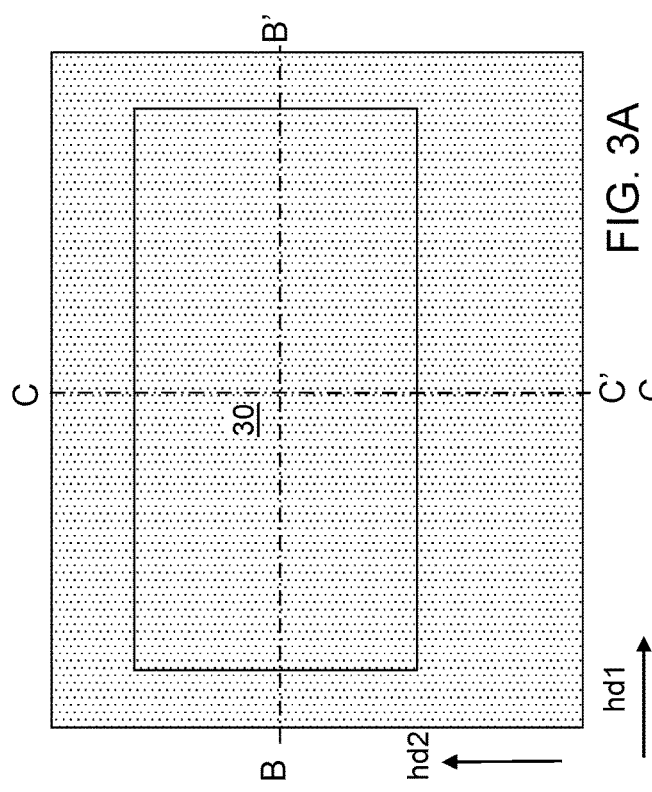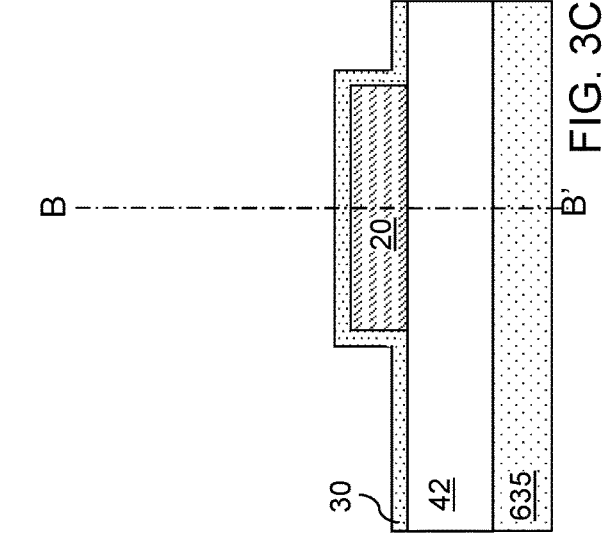

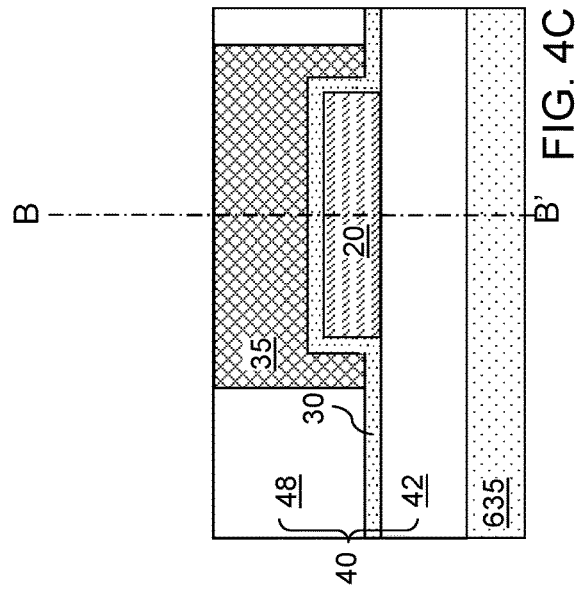
FIG. 4C
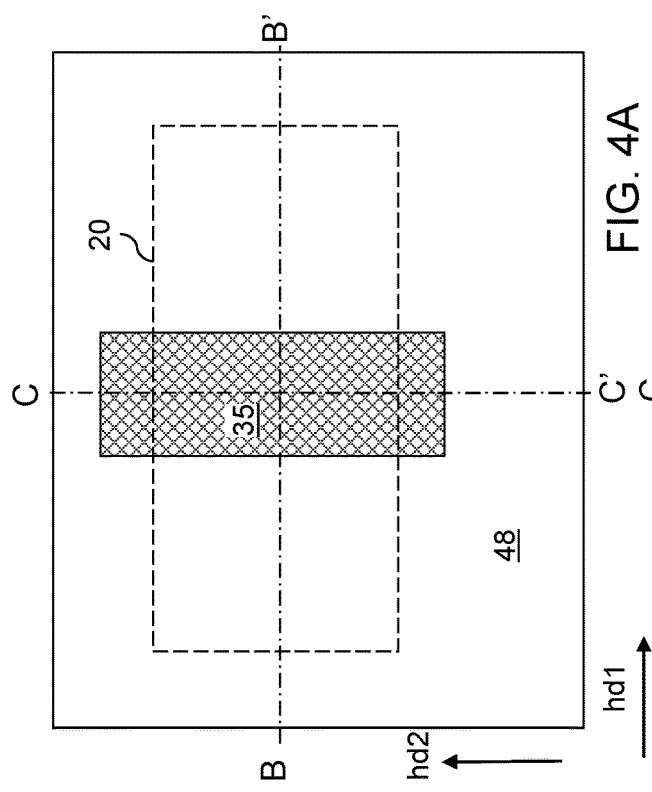
FIG. 4A
FIG. 4B
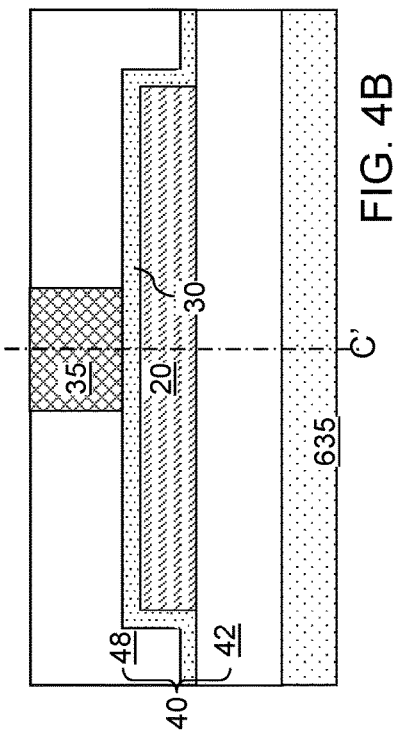

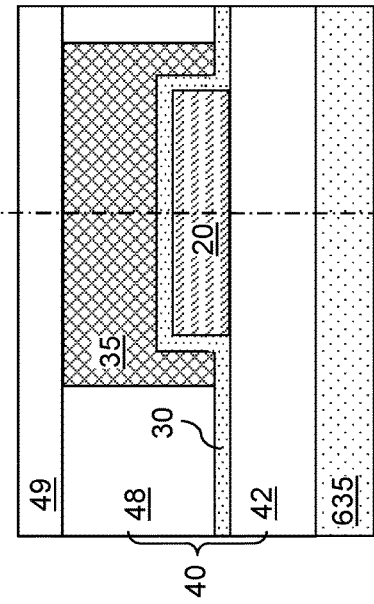
FIG. 5C
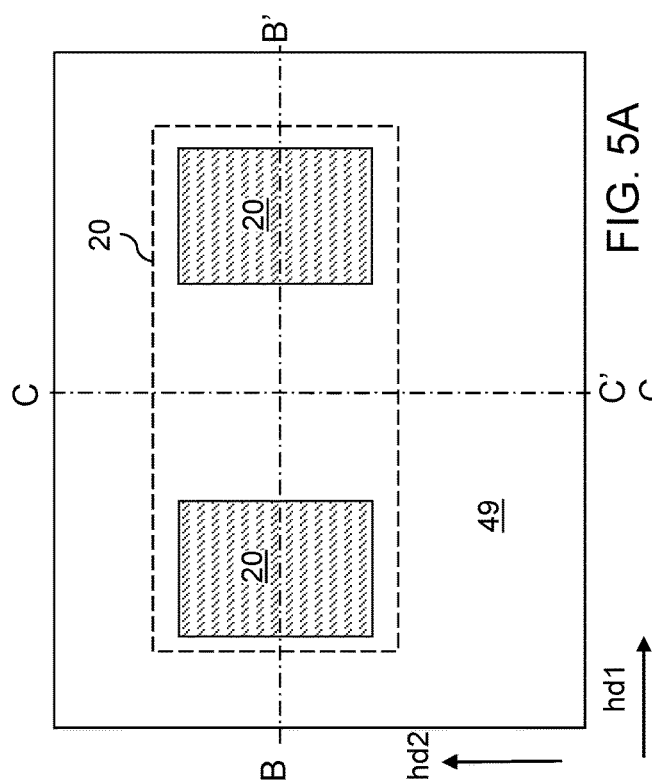
FIG. 5A
FIG. 5B

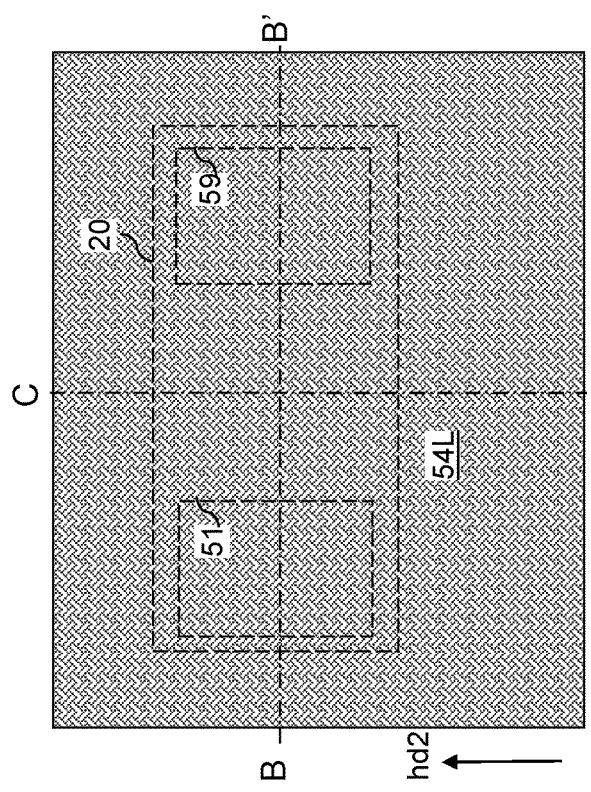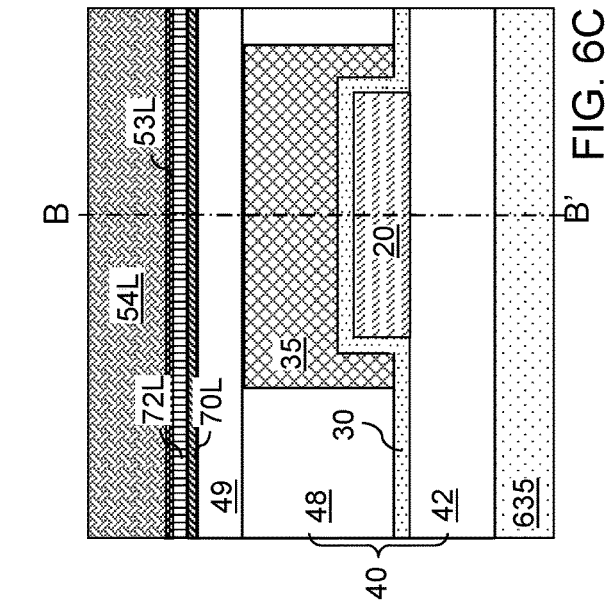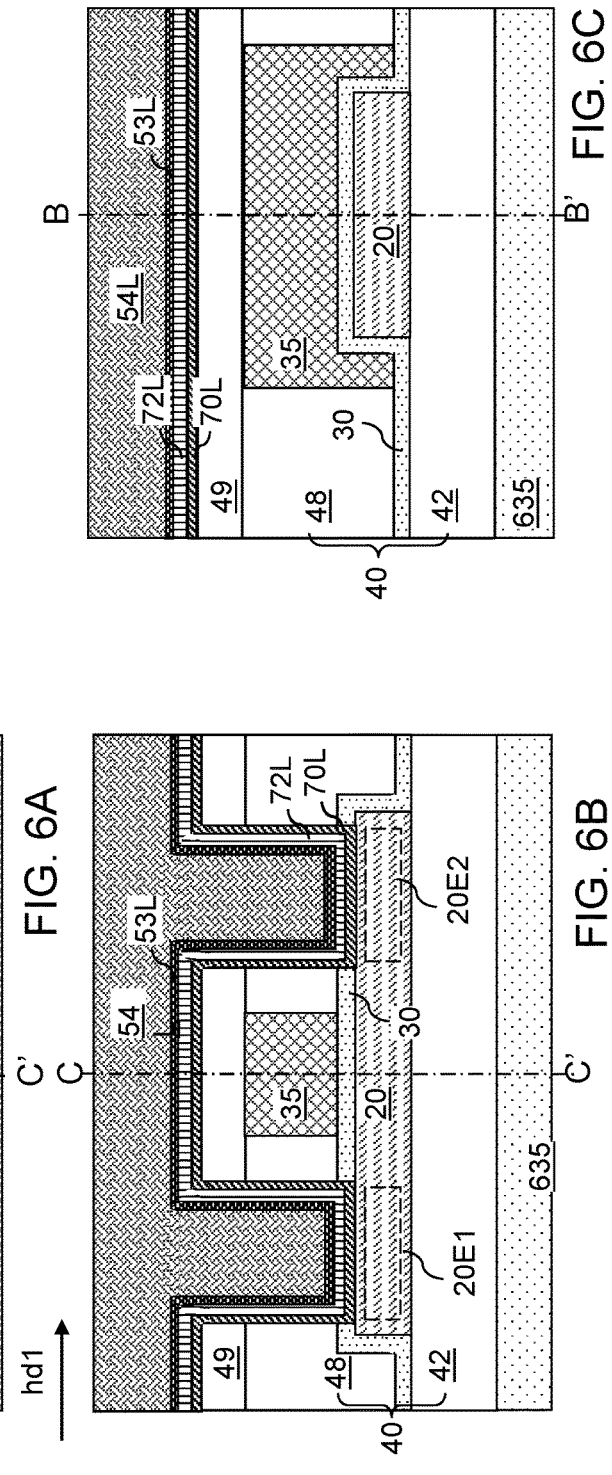

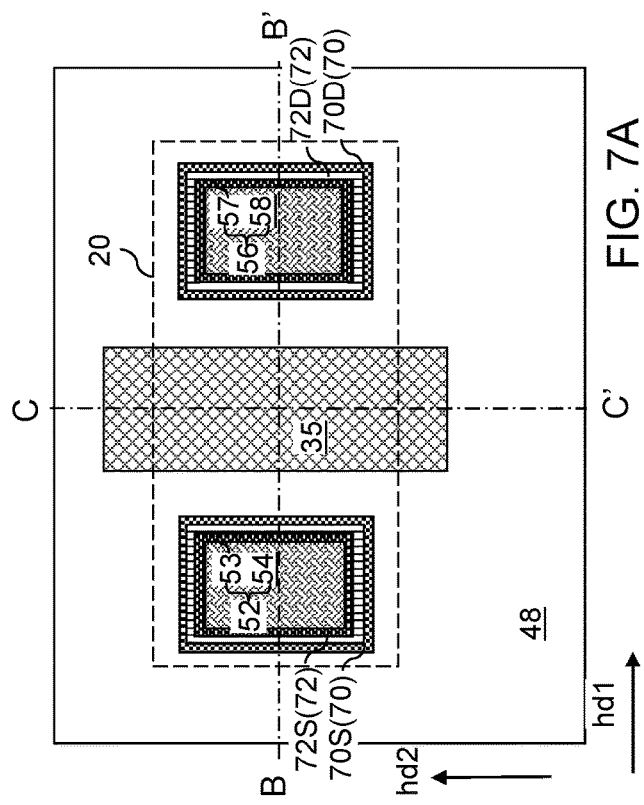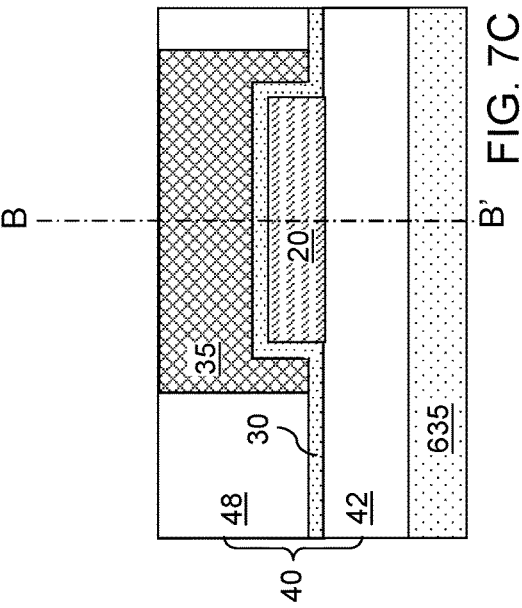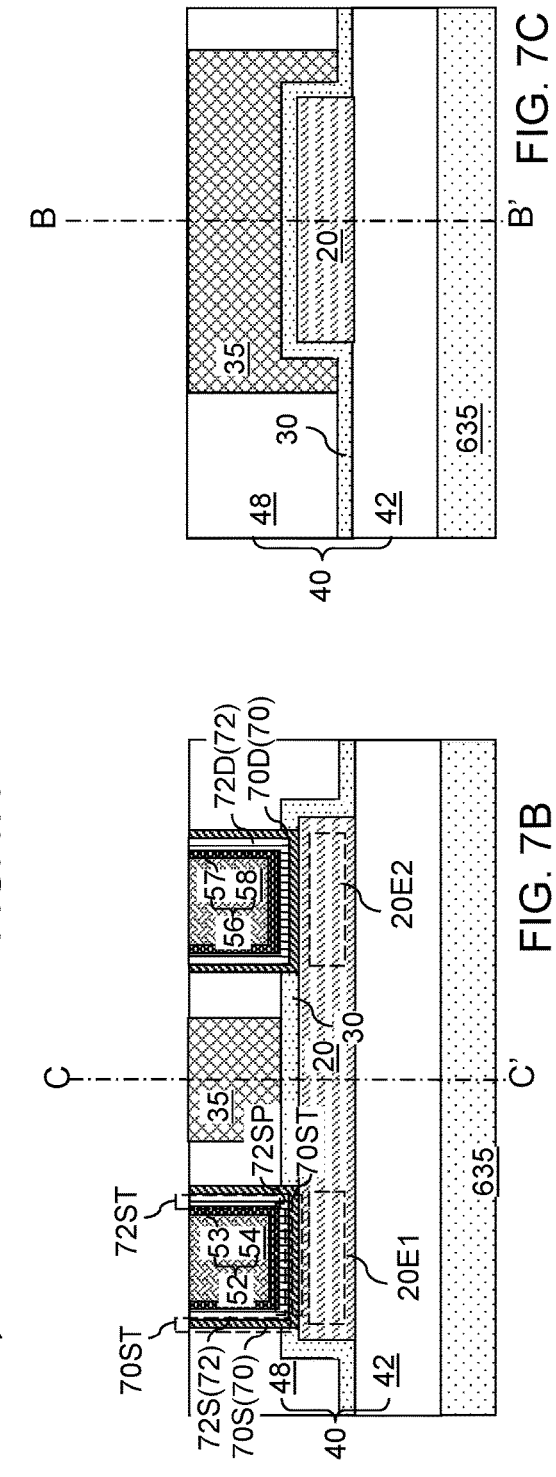

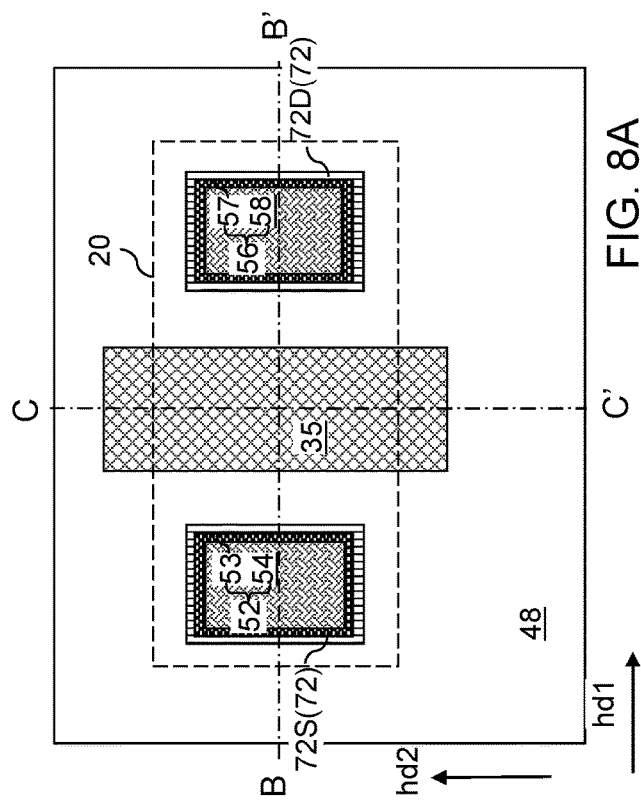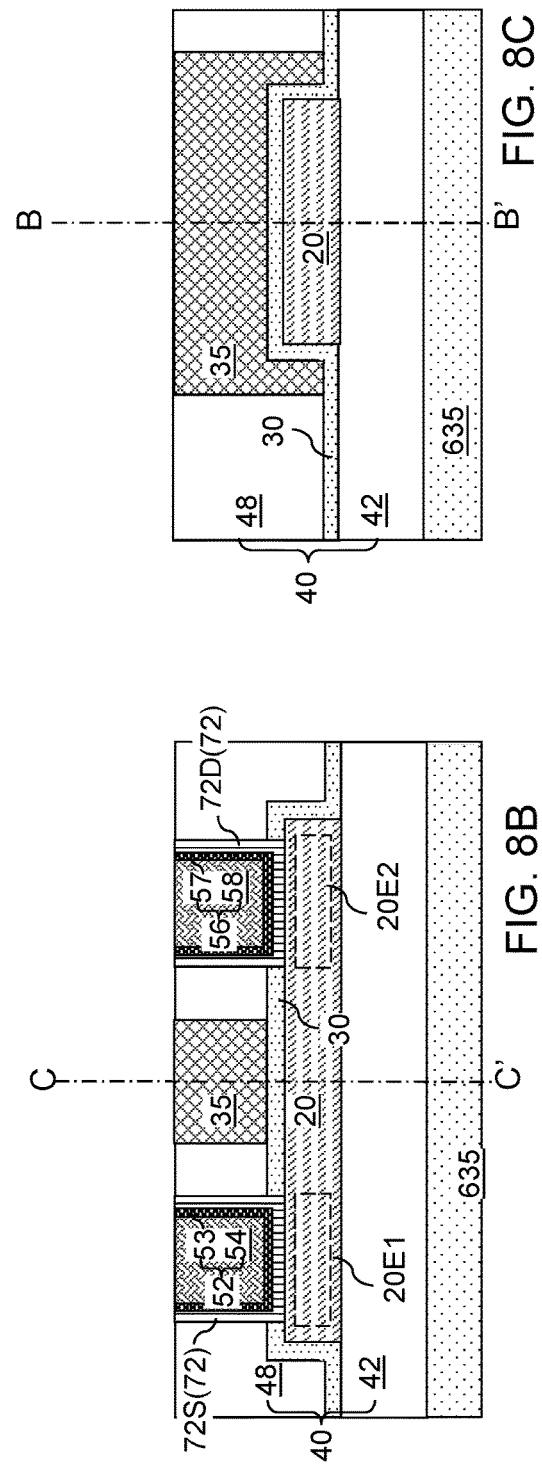

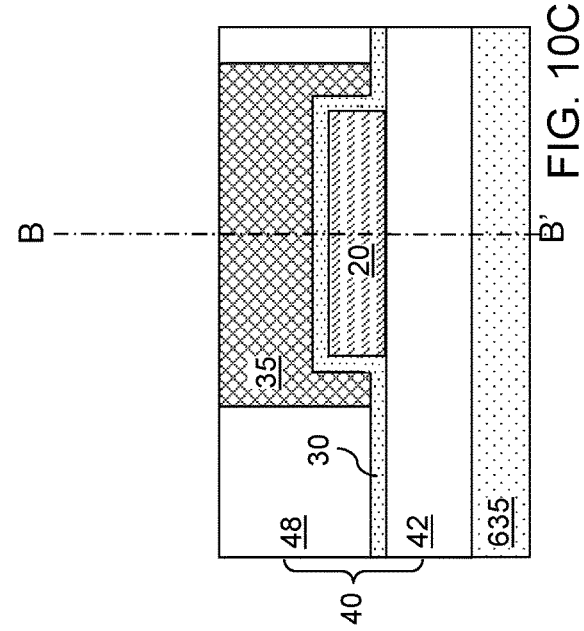
FIG. 10C
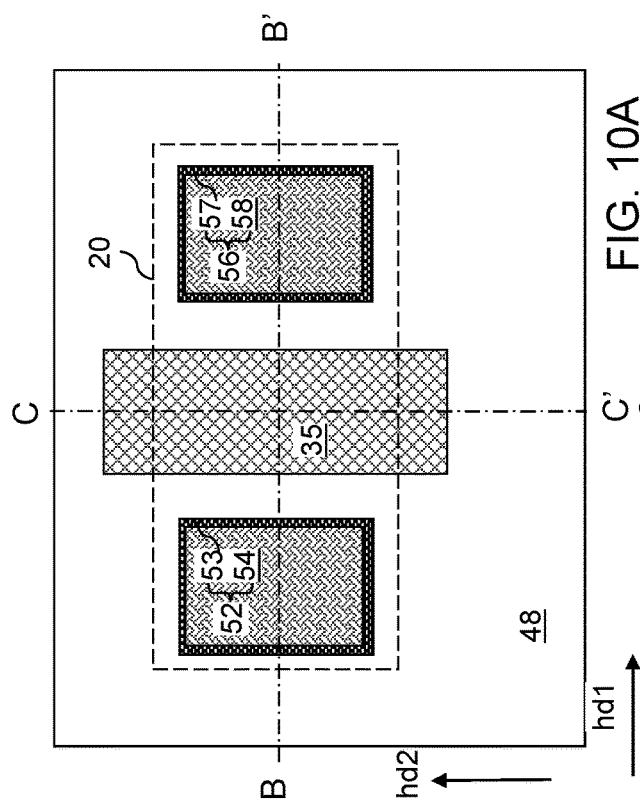
FIG. 10A
FIG. 10B
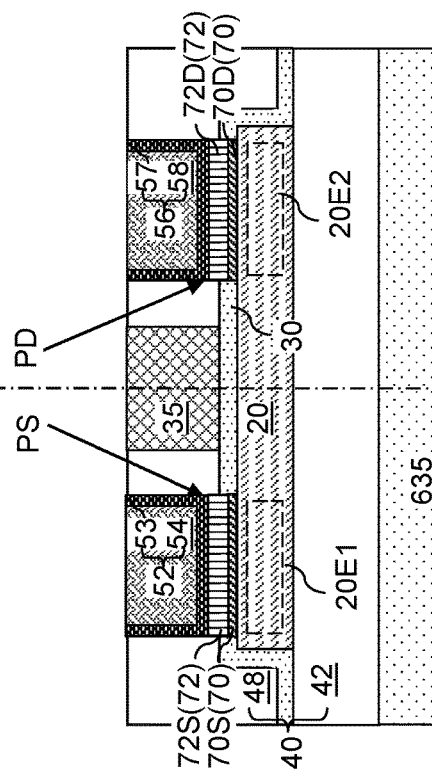

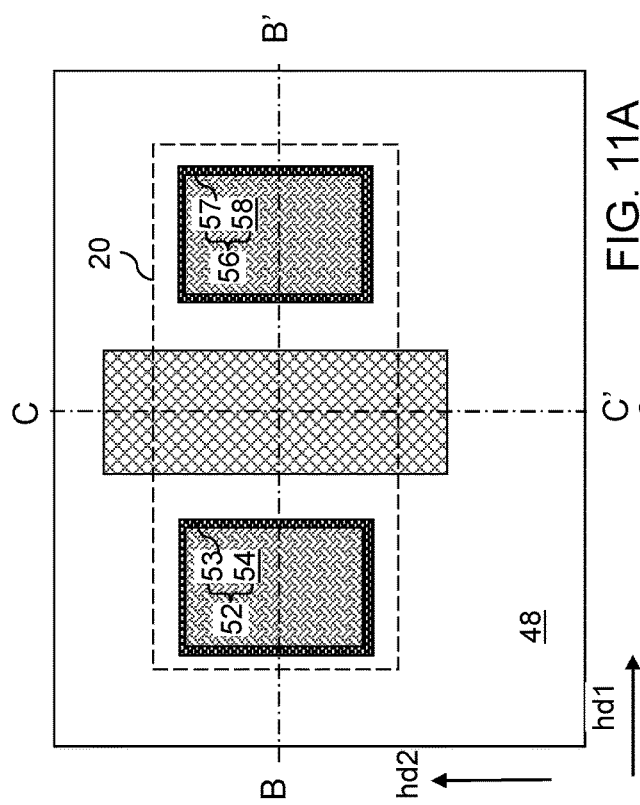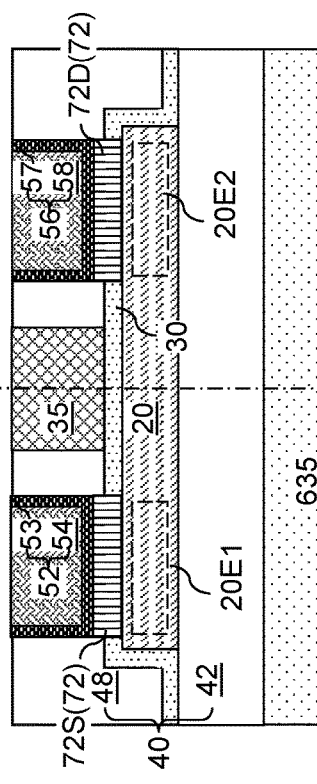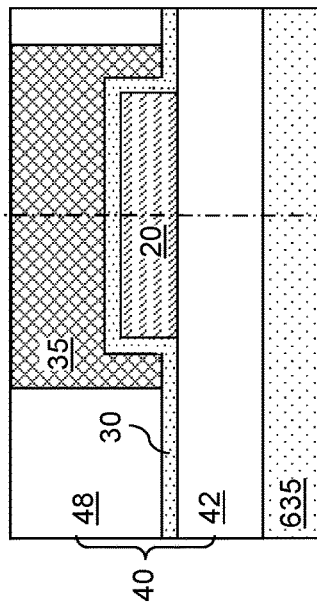

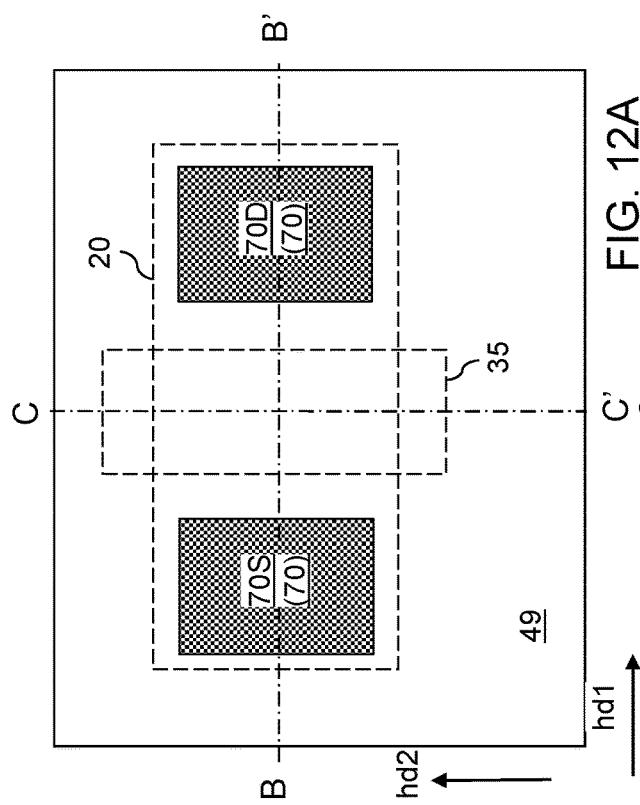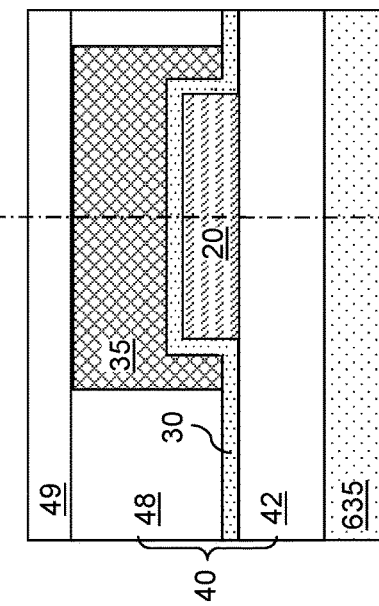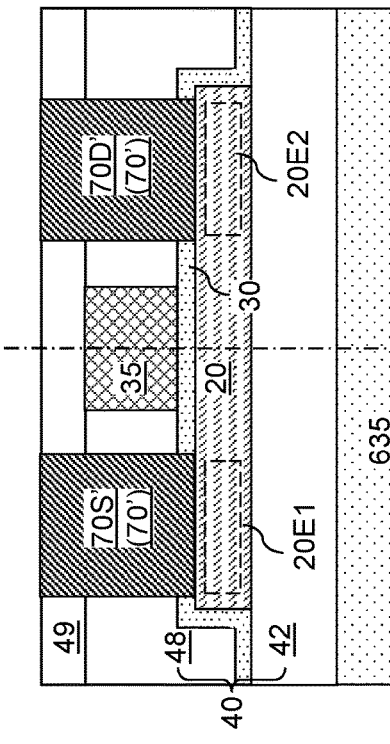

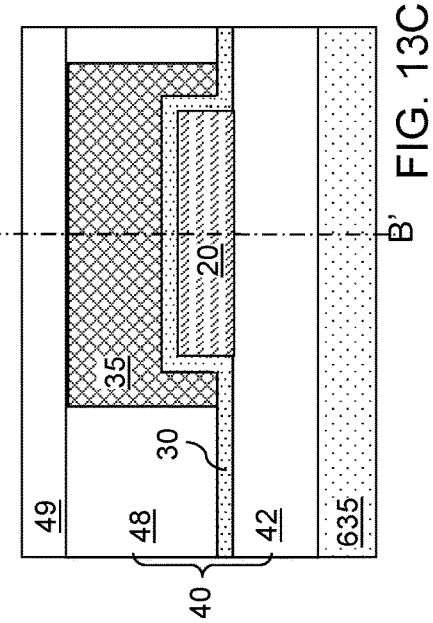
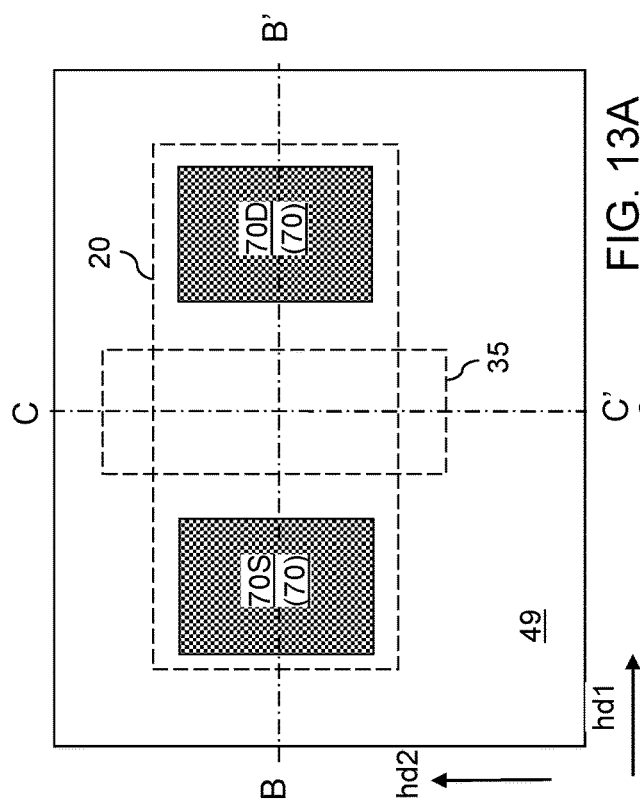
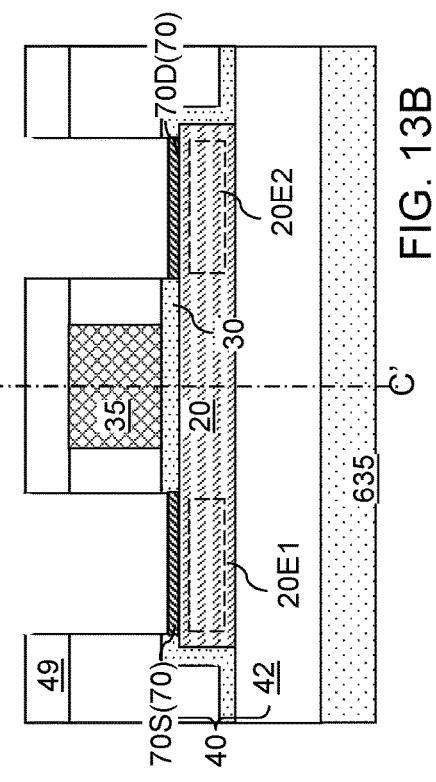
FIG. 13A
FIG. 13B
FIG. 13C

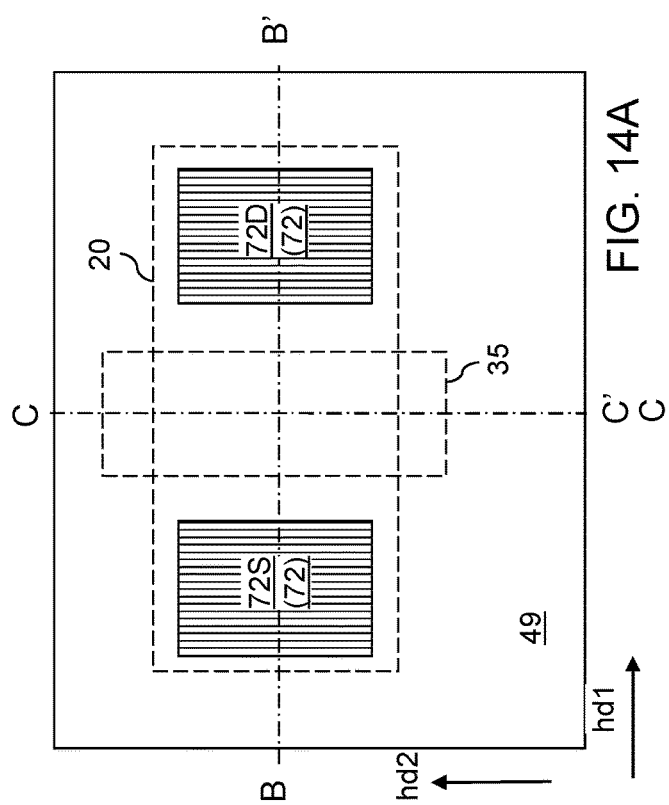
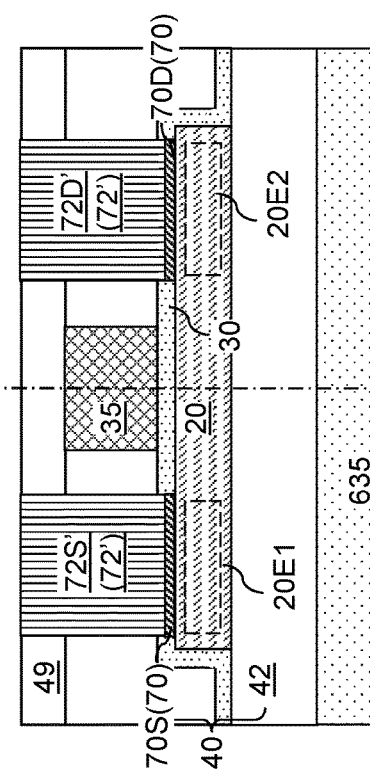
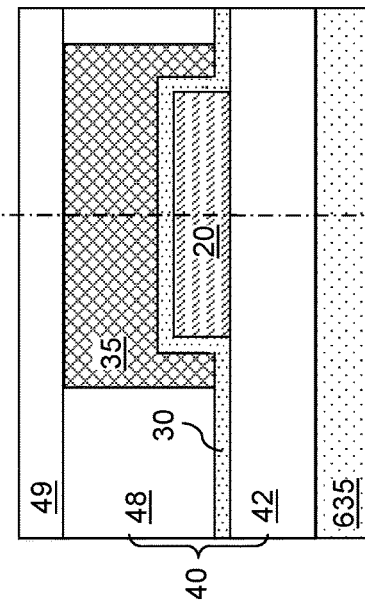
FIG. 14A
FIG. 14B
FIG. 14C

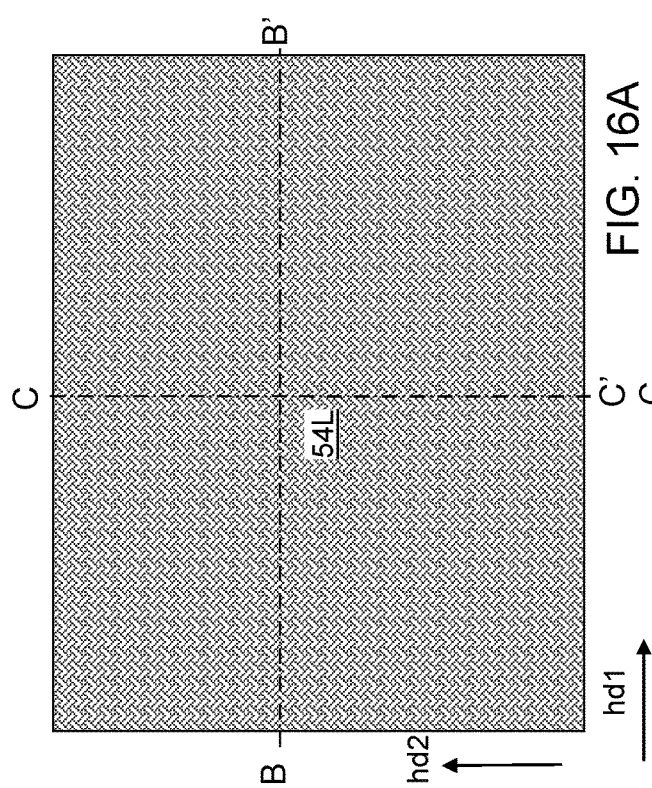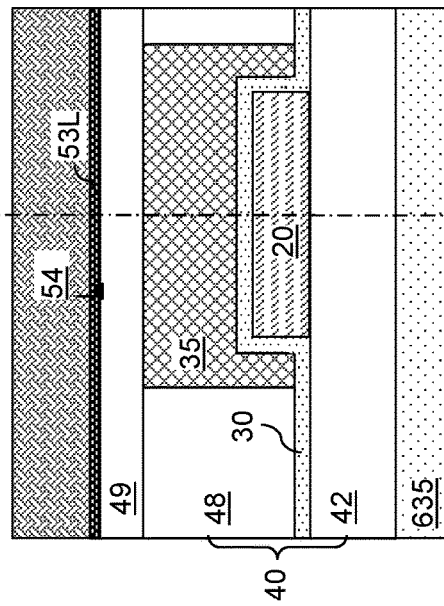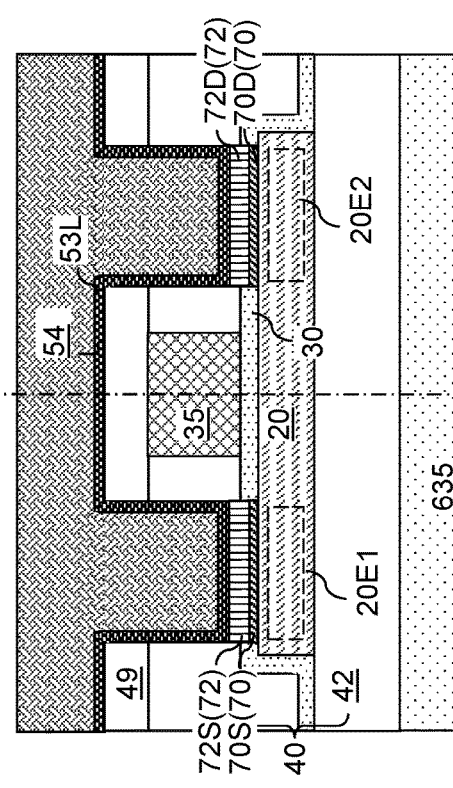

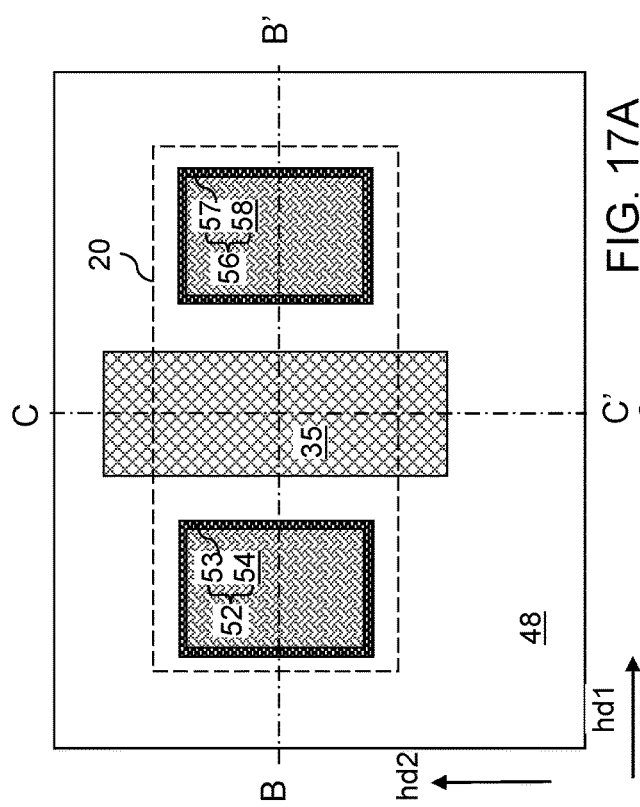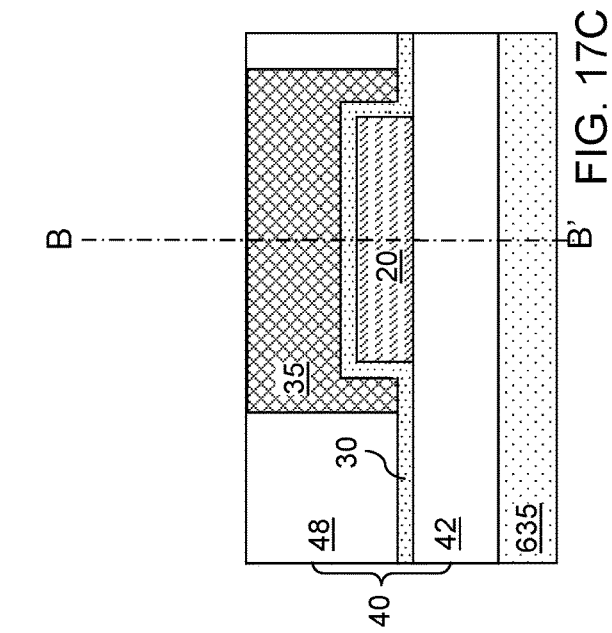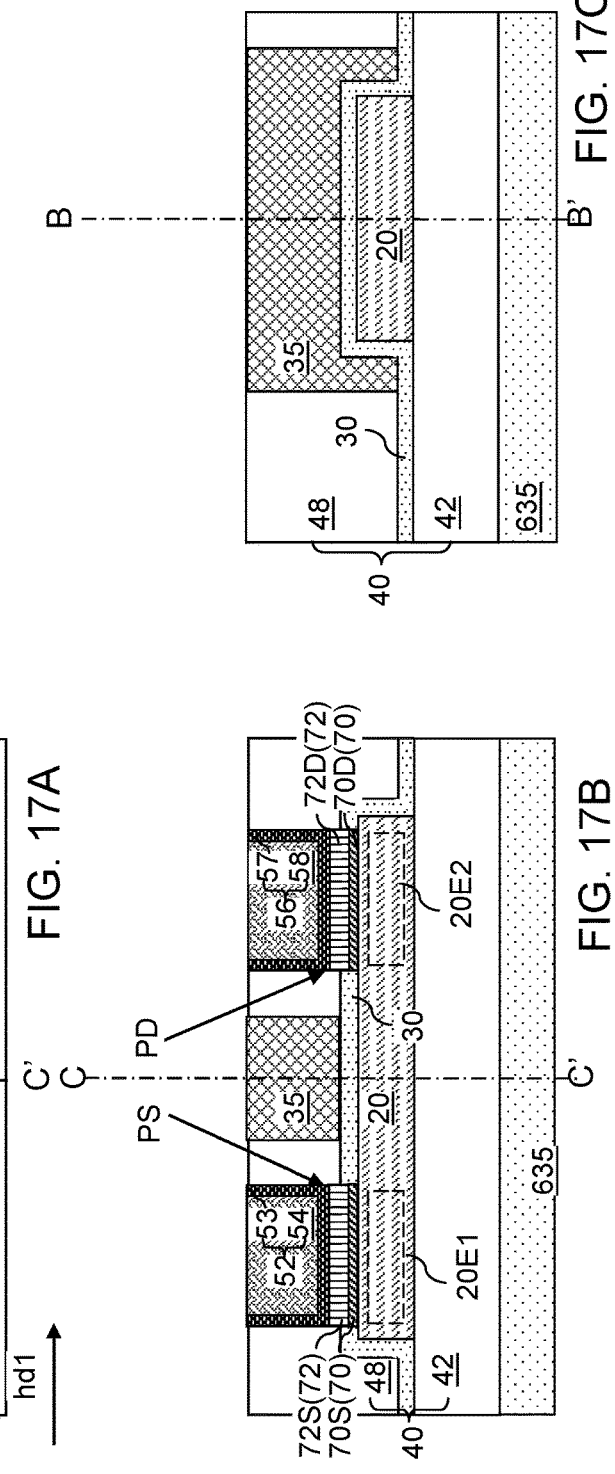

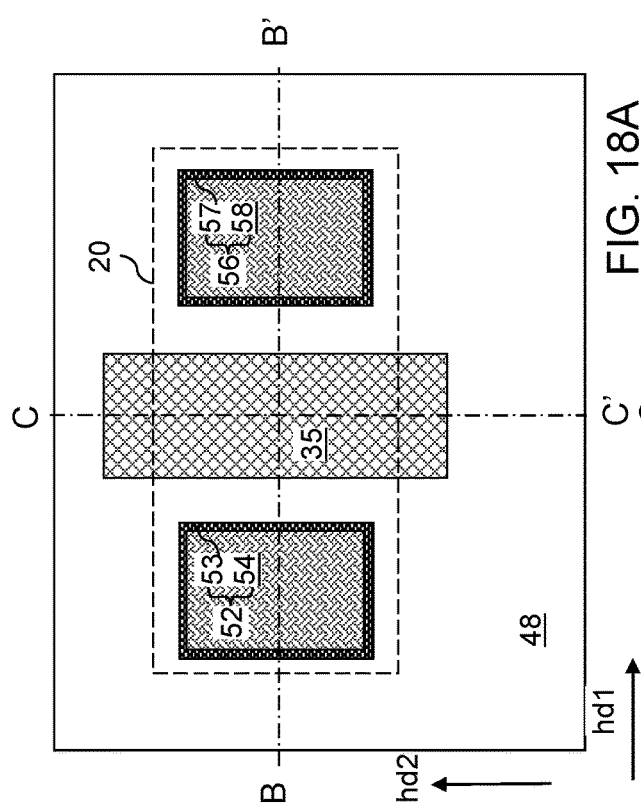
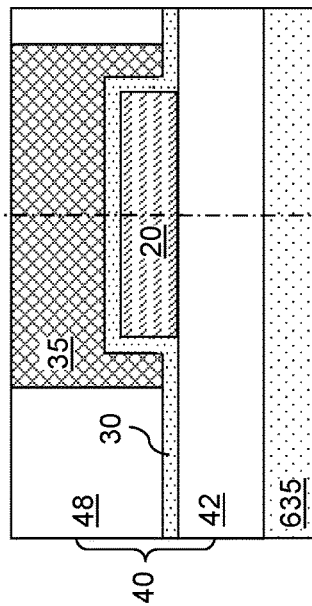
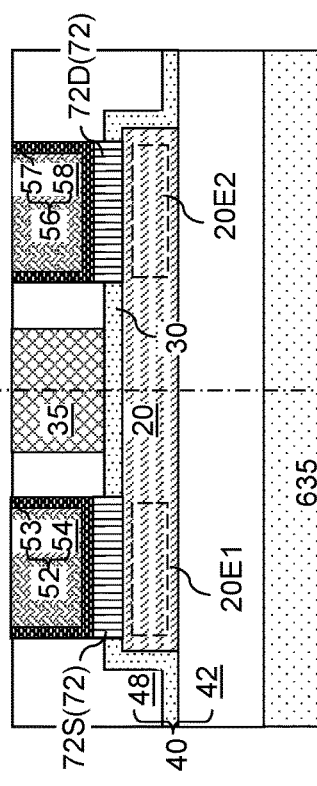
FIG. 18A
FIG. 18C
FIG. 18B

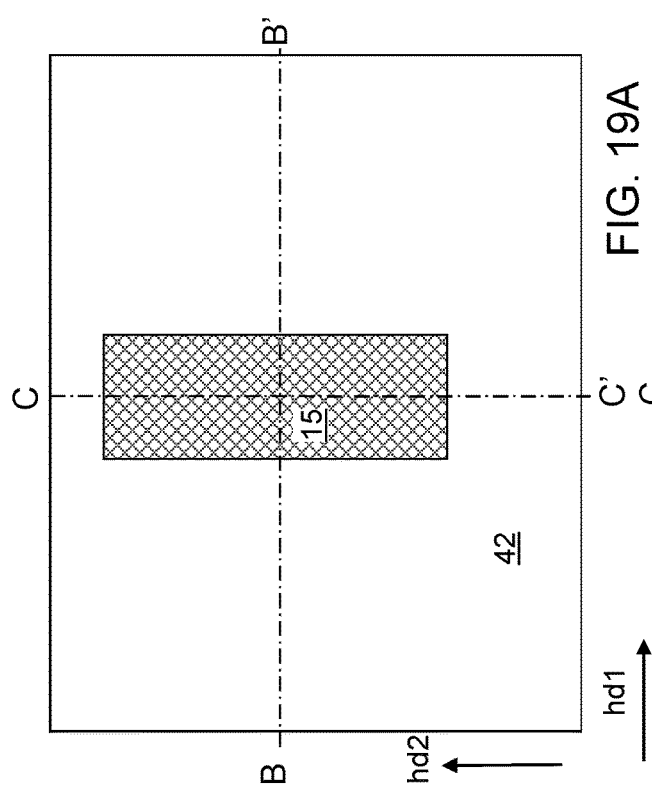
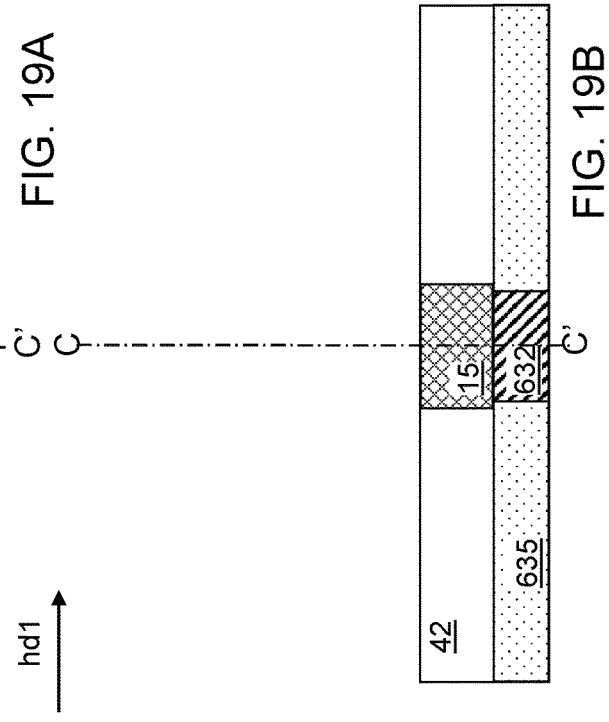
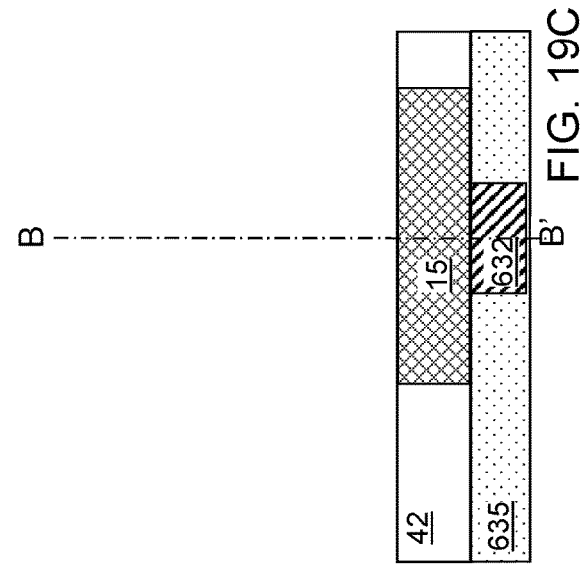

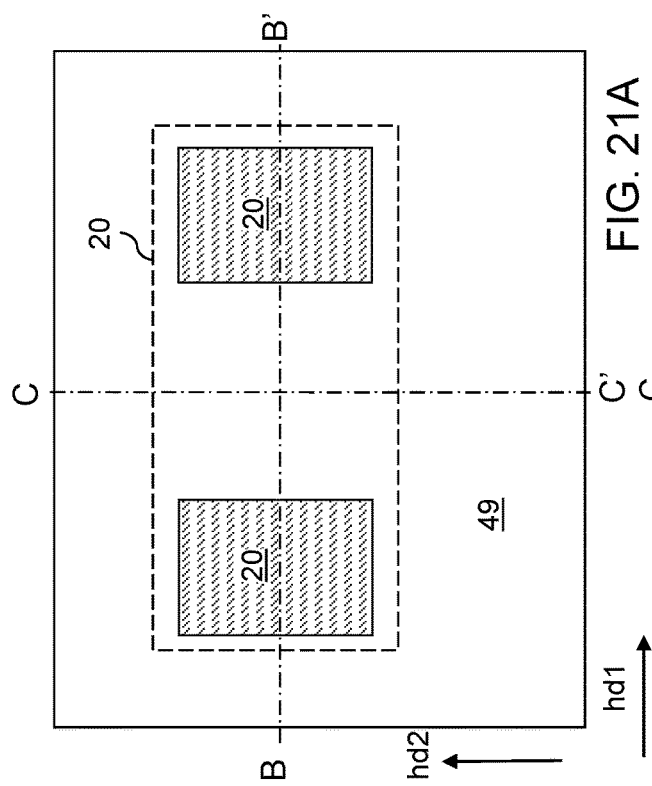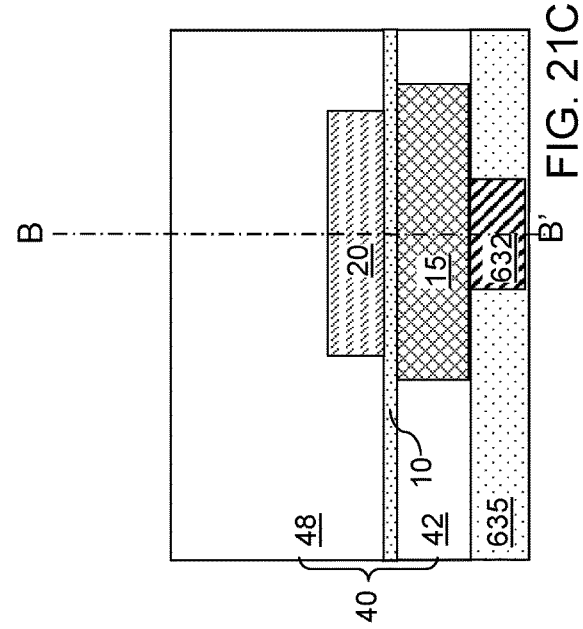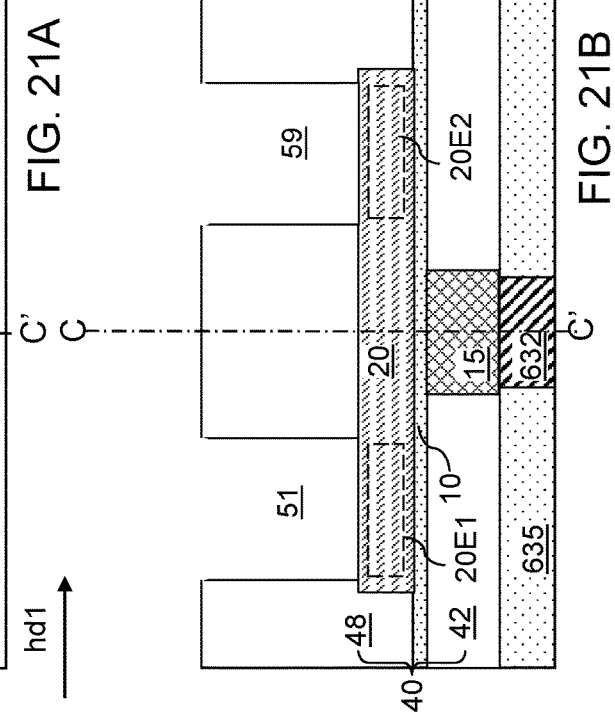
FIG. 21A
FIG. 21C
FIG. 21B

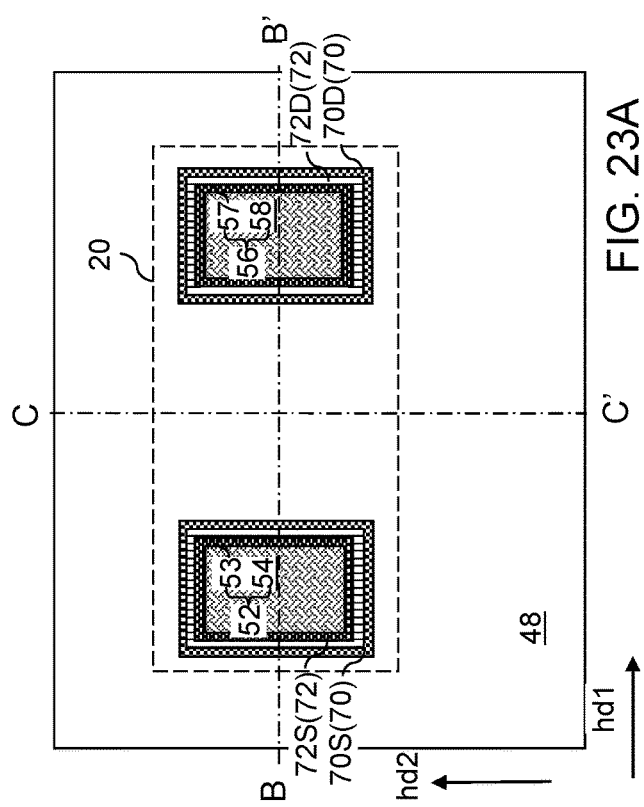
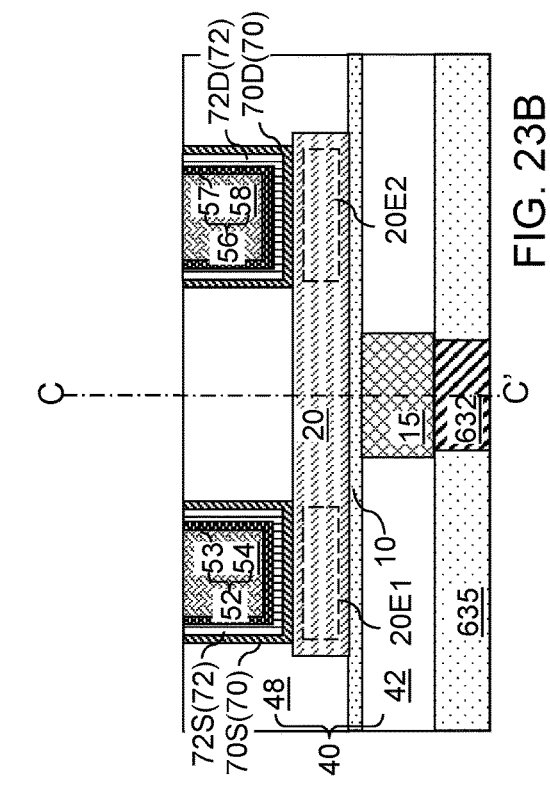
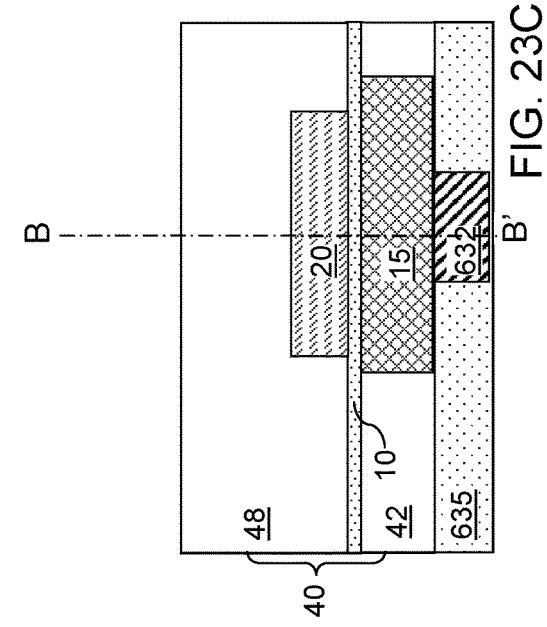
FIG. 23A
FIG. 23B
FIG. 23C

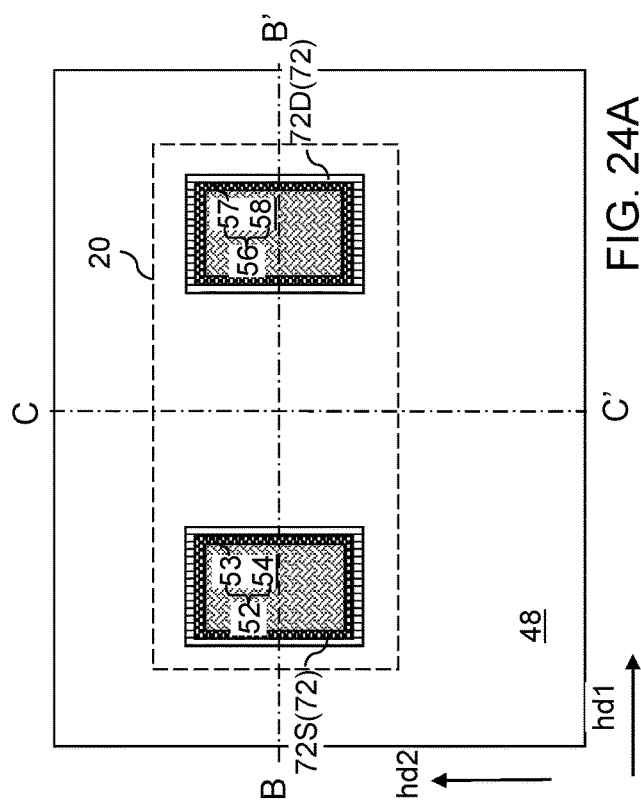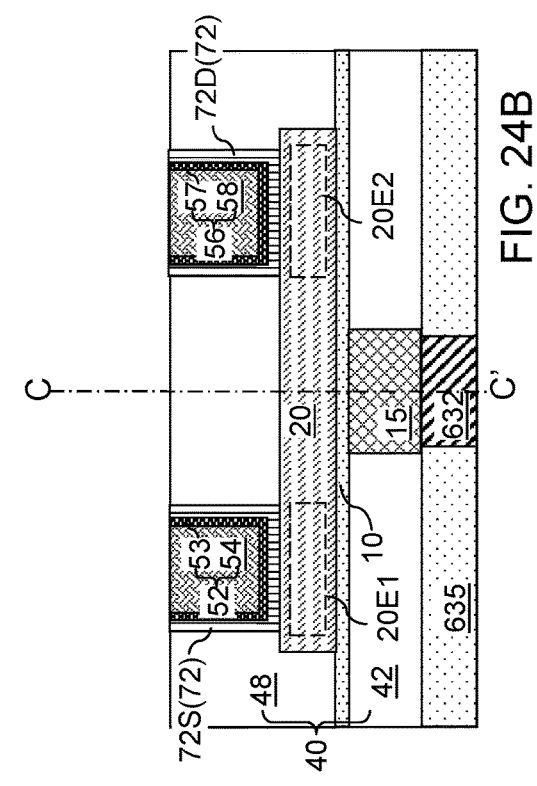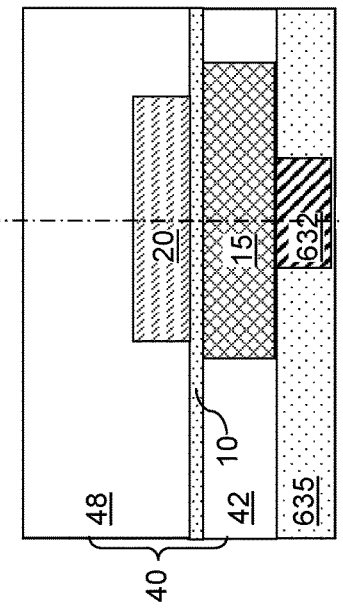

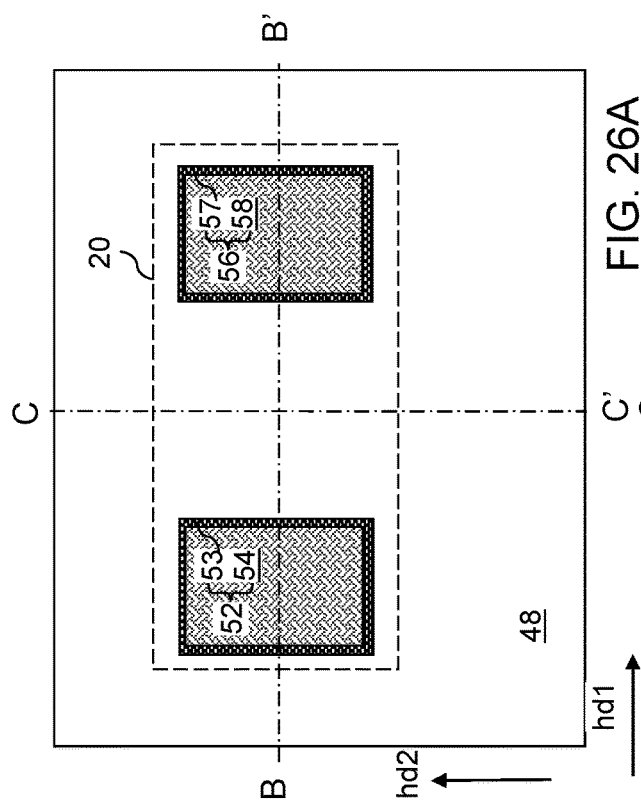
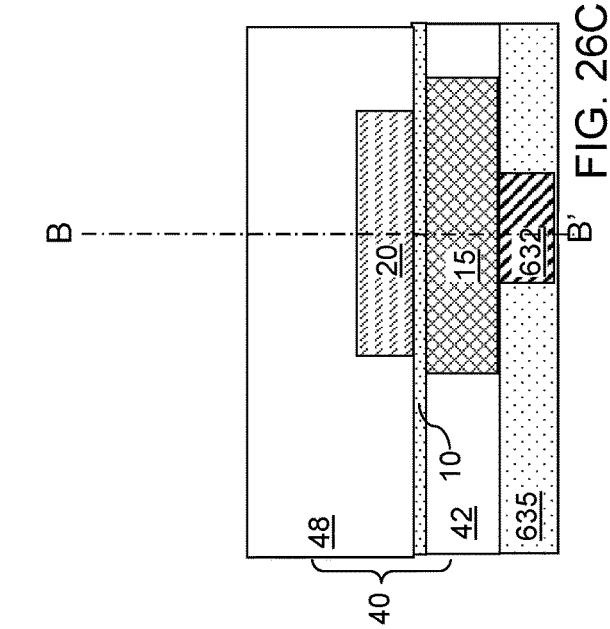
FIG. 26A
FIG. 26B
FIG. 26C

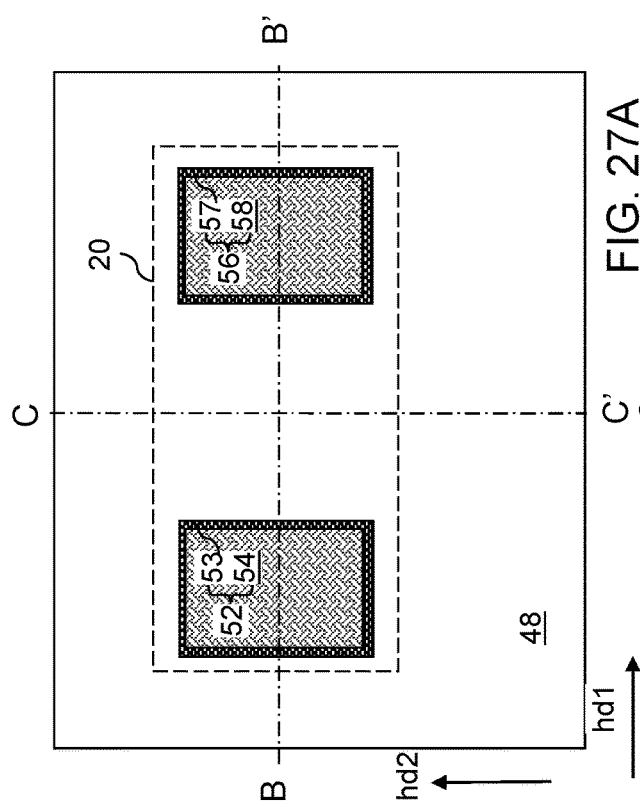
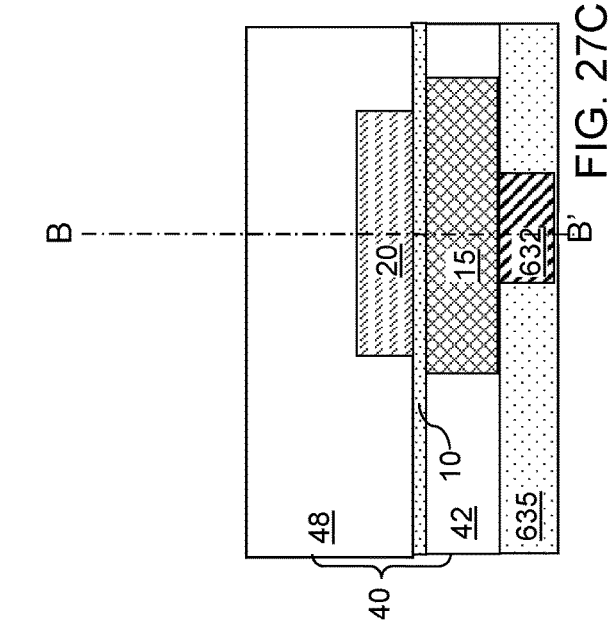
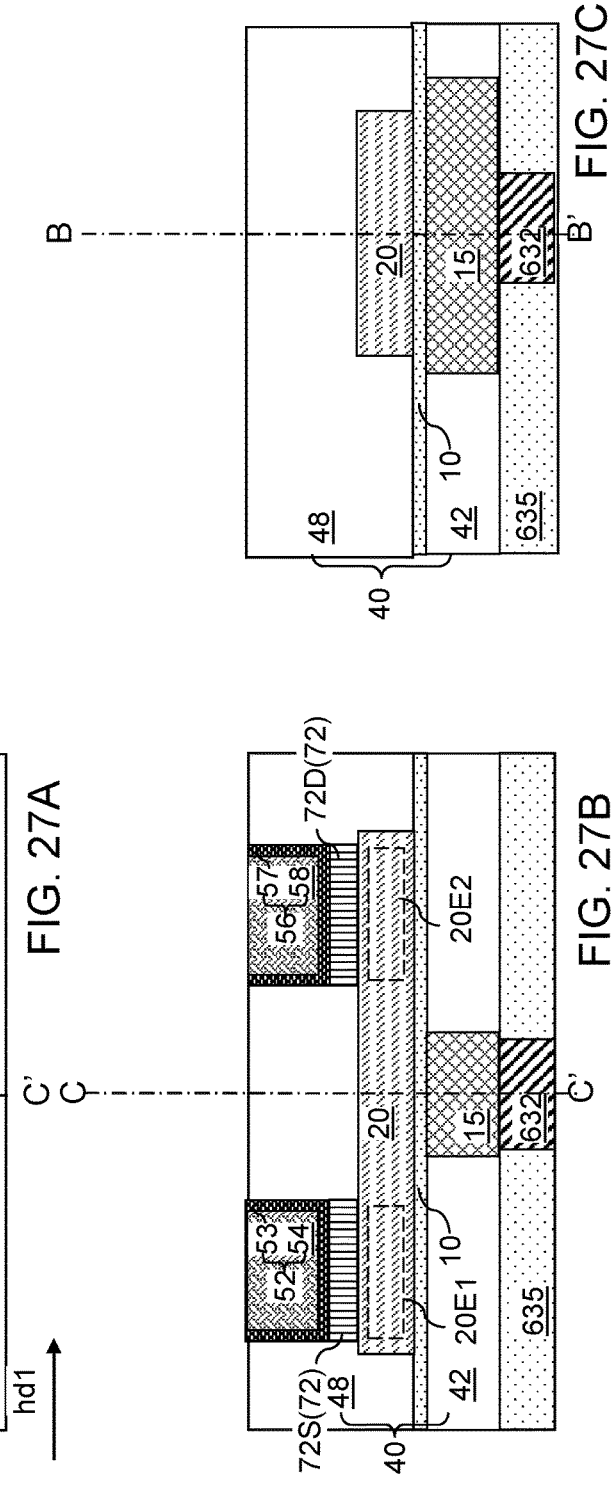

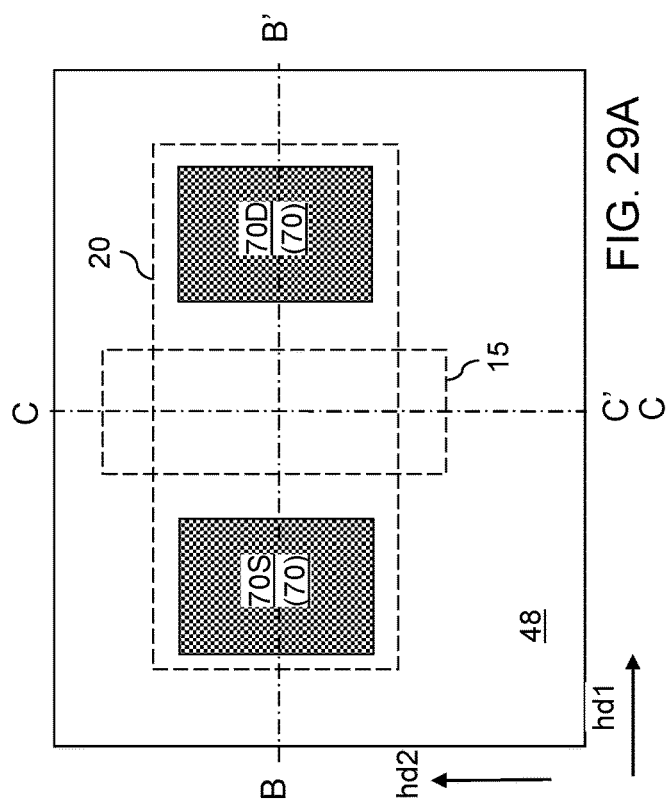
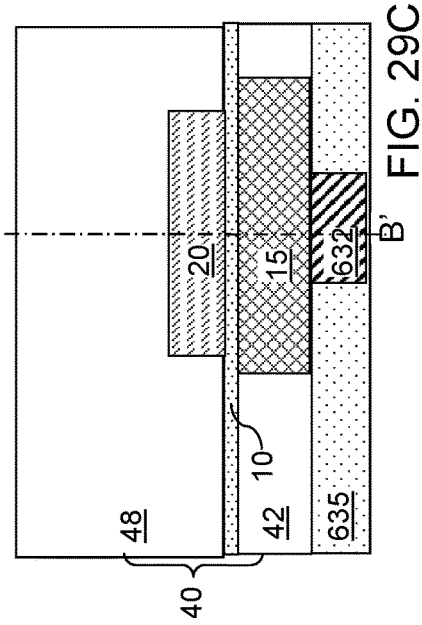
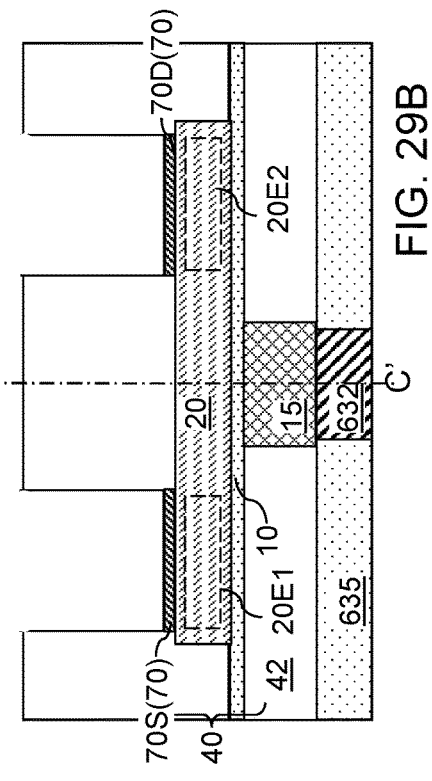
FIG. 29A
FIG. 29B
FIG. 29C

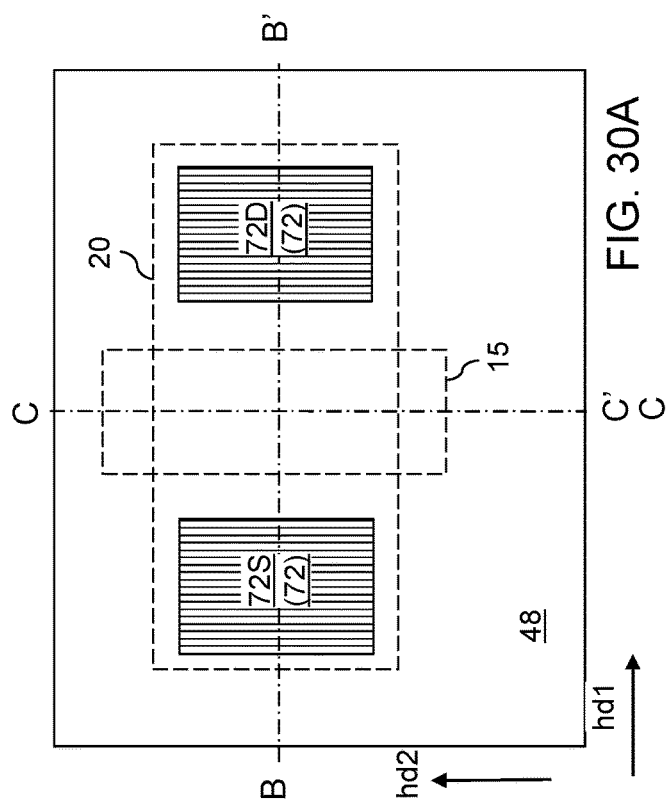
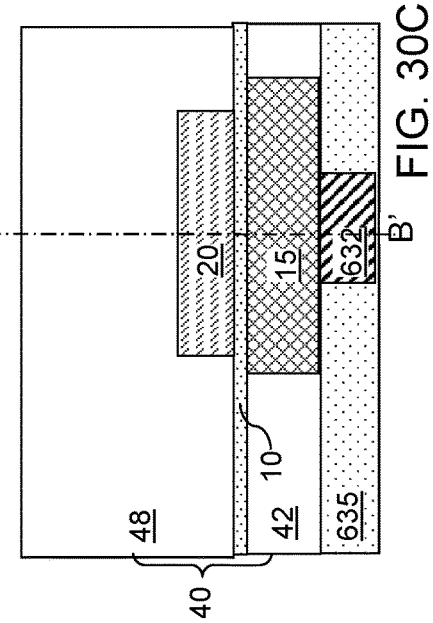
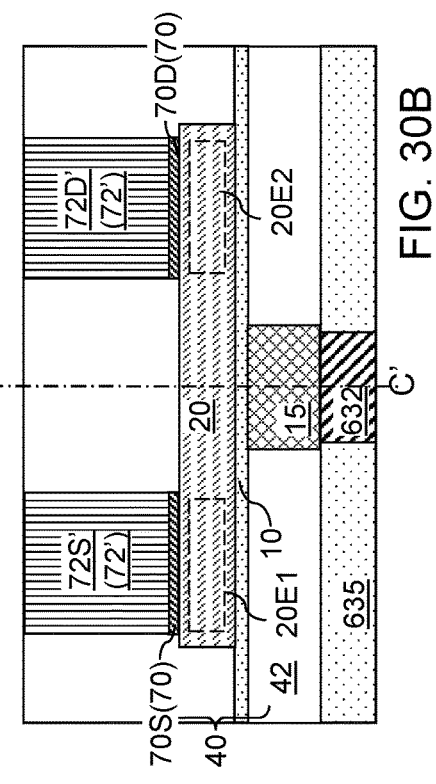
FIG. 30A
FIG. 30B
FIG. 30C

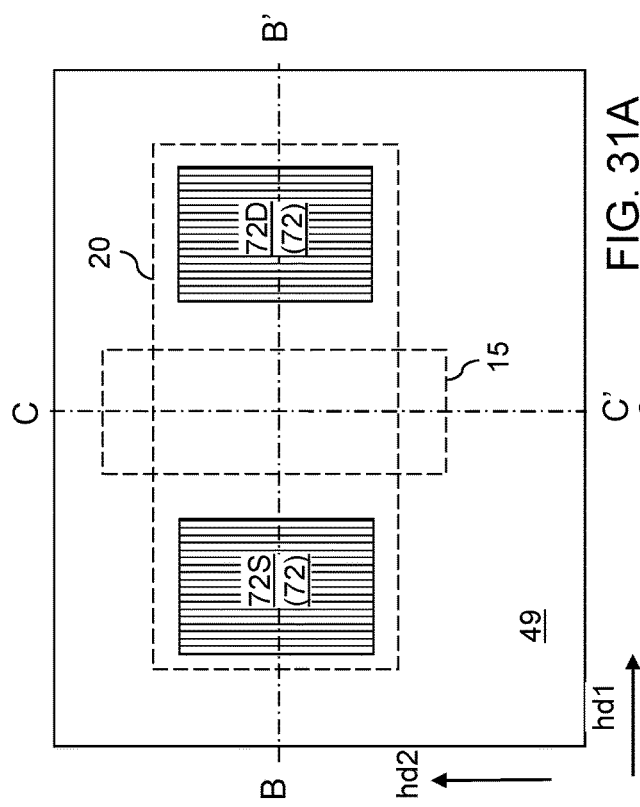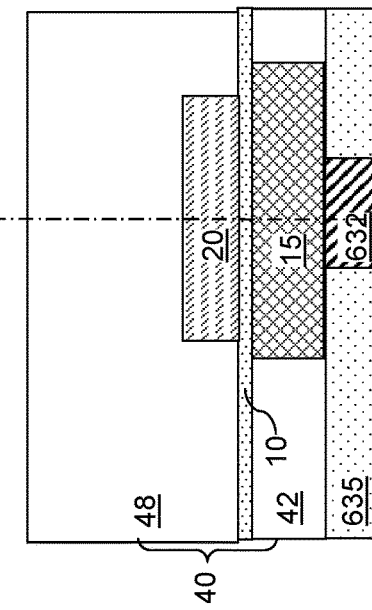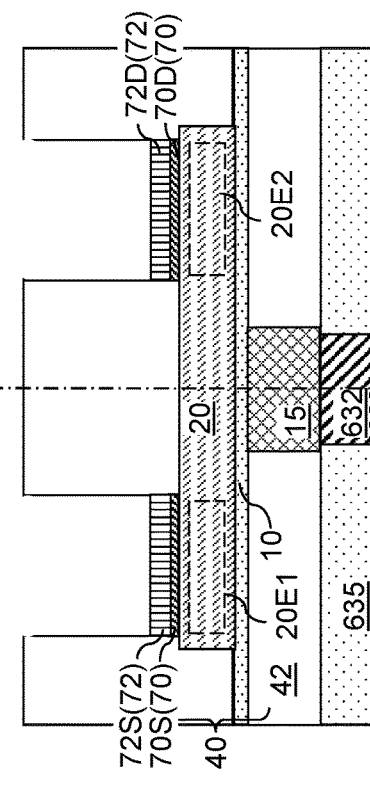

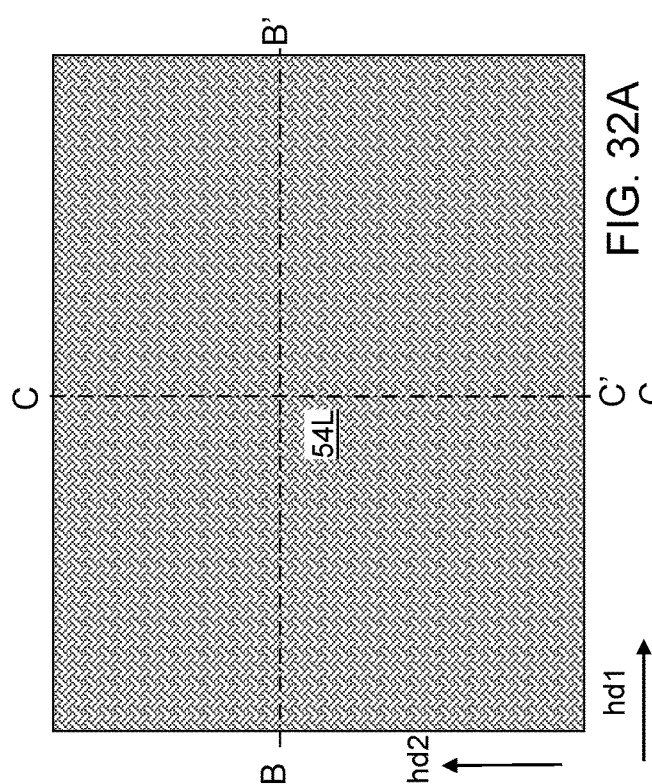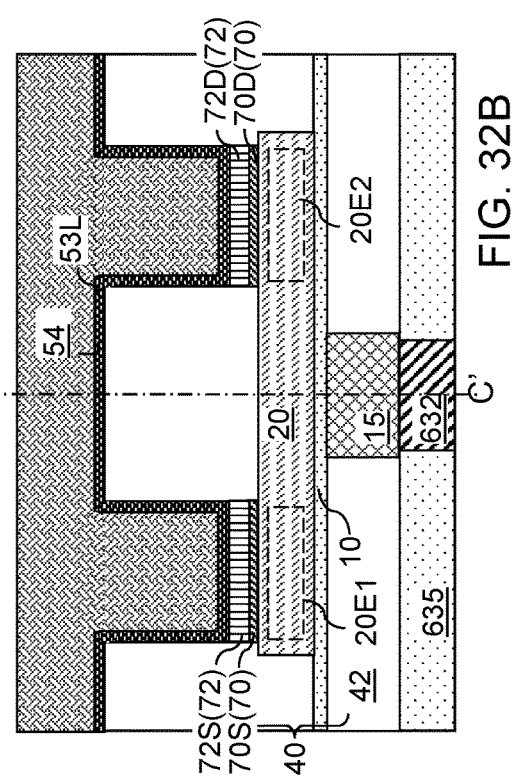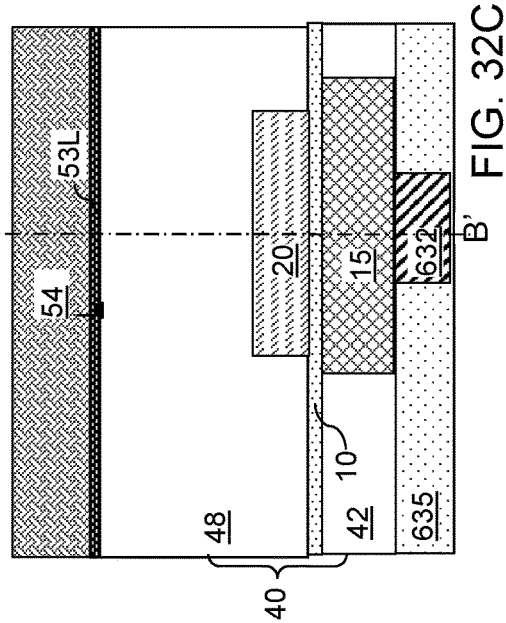

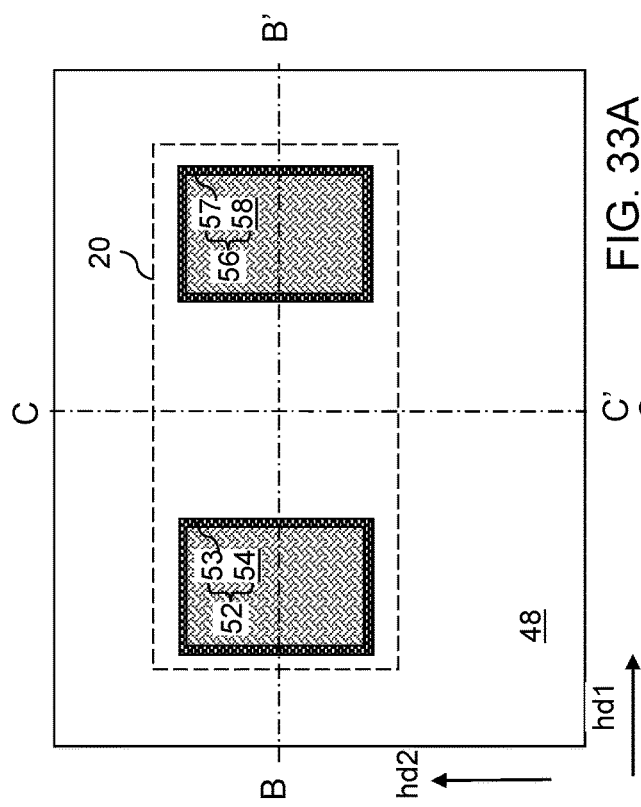
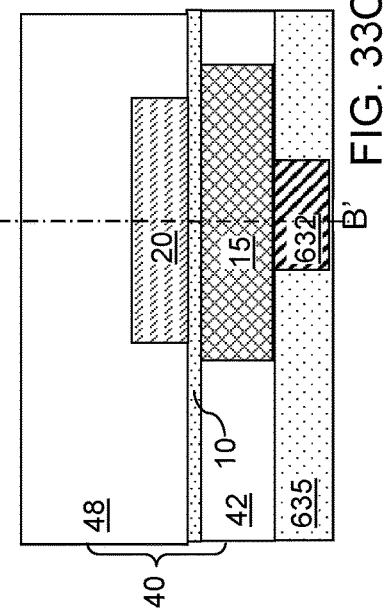
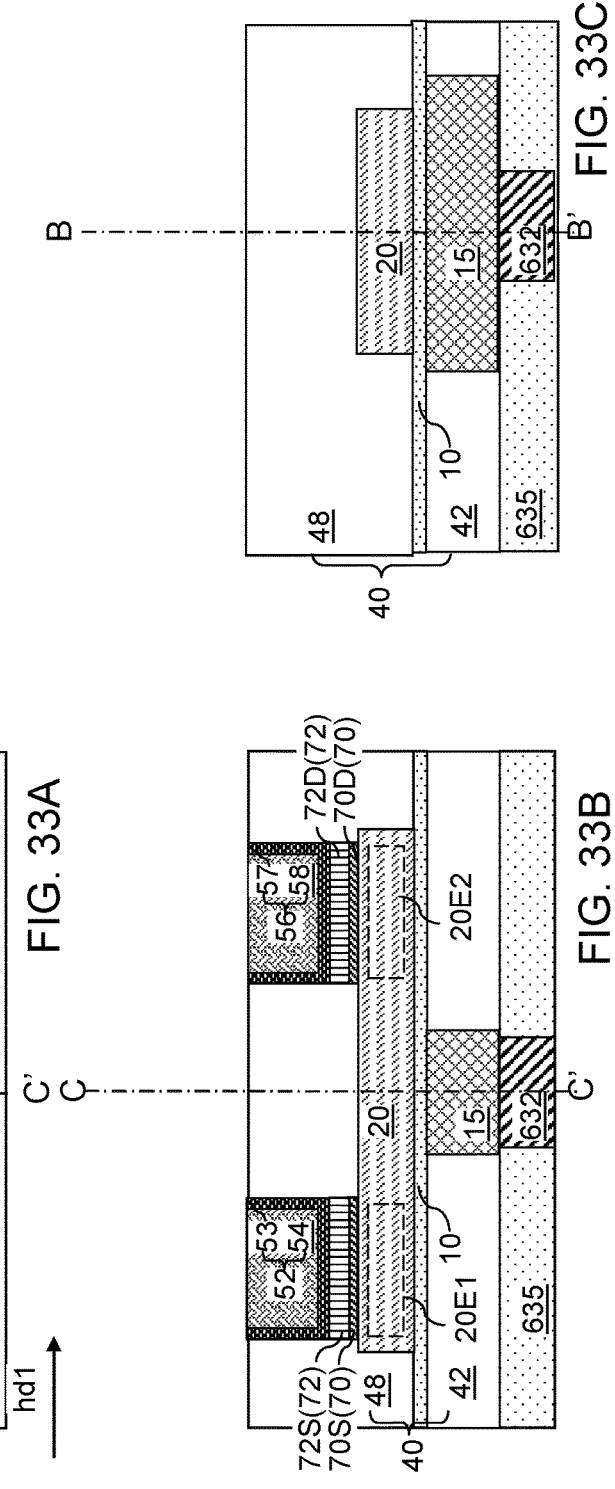
FIG. 33A
FIG. 33C
FIG. 33B

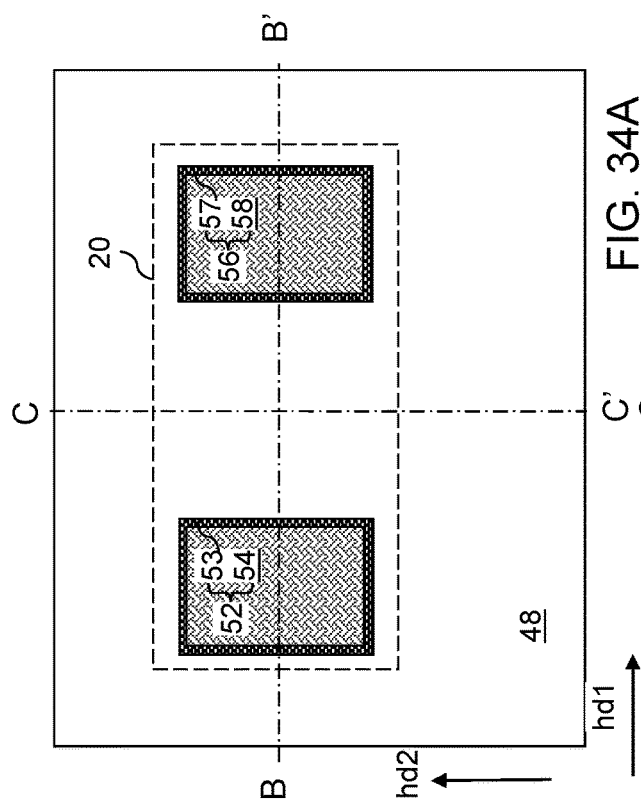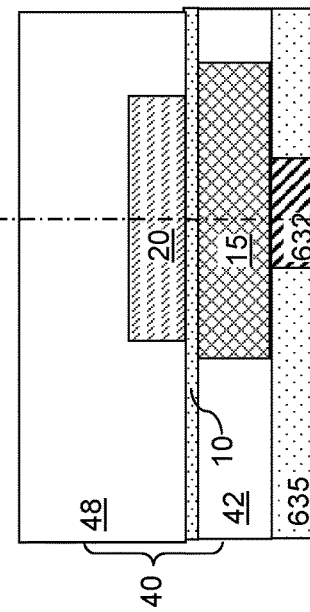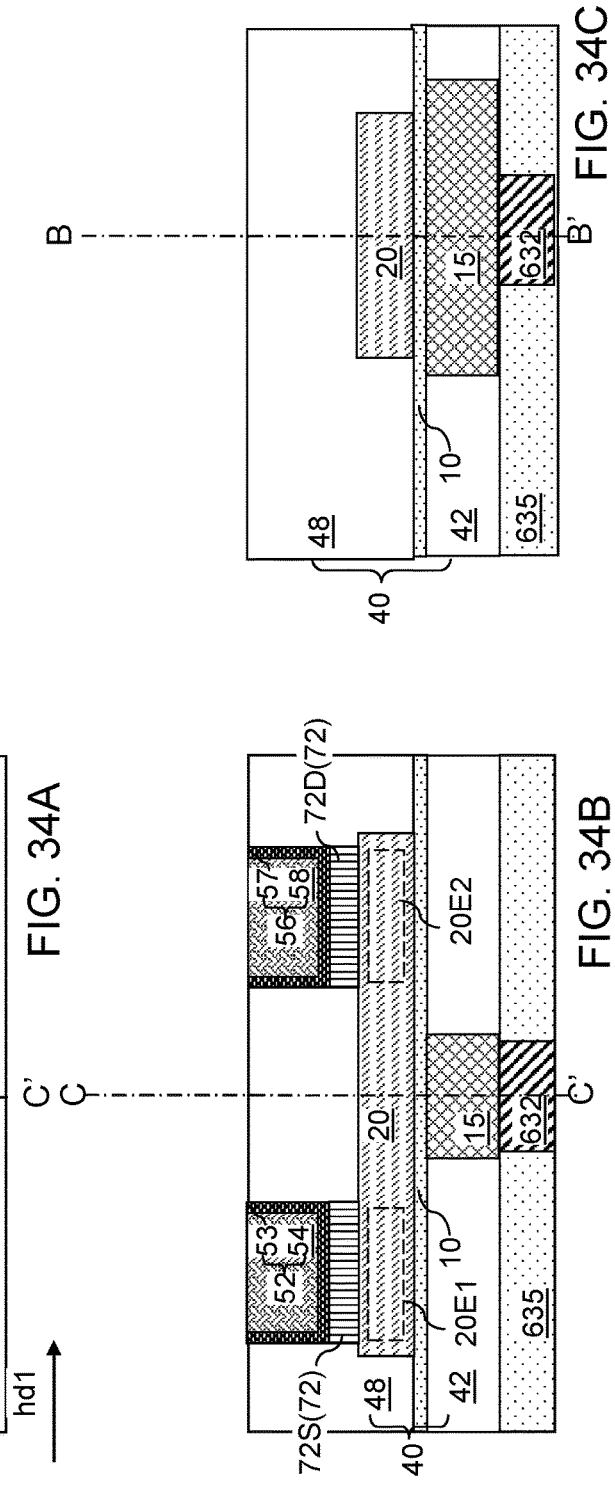

TRANSISTORS INCLUDING CRYSTALLINE RAISED ACTIVE REGIONS AND METHODS FOR FORMING THE SAME

RELATED APPLICATIONS

This application claims the benefit of priority from a U.S. provisional application Ser. No. 63/220,897, titled "Amorphous IGZO transistor with crystalline raised SD," filed on Jul. 12, 2021, the entire contents of which are incorporated herein by reference.

BACKGROUND

A variety of transistor structures have been developed to meet various design criteria. Thin film transistors (TFT) made of oxide semiconductors are an attractive option for back-end-of-line (BEOL) integration since TFTs may be processed at low temperatures and thus, will not damage previously fabricated devices. For example, the fabrication conditions and techniques do not damage previously fabricated front-end-of-line (FEOL) and middle end-of-line (MEOL) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Among the figures labeled with a combination of a figure numeral and an alphabetical suffix, figured with the same figure numeral correspond to a same processing step. Among figures with a figure numeral in a range from 2 to 34, figures labeled with a combination of a figure numeral and the alphabetical suffix "A" are top-down views. Among figures with a figure numeral in a range from 2 to 34, figures labeled with a combination of a figure numeral and an alphabetical suffix of "B" or "C" are vertical cross-sectional views along a vertical plane B-B' or C-C', respectively, of a structure illustrated in a figure labeled with the same figure numeral and the alphabetical index "A." Among figures with a figure numeral in a range from 2 to 34, vertical cross-sectional planes B-B' and C-C' are shown in various top-down views.

FIGS. 2A-2C are various views of a region of the first exemplary structure after formation of an active layer according to an embodiment of the present disclosure.

FIGS. 3A-3C are various views of a region of the first exemplary structure after formation of a gate dielectric according to an embodiment of the present disclosure.

FIGS. 4A-4C are various views of a region of the first exemplary structure after formation of a dielectric layer and a gate electrode according to an embodiment of the present disclosure.

FIGS. 5A-5C are various views of a region of the first exemplary structure after formation of an optional dielectric cap layer, a source-side via opening, and a drain-side via opening according to an embodiment of the present disclosure.

FIGS. 6A-6C are various views of a region of the first exemplary structure after formation of a template crystalline oxide layer, a crystalline semiconductor layer, a metallic liner layer, and a metallic fill material layer according to an embodiment of the present disclosure.

FIGS. 7A-7C are various views of a region of the first exemplary structure after formation of a template crystalline source region, a crystalline source region, a template crystalline drain region, a crystalline drain region, a metallic source electrode, and a metallic drain electrode according to an embodiment of the present disclosure.

FIGS. 8A-8C are various views of a region of a second exemplary structure after formation of a crystalline source region, a crystalline drain region, a metallic source electrode, and a metallic drain electrode according to an embodiment of the present disclosure.

FIGS. 10A-10C are various views of a region of the third exemplary structure after formation of a metallic source electrode and a metallic drain electrode according to an embodiment of the present disclosure.

FIGS. 11A-11C are various views of a region of a fourth exemplary structure after formation of a crystalline source region, a crystalline drain region, a metallic source electrode, and a metallic drain electrode according to an embodiment of the present disclosure.

FIGS. 12A-12C are various views of a region of a fifth exemplary structure after formation of a template crystalline source via structure and a template crystalline drain via structure according to an embodiment of the present disclosure.

FIGS. 13A-13C are various views of a region of the fifth exemplary structure after formation of a template crystalline source region and a template crystalline drain region according to an embodiment of the present disclosure.

FIGS. 14A-14C are various views of a region of the fifth exemplary structure after formation of a crystalline source via structure and a crystalline drain via structure according to an embodiment of the present disclosure.

FIGS. 16A-16C are various views of a region of the fifth exemplary structure after formation of a metallic liner layer and a metallic fill material layer according to an embodiment of the present disclosure.

FIGS. 17A-17C are various views of a region of the fifth exemplary structure after formation of a metallic source electrode and a metallic drain electrode according to an embodiment of the present disclosure.

FIGS. 18A-18C are various views of a region of a sixth exemplary structure after formation of a crystalline source region, a crystalline drain region, a metallic source electrode, and a metallic drain electrode according to an embodiment of the present disclosure.

FIGS. 19A-19C are various views of a region of a seventh exemplary structure after formation of an insulating layer and a gate electrode according to an embodiment of the present disclosure.

FIGS. 21A-21C are various views of a region of the seventh exemplary structure after formation of a dielectric layer, a source-side via opening, and a drain-side via opening according to an embodiment of the present disclosure.

FIGS. 23A-23C are various views of a region of the seventh exemplary structure after formation of a template crystalline source region, a crystalline source region, a template crystalline drain region, a crystalline drain region, a metallic source electrode, and a metallic drain electrode according to an embodiment of the present disclosure.

FIGS. 24A-24C are various views of a region of an eighth exemplary structure after formation of a crystalline source region, a crystalline drain region, a metallic source electrode, and a metallic drain electrode according to an embodiment of the present disclosure.

FIGS. 26A-26C are various views of a region of the ninth exemplary structure after formation of a metallic source electrode and a metallic drain electrode according to an embodiment of the present disclosure.

FIGS. 27A-27C are various views of a region of a tenth exemplary structure after formation of a crystalline source region, a crystalline drain region, a metallic source electrode, and a metallic drain electrode according to an embodiment of the present disclosure.

FIGS. 29A-29C are various views of a region of the eleventh exemplary structure after formation of a template crystalline source region and a template crystalline drain region according to an embodiment of the present disclosure.

FIGS. 30A-30C are various views of a region of the eleventh exemplary structure after formation of a crystalline source via structure and a crystalline drain via structure according to an embodiment of the present disclosure.

FIGS. 31A-31C are various views of a region of the eleventh exemplary structure after formation of a crystalline source region and a crystalline drain region according to an embodiment of the present disclosure.

FIGS. 32A-32C are various views of a region of the eleventh exemplary structure after formation of a metallic liner layer and a metallic fill material layer according to an embodiment of the present disclosure.

FIGS. 33A-33C are various views of a region of the eleventh exemplary structure after formation of a metallic source electrode and a metallic drain electrode according to an embodiment of the present disclosure.

FIGS. 34A-34C are various views of a region of a twelfth exemplary structure after formation of a crystalline source region, a crystalline drain region, a metallic source electrode, and a metallic drain electrode according to an embodiment of the present disclosure.

DETAILED DESCRIPTION

Figure 1:
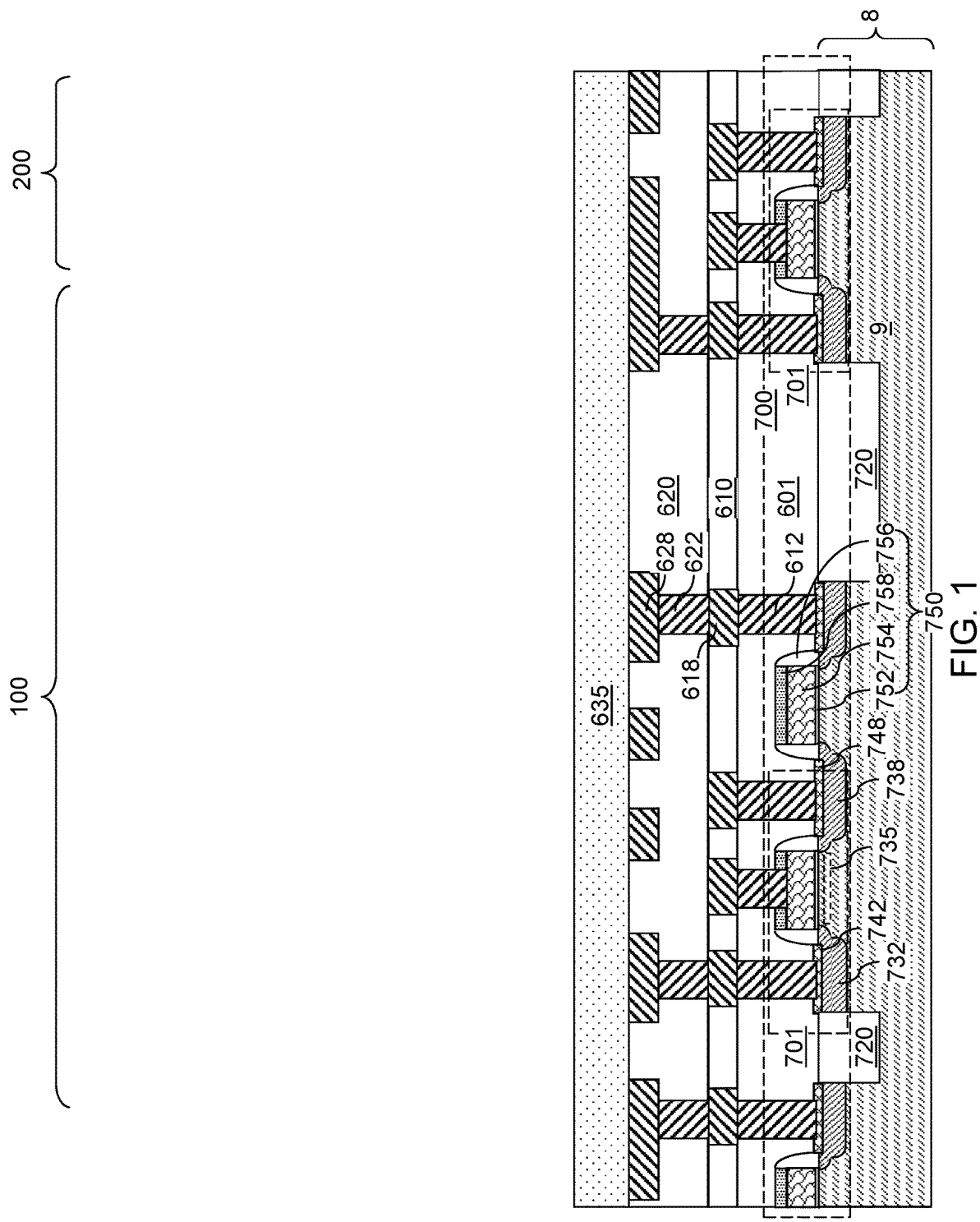
FIG. 1 is a vertical cross-sectional view of a first exemplary structure after formation of complementary metal-oxide-semiconductor (CMOS) transistors, lower-level metal interconnect structures located in lower-level dielectric material layers, and an isolation dielectric layer according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

Generally, TFT including an amorphous semiconducting metal oxide active layer and metal contacts suffer from high contact resistance between the metal contacts and the amorphous semiconducting metal oxide active layer. The factors that contribute to the high contact resistance between the metal contacts and the amorphous semiconducting metal oxide active layer may include a high Schottky barrier height at the interface between the metal contacts and the amorphous semiconducting metal oxide active layer, insufficient electrical dopant concentration within portions of the amorphous semiconducting metal oxide active layer in contact with the metal contacts, and oxidation of portions of the metal contacts in proximity to the amorphous semiconducting metal oxide active layer due to oxygen diffusion from the amorphous semiconducting metal oxide active layer into the metal contacts.

Embodiments of the present disclosure reduces contact resistance between an amorphous semiconducting metal oxide material of an active layer and metallic contact electrodes by forming crystalline semiconducting metal oxide portions between the amorphous semiconducting metal oxide material of the active layer and the metallic contact electrodes. Various aspects of the present disclosure are now described with reference to accompanying drawings of the instant application.

Referring to FIG. 1, a first exemplary structure according to a first embodiment of the present disclosure is illustrated. The first exemplary structure includes a substrate 8, which may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon. In one embodiment, the substrate 8 may include a single crystalline silicon substrate including a single crystalline silicon material.

Shallow trench isolation structures 720 including a dielectric material such as silicon oxide may be formed in an upper portion of the semiconductor material layer 9. Suitable doped semiconductor wells, such as p-type wells and n-type wells, may be formed within each area that is laterally enclosed by a portion of the shallow trench isolation structures 720. Field effect transistors 701 may be formed over the top surface of the semiconductor material layer 9. For example, each field effect transistor 701 may include a source region 732, a drain region 738, a semiconductor channel 735 that includes a surface portion of the substrate 8 extending between the source region 732 and the drain region 738, and a gate structure 750. The semiconductor channel 735 may include a single crystalline semiconductor material. Each gate structure 750 may include a gate dielectric layer 752, a gate electrode 754, a gate cap dielectric 758, and a dielectric gate spacer 756. A source-side metal-semiconductor alloy region 742 may be formed on each source region 732, and a drain-side metal-semiconductor alloy region 748 may be formed on each drain region 738.

The first exemplary structure may include a memory array region 100 in which an array of memory cells may be subsequently formed. The first exemplary structure may further include a peripheral region 200 in which metal wiring for the array of memory devices is provided. Generally, the field effect transistors 701 in the CMOS circuitry 700 may be electrically connected to an electrode of a respective memory cell by a respective set of metal interconnect structures.

Devices (such as field effect transistors 701) in the peripheral region 200 may provide functions that operate the array of memory cells to be subsequently formed. Specifically, devices in the peripheral region may be configured to control the programming operation, the erase operation, and the sensing (read) operation of the array of memory cells. For example, the devices in the peripheral region may include a sensing circuitry and/or a programming circuitry. The devices formed on the top surface of the semiconductor material layer 9 may include complementary metal-oxide-semiconductor (CMOS) transistors and optionally additional semiconductor devices (such as resistors, diodes, capacitors, etc.), and are collectively referred to as CMOS circuitry 700.

One or more of the field effect transistors 701 in the CMOS circuitry 700 may include a semiconductor channel 735 that contains a portion of the semiconductor material layer 9 in the substrate 8. If the semiconductor material layer 9 includes a single crystalline semiconductor material such as single crystalline silicon, the semiconductor channel 735 of each field effect transistor 701 in the CMOS circuitry 700 may include a single crystalline semiconductor channel such as a single crystalline silicon channel. In one embodiment, a plurality of field effect transistors 701 in the CMOS circuitry 700 may include a respective node that is subsequently electrically connected to a node of a respective memory cell to be subsequently formed. For example, a plurality of field effect transistors 701 in the CMOS circuitry 700 may include a respective source region 732 or a respective drain region 738 that is subsequently electrically connected to a node of a respective memory cell to be subsequently formed.

In one embodiment, the CMOS circuitry 700 may include a programming control circuit configured to control gate voltages of a set of field effect transistors 701 that are used for programming a respective memory cell and to control gate voltages of thin film transistors to be subsequently formed. In this embodiment, the programming control circuit may be configured to provide a first programming pulse that programs a respective dielectric material layer in a selected memory cell into a first polarization state in which electrical polarization in the dielectric material layer points toward a first electrode of the selected memory cell, and to provide a second programming pulse that programs the dielectric material layer in the selected memory cell into a second polarization state in which the electrical polarization in the dielectric material layer points toward a second electrode of the selected memory cell.

In one embodiment, the substrate 8 may include a single crystalline silicon substrate, and the field effect transistors 701 may include a respective portion of the single crystalline silicon substrate as a semiconducting channel. As used herein, a "semiconducting" element refers to an element having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant.

In one embodiment, the field effect transistors 701 may be subsequently electrically connected to drain electrodes and gate electrodes of access transistors including semiconducting metal oxide plates to be formed above the field effect transistors 701. In one embodiment, a subset of the field effect transistors 701 may be subsequently electrically connected to at least one of the drain electrodes and the gate electrodes. For example, the field effect transistors 701 may comprise first word line drivers configured to apply a first gate voltage to first word lines through a first subset of lower-level metal interconnect structures to be subsequently formed, and second word line drivers configured to apply a second gate voltage to second word lines through a second subset of the lower-level metal interconnect structures. Further, the field effect transistors 701 may comprise bit line drivers configured to apply a bit line bias voltage to bit lines to be subsequently formed, and sense amplifiers configured to detect electrical current that flows through the bit lines during a read operation.

Various metal interconnect structures formed within dielectric material layers may be subsequently formed over the substrate 8 and the semiconductor devices thereupon (such as field effect transistors 701). In an illustrative example, the dielectric material layers may include, for example, a first dielectric material layer 601 that may be a layer that surrounds the contact structure connected to the source and drains (sometimes referred to as a contact-level dielectric material layer 601), a first interconnect-level dielectric material layer 610, and a second interconnect-level dielectric material layer 620. The metal interconnect structures may include device contact via structures 612 formed in the first dielectric material layer 601 and contact a respective component of the CMOS circuitry 700, first metal line structures 618 formed in the first interconnect-level dielectric material layer 610, first metal via structures 622 formed in a lower portion of the second interconnect-level dielectric material layer 620, and second metal line structures 628 formed in an upper portion of the second interconnect-level dielectric material layer 620.

Each of the dielectric material layers (601, 610, 620) may include a dielectric material such as undoped silicate glass, a doped silicate glass, organosilicate glass, amorphous fluorinated carbon, porous variants thereof, or combinations thereof. Each of the metal interconnect structures (612, 618, 622, 628) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplate scope of disclosure may also be used. In one embodiment, the first metal via structures 622 and the second metal line structures 628 may be formed as integrated line and via structures by a dual damascene process. The dielectric material layers (601, 610, 620) are herein referred to as lower-lower-level dielectric material layers. The metal interconnect structures (612, 618, 622, 628) formed within in the lower-level dielectric material layers are herein referred to as lower-level metal interconnect structures.

While the present disclosure is described using an embodiment in which an array of memory cells may be formed over the second line-and-via-level dielectric material layer 620, embodiments are expressly contemplate herein in which the array of memory cells may be formed at a different metal interconnect level.

An array of transistors (e.g., thin-film transistors) and an array of memory cells may be subsequently deposited over the dielectric material layers (601, 610, 620) that have formed therein the metal interconnect structures (612, 618, 622, 628). The set of all dielectric material layer that are formed prior to formation of an array of transistors or an array of memory cells is collectively referred to as lower-level dielectric material layers (601, 610, 620). The set of all metal interconnect structures that is formed within the lower-level dielectric material layers (601, 610, 620) is herein referred to as first metal interconnect structures (612, 618, 622, 628). Generally, first metal interconnect structures (612, 618, 622, 628) formed within at least one lower-level dielectric material layer (601, 610, 620) may be formed over the semiconductor material layer 9 that is located in the substrate 8.

According to an aspect of the present disclosure, transistors (e.g., thin film transistors (TFTs)) may be subsequently formed in a metal interconnect level that overlies that metal interconnect levels that contain the lower-level dielectric material layers (601, 610, 620) and the first metal interconnect structures (612, 618, 622, 628). In one embodiment, a planar dielectric material layer having a uniform thickness may be formed over the lower-level dielectric material layers (601, 610, 620). The planar dielectric material layer is herein referred to as an insulating matrix layer 635. The insulating matrix layer 635 includes a dielectric material such as undoped silicate glass, a doped silicate glass, organosilicate glass, or a porous dielectric material, and may be deposited by chemical vapor deposition. The thickness of the insulating matrix layer 635 may be in a range from 20 nm to 300 nm, although lesser and greater thicknesses may also be used.

Generally, interconnect-level dielectric layers (such as the lower-level dielectric material layer (601, 610, 620)) containing therein the metal interconnect structures (such as the first metal interconnect structures (612, 618, 622, 628)) may be formed over semiconductor devices. The insulating matrix layer 635 may be formed over the lower-level dielectric material layers (601, 610, 620).

Referring to FIGS. 2A-2C, a unit device area within the region of the first exemplary structure is illustrated. The unit device area corresponds to an area in which a transistor may be subsequently formed. An insulating layer 42 may be deposited over the insulating matrix layer 635. The insulating layer 42 includes an insulating material such as undoped silicate glass, a doped silicate glass, silicon oxynitride, silicon nitride, silicon carbide nitride, organosilicate glass, or a combination or a stack thereof. The thickness of the insulating layer 42 may be in a range from 10 nm to 300 nm, such as from 30 nm to 100 nm, although lesser and greater thicknesses may also be used.

A continuous active layer including a semiconducting material may be deposited over the insulating layer 42. In one embodiment, the semiconducting material includes a material providing electrical conductivity in a range from 1.0 S/cm to $1.0 \times 10^5$ S/cm upon suitable doping with electrical dopants (which may be p-type dopants or n-type dopants). Exemplary semiconducting materials that may be used for the continuous active layer include, but are not limited to, indium gallium zinc oxide (IGZO), silicon-doped IGZO, indium tungsten oxide, indium zinc oxide, indium tin oxide, tin germanium oxide, gallium oxide, indium oxide, doped zinc oxide, doped indium oxide (such as tungsten-doped indium oxide), doped cadmium oxide, nickel oxide, tin oxide, copper oxide, and various other doped variants derived therefrom. Other suitable semiconducting materials are within the contemplate scope of disclosure. In one embodiment, the semiconducting material of the continuous active layer may include indium gallium zinc oxide.

In one embodiment, the entirety of the continuous active layer may comprise, and/or may consist essentially of, an amorphous semiconducting material. The continuous active layer may be deposited by physical vapor deposition although other suitable deposition processes may be used. The thickness of the continuous active layer may be in a range from 1 nm to 100 nm, such as from 2 nm to 50 nm and/or from 3 nm to 20 nm, although lesser and greater thicknesses may also be used.

A photoresist layer (not shown) may be applied over the continuous active layer, and may be lithographically patterned to form discrete patterned photoresist material portions. Each patterned portion of the photoresist layer may be located within the area of a respective one of the unit device areas. The area of each patterned portion of the photoresist layer defines the area of a semiconducting metal oxide portion to be subsequently patterned from the continuous active layer. In one embodiment, each patterned portion of the photoresist layer may have a horizontal cross-sectional shape of a rectangle or a rounded rectangle.

The pattern in the photoresist layer may be transferred through the continuous active layer by performing an anisotropic etch process. Patterned portion of the continuous active layer comprise active layers 20, which may comprise semiconducting metal oxide plates having a uniform thickness throughout. The photoresist layer may be subsequently removed, for example, by ashing.

In one embodiment, each active layer 20 may have a horizontal cross-sectional shape of a rectangle or a rounded rectangle. In one embodiment, each active layer 20 may have a lateral dimension along the first horizontal direction hd1 in a range from 60 nm to 1,000 nm, such as from 100 nm to 300 nm, although lesser and greater lateral dimensions may also be used. In one embodiment, each active layer 20 may have a lateral dimension along the second horizontal direction hd2 in a range from 20 nm to 500 nm, such as from 40 nm to 250 nm, although lesser and greater lateral dimensions may also be used. The ratio of the lateral dimension along the first horizontal direction hd1 to the lateral dimension along the second horizontal direction hd2 in each active layer 20 may be in a range from 0.5 to 4, such as from 1 to 2, although lesser and greater ratios may also be used.

Referring to FIGS. 3A-3C, a gate dielectric 30 may be formed over the active layers 20 by deposition of at least one gate dielectric material. The at least one gate dielectric material may include, but is not limited to, silicon oxide, silicon oxynitride, a high-k dielectric metal oxide (such as hafnium oxide, zirconium oxide, hafnium zirconium oxide, titanium oxide, tantalum oxide, yttrium oxide, lanthanum oxide, aluminum oxide, etc.), or a stack thereof. Other suitable dielectric materials are within the contemplate scope of disclosure. The at least one gate dielectric material may be deposited by atomic layer deposition or chemical vapor deposition although other suitable deposition processes may be used. The thickness of the gate dielectric 30 may be in a range from 1 nm to 15 nm, such as from 2 nm to 6 nm, although lesser and greater thicknesses may also be used. In an alternative embodiment, the gate dielectric 30 may be deposited on a top surface of the continuous active layer (i.e., prior to patterning the continuous active layer into the active layers 20), and a photoresist layer can be applied and patterned over the gate dielectric 30 into shapes of active layers 20. The pattern in the photoresist layer can be transferred through the gate dielectric 30 and the continuous active layer, for example, by performing an anisotropic etch process. Each patterned portion of the continuous active layer constitutes an active layer 20. The photoresist layer can be subsequently removed, for example, by ashing.

Referring to FIGS. 4A-4C, a dielectric layer 48 may be deposited over the gate dielectric 30. The dielectric layer 48 is also referred to as an electrode-level dielectric layer. The dielectric layer 48 includes a dielectric material such as undoped silicate glass, a doped silicate glass, organosilicate glass, silicon oxynitride, silicon oxynitride, or a stack thereof. Optionally, the dielectric layer 48 may be planarized to provide a flat top surface. The set of the insulating layer 42 and the dielectric layer 48 is herein referred to as a thin-film-transistor-level (TFT-level) dielectric layer 40, i.e., a dielectric layer that is located at the level of thin film transistors. The dielectric layer 48 may comprise the same dielectric material as, or may comprise a different dielectric material from, the dielectric material of the insulating layer 42. The thickness of the dielectric layer 48 as measured from above the gate dielectric 30 may be in a range from 1 nm to 1,000 nm, such as from 10 nm to 500 nm, and/or from 100 nm to 300 nm, although lesser and greater thicknesses may also be used.

A gate cavity may be formed by recessing a portion of the dielectric layer 48 that overlie a middle portion of the active layer 20 within each unit device area. For example, a photoresist layer (not shown) may be applied over the dielectric layer 48, and may be lithographically patterned to form an opening that overlies, and straddles along the second horizontal direction hd2, a middle portion of the active layer 20 within each unit device area. An anisotropic etch process may be performed to etch portions of the dielectric layer 48 that underlie the openings in the photoresist layer. For example, in embodiments in which the dielectric layer 48 includes silicon oxide and the gate dielectric 30 includes a dielectric metal oxide material, the anisotropic etch process may etch silicon oxide selective to the dielectric metal oxide material of the gate dielectric 30. A gate cavity may be formed underneath each opening in the photoresist layer. A top surface of a gate dielectric 30 may be physically exposed at the bottom of each gate cavity. The photoresist layer may be subsequently removed, for example, by ashing.

At least one conductive material may be deposited in the volumes of the gate cavities and over the dielectric layer 48. The at least one conductive material may include an optional metallic liner material and a metallic fill material. The optional metallic liner material, if present, may include a conductive metallic nitride or a conductive metallic carbide such as TiN, TaN, WN, TiC, TaC, and/or WC. Other suitable conductive metallic nitride or conductive metallic carbide materials are within the contemplated scope of disclosure. The thickness of the metallic liner may be in a range from 1 nm to 100 nm, such as from 3 nm to 10 nm, although lesser and greater thicknesses may also be used. The metallic fill material may include W, Cu, Al, Co, Ru, Mo, Ta, Ti, TiAl, Pt, TiN, TaN, other high work function metals known in the art, alloys thereof, and/or combinations thereof. Other suitable metallic fill materials are within the contemplated scope of disclosure.

Portions of the at least one conductive material that overlie a horizontal plane including the top surface of the dielectric layer 48 may be removed by a planarization process, which may use a CMP process and/or a recess etch process. Other suitable planarization processes may be used. Each remaining portion of the at least one conductive material filling a gate cavity constitutes a gate electrode 35.

Generally, a vertical stack including a gate electrode, a gate dielectric, and an active layer 20 comprising an amorphous semiconductor material may be formed over a substrate 8 in a forward order or in a reverse order. In the first embodiment, the gate dielectric 30 contacts a top surface of the gate electrode 35 and a bottom surface of a middle portion of the active layer 20 that may be located between a first end portion 20E1 and a second end portion 20E2 that may be laterally spaced apart along the first horizontal direction hd1.

Referring to FIGS. 5A-5C, an optional dielectric cap layer 49 may be deposited over the dielectric layer 48. The optional dielectric cap layer 49 may include a dielectric material that is subsequently removed during a planarization process. For example, the optional dielectric cap layer 49 may include undoped silicate glass or a doped silicate glass. The thickness of the optional dielectric cap layer 49 may be in a range from 5 nm to 100 nm, such as from 10 nm to 30 nm, although lesser and greater thicknesses may also be used.

A photoresist layer (not shown) may be applied over the TFT-level dielectric layer 40 and the optional dielectric cap layer 49, and may be lithographically patterned to form discrete openings therein. The pattern of the openings in the photoresist layer include a pair of openings overlying end portions of the active layer 20. The pattern of the discrete openings in the photoresist layer may be transferred through the optional dielectric cap layer 49 and the dielectric layer 48 and the gate dielectric 30 by an anisotropic etch process to form a first via opening located over a first end portion 20E1 of the active layer 20 and a second via opening located over a second end portion 20E2 of the active layer 20. The first via opening is herein referred to as a source-side via opening 51, and the second via opening is herein referred to as a drain-side via opening 59. The anisotropic etch process may be selective to the material of the active layer 20. However, due to finite selectivity of the anisotropic etch process used to form the source-side via opening 51 and the drain-side via opening 59, surfaces of the active layer 20 may be vertically recessed underneath the source-side via opening 51 and the drain-side via opening 59. The vertical recess distance may be in a range from 0.1 nm to 6 nm, such as from 0.3 nm to 3 nm, although lesser and greater vertical recess distances may also be used. The photoresist layer may be subsequently removed, for example, by ashing.

Referring to FIGS. 6A-6C, a template crystalline oxide layer 70L, a crystalline semiconductor layer 72L, a metallic liner layer 53L, and a metallic fill material layer 54L may be sequentially deposited in the source-side via opening 51 and the drain-side via opening 59 and over the top surface of the dielectric cap layer 49 (and/or over the top surface of the dielectric layer 48).

The template crystalline oxide layer 70L comprises, and/or consists essentially of, a crystalline oxide material such as a polycrystalline metal oxide material. The template crystalline oxide layer 70L may include a crystalline oxide material that may crystallize more easily (for example, at a lower deposition temperature) than the material of the crystalline semiconductor layer 72L. In other words, the template crystalline oxide layer 70L may include a polycrystalline metal oxide material that does not need a crystalline template layer (i.e., a crystalline seed layer) for formation of a polycrystalline metal oxide material. In other words, the template crystalline oxide layer 70L is deposited polycrystalline irrespective of the crystallinity of an underlying surface from which the template crystalline oxide layer 70L is grown. The polycrystalline metal oxide material may subsequently function as a crystalline template for the crystalline semiconductor material of the crystalline semiconductor layer 72L so that the crystalline semiconductor layer 72L can be deposited as a crystalline material layer. In other words, even if the crystalline semiconductor layer 72L can be grown as a crystalline material only in the presence of an underlying crystalline material, the presence of the polycrystalline metal oxide material of the template crystalline oxide layer 70L enables growth of the crystalline semiconductor layer 72L as a polycrystalline material layer.

Generally, the crystalline oxide material of the template crystalline oxide layer 70L may include a metal oxide material that may be deposited as a polycrystalline material layer at a deposition temperature that does not convert the amorphous semiconducting metal oxide material of the active layer 20 into a polycrystalline material. In other words, the metal oxide material of the template crystalline oxide layer 70L may be selected such that the metal oxide material of the template crystalline oxide layer 70L may be deposited as a polycrystalline metal oxide material layer while the active layer 20 remains amorphous. In one embodiment, the template crystalline oxide layer 70L comprises, and/or consists essentially of, magnesium oxide (MgO), a spinel material such as $MgAl_2O_4$, $ZnAl_2O_4$, $SiMg_2O_4$, $SiZn_2O_4$, $MgGa_2O_4$, and doped derivatives therefrom MgO, and a semiconducting metal oxide material (such as a doped indium gallium zinc oxide (IGZO)) that allow formation of a crystalline semiconducting metal oxide layer at a growth temperature that is not high enough to convert the amorphous semiconducting metal oxide material of the active layer 20 into a polycrystalline material. In one embodiment, the template crystalline oxide layer 70L includes a polycrystalline semiconducting metal oxide material having a lower crystalline growth temperature than the amorphous semiconducting metal oxide material of the active layer 20.

In one embodiment, the template crystalline oxide layer 70L may be deposited by chemical vapor deposition (CVD), atomic layer deposition (ALD), physical vapor deposition (PVD), and molecular beam deposition. The crystallinity of the material of the template crystalline oxide layer 70L depends on the deposition conditions used to deposit the template crystalline oxide layer 70L such as the growth temperature and the oxygen pressure during deposition. It has been experimentally observed that there is a positive correlation between the crystallinity of a deposited metal oxide material (such as indium gallium zinc oxide) that is deposited by physical vapor deposition and the oxygen flow rate during the physical vapor deposition process.

Generally, the higher the growth temperature of the template crystalline oxide layer 70L, the higher the crystallinity of the material in the template crystalline oxide layer 70L. Further, the higher the flow rate of gases (such as the flow rate of oxygen) employed to deposit the template crystalline oxide layer 70L, the higher the crystallinity of the material in the template crystalline oxide layer 70L. Generally, the crystallinity of a semiconducting metal oxide material may be increased at a given growth temperature by increasing the oxygen flow rate during deposition of the semiconducting metal oxide material.

In one embodiment, the thickness of the template crystalline oxide layer 70L directly in contact with the top surface of the active layer 20 may be as thin as possible to reduce the additional electrical resistance of the template crystalline oxide layer 70L, but may be thick enough to allow formation of a crystalline structure within the active layer 20. For example, the thickness of horizontal portions of the template crystalline oxide layer 70L in contact with the active layer 20 may be in a range from 0.1 nm to 5 nm, such as from 0.2 nm to 3 nm and/or from 0.4 nm to 2 nm.

The crystalline semiconductor layer 72L may include a semiconductor material having a different material composition than the template crystalline oxide layer 70L. In one embodiment, the crystalline semiconductor layer 72L may comprise a semiconducting metal oxide material or a conductive metal oxide material that may be derived from a semiconducting metal oxide material by increasing the atomic concentration of dopant atoms. The crystalline semiconductor layer 72L may include a doped crystalline semiconductor material having an opposite type of doping than the doping in the active layer 20. In one embodiment, the active layer 20 has a doping of a first conductivity type, and the crystalline semiconductor layer 72L has a doping of a second conductivity type that is the opposite of the first conductivity type. For example, the active layer 20 may have a p-type doping, and the crystalline semiconductor layer 72L may have an n-type doping, or vice versa. In one embodiment, the dopant concentration in the active layer 20 may be in a range from $1.0 \times 10^{12}/cm^3$ to $1.0 \times 10^{18}/cm^3$, and the dopant concentration in the crystalline semiconductor layer 72L may be in a range from $1.0 \times 10^{18}/cm^3$ to $3.0 \times 10^{21}/cm^3$. In one embodiment, the crystalline semiconductor layer 72L may comprise a heavily doped metal oxide material such as a heavily doped semiconducting metal oxide or a heavily-doped conductive metal oxide derived from indium gallium zinc oxide (IGZO), silicon-doped IGZO, indium tungsten oxide, indium zinc oxide, indium tin oxide, tin germanium oxide, gallium oxide, indium oxide, doped zinc oxide, doped indium oxide (such as tungsten-doped indium oxide), doped cadmium oxide, nickel oxide, tin oxide, or copper oxide.

The crystalline semiconductor layer 72L may be deposited by a conformal deposition process such as chemical vapor deposition process or an atomic layer deposition process. Alternatively, the crystalline semiconductor layer 72L may be deposited by a non-conformal deposition process such as physical vapor deposition or molecular beam deposition. The thickness of the horizontally-extending portions of the crystalline semiconductor layer 72L within the source-side via opening and the drain-side via opening may be in a range from 0.1 nm to 10 nm, such as from 0.2 nm to 6 nm, and/or from 0.4 nm to 4 nm, although lesser and greater thicknesses may also be used.

According to an aspect of the present disclosure, the crystalline semiconductor layer 72L may be grown as a polycrystalline semiconductor layer with crystallographic registry (i.e., epitaxy) with the polycrystalline grains of the template crystalline oxide layer 70L. Thus, the template crystalline oxide layer 70L may function as the polycrystalline template that facilitates deposition of the material of the crystalline semiconductor layer 72L as a polycrystalline material.

The metallic liner layer 53L comprises a conductive metallic nitride or a conductive metallic carbide such as TiN, TaN, WN, MoN, TiC, TaC, and/or WC. The thickness of the metallic liner layer 53L may be in a range from 1 nm to 100 nm, such as from 3 nm to 30 nm, although lesser and greater thicknesses may also be used.

The metallic fill material layer 54L includes a metallic fill material such as W, Cu, Al, Co, Ru, Mo, Ta, Ti, alloys thereof, and/or combinations thereof. The thickness of the metallic fill material layer 54L may be selected such that all remaining volumes of the source-side via opening 51 and the drain-side via opening 59 are filled with the metallic fill material layer 54L.

Crystalline materials have well-defined crystallographic structures and a full number of atomic bonds for almost all elements therein. Thus, almost all oxygen atoms in the template crystalline oxide layer 70L and the crystalline semiconductor layer 72L are bonded with a respective set of at least one metal atom, and are located within a respective energetically favorable atomic position than oxygen atoms in amorphous materials. As a consequence, the oxygen atoms in the template crystalline oxide layer 70L and the crystalline semiconductor layer 72L do not easily diffuse into the material of the metallic liner layer 53L due to the crystalline nature of the materials of the template crystalline oxide layer 70L and the crystalline semiconductor layer 72L compared to the oxygen atoms within an amorphous semiconductor material. Thus, the crystalline semiconductor layer 72L does not diffuse a significant amount of oxygen atoms into the metallic liner layer 53L, and the material property of the metallic liner layer 53L is not degraded due to contact with the crystalline semiconductor layer 72L. Thus, a low-contact-resistance structure may be provided by embodiments of the present disclosure.

Referring to FIGS. 7A-7C, portions of the metallic fill material layer 54L (as shown in FIGS. 6A-6C), the metallic liner layer 53L, the crystalline semiconductor layer 72L, and the template crystalline oxide layer 70L and the dielectric cap layer 49 (if present) may be removed from above the horizontal plane including the top surface of the dielectric layer 48 by a planarization process. The planarization process may use a chemical mechanical polishing (CMP) process and/or a recess etch process.

A remaining portion of the template crystalline oxide layer 70L that remains in the source-side via opening 51 constitutes a template crystalline source region 70S. A remaining portion of the template crystalline oxide layer 70L that remains in the drain-side via opening 59 constitutes a template crystalline drain region 70D. The template crystalline source region 70S and the template crystalline drain region 70D are collectively referred to as template crystalline oxide regions 70. The template crystalline source region 70S and the template crystalline drain region 70D may be formed through the gate dielectric 30 on a respective surface segment of the active layer 20.

A remaining portion of the crystalline semiconductor layer 72L (as formed at the processing steps of FIGS. 6A-6C) that remains in the source-side via opening 51 (as formed at the processing steps of FIG. 5B) constitutes a crystalline source region 72S. A remaining portion of the crystalline semiconductor layer 72L (as formed at the processing steps of FIGS. 6A-6C) that remains in the drain-side via opening 59 (as formed at the processing steps of FIG. 5B) constitutes a crystalline drain region 72D. The crystalline source region 72S and the crystalline drain region 72D are collectively referred to as crystalline source/drain regions 72.

A remaining portion of the metallic liner layer 53L that remains in the source-side via opening 51 constitutes a source metallic liner 53. A remaining portion of the metallic liner layer 53L that remains in the drain-side via opening 59 constitutes a drain metallic liner 57. The source metallic liner 53 and the drain metallic liner 57 are collectively referred to as metallic liners (53, 57).

A remaining portion of the metallic fill material layer 54L that remains in the source-side via opening 51 constitutes a source metallic fill material portion 54. A remaining portion of the metallic fill material layer 54L that remains in the drain-side via opening 59 constitutes a drain metallic fill material portion 58. The source metallic fill material portion 54 and the drain metallic fill material portion 58 are collectively referred to as metallic fill material portions (54, 58). The height of the source metallic fill material portion 54 and the drain metallic fill material portion 58 may be in a range from 1 nm to 1,000 nm, such as from 10 nm to 300 nm, and/or from 30 nm to 100 nm, although lesser and greater heights may also be used.

The contiguous combination of the source metallic liner 53 and the source metallic fill material portion 54 constitutes a metallic source electrode 52. The contiguous combination of the drain metallic liner 57 and the drain metallic fill material portion 58 constitutes a metallic drain electrode 56. The metallic source electrode 52 and the metallic drain electrode 56 may be formed over end portions of the active layer 20, and are laterally spaced from each other by the gate electrode 35. The source electrode 52 is electrically connected to a first end portion 20E1 of the active layer 20, and the drain electrode 56 is electrically connected to a second end portion 20E2 of the active layer 20.

In one embodiment, the template crystalline source region 70S is in contact with a bottom surface of the crystalline source region 72S, and comprises a first portion of a crystalline metal oxide material that is different from the semiconductor oxide material of the crystalline source region 72S and the crystalline drain region 72D. The template crystalline drain region 70D is in contact with a bottom surface of the crystalline drain region 72D, and comprises a second portion of the crystalline metal oxide material.

In one embodiment, the template crystalline source region 70S comprises a tubular portion 70ST contacting an outer sidewall of the crystalline source region 72S, and a bottom plate portion 70SP adjoined to a bottom end of the tubular portion 70ST of the template crystalline source region 70S and underlying the crystalline source region 72S. In one embodiment, the tubular portion 70ST of the template crystalline source region 70S has a top surface within a same horizontal plane as a top surface of the crystalline source region 72S and the metallic source electrode 52.

In one embodiment, the template crystalline drain region 70D comprises a tubular portion contacting an outer sidewall of the crystalline drain region 72D, and a bottom plate portion adjoined to a bottom end of the tubular portion of the template crystalline drain region 70D and underlying the crystalline drain region 72D. In one embodiment, the tubular portion of the template crystalline drain region 70D has a top surface within a same horizontal plane as a top surface of the crystalline drain region 72D and the metallic drain electrode 56.

In one embodiment, the template crystalline source region 70S is in contact with a top surface of the first end portion 20E1 of the active layer 20, and the template crystalline drain region 70D is in contact with a top surface of the second end of the active layer 20.

Generally, a template crystalline source region 70S comprising a first portion of a crystalline oxide material may be formed on a first amorphous surface of the active layer 20 at a bottom of the source-side via opening 51. A crystalline source region 72S comprising a first portion of a crystalline semiconductor material may be formed over a first end portion 20E1 of the active layer 20. The crystalline source region 72S may be formed on a top surface of the template crystalline source region 70S. The crystalline source region 72S is electrically connected to the first end portion 20E1 of the active layer 20.

A template crystalline drain region 70D comprising a second portion of the crystalline oxide material may be formed on a second amorphous surface of the active layer 20 at a bottom of the drain-side via opening 59. A crystalline drain region 72D comprising a second portion of the crystalline semiconductor material may be formed over a second end portion 20E2 of the active layer 20. The crystalline drain region 72D may be formed on a top surface of the template crystalline drain region 70D. The crystalline drain region 72D is electrically connected to the second end portion 20E2 of the active layer 20.

The crystalline source region 72S may be located in a first via opening (such as the source-side via opening 51) vertically extending from a top surface of the dielectric layer 48 to a top surface of the active layer 20. The crystalline drain region 72D may be located in a second via opening (such as the drain-side via opening 59) vertically extending from the top surface of the dielectric layer 48 to the top surface of the active layer 20.

In one embodiment, the crystalline source region 72S comprises a tubular portion 72ST contacting an outer sidewall of the metallic source electrode 52 and a bottom plate portion 72SP adjoined to a bottom end of the tubular portion 72ST and underlying the metallic source electrode 52. In one embodiment, a top surface of the tubular portion 72ST of the crystalline source region 72S is located within a same horizontal plane as a top surface of the metallic source electrode 52.

In one embodiment, the crystalline drain region 72D comprises a tubular portion contacting an outer sidewall of the metallic drain electrode 56 and a bottom plate portion adjoined to a bottom end of the tubular portion and underlying the metallic drain electrode 56. In one embodiment, a top surface of the tubular portion of the crystalline drain region 72D is located within a same horizontal plane as a top surface of the metallic drain electrode 56.

A metallic source electrode 52 may be formed on the crystalline source region 72S in the source-side via opening 51. A metallic drain electrode 56 may be formed on the crystalline drain region 72D in the drain-side via opening 59. The dielectric layer 48 laterally surrounds the active layer 20, the crystalline source region 72S, and the crystalline drain region 72D. In one embodiment, the metallic source electrode 52 is in contact with a top surface of the crystalline source region 72S, and the metallic drain electrode 56 is in contact with a top surface of the crystalline drain region 72D.

In one embodiment, a first stack including a crystalline source region 72S comprising a first portion of a crystalline semiconductor material and a metallic source electrode 52 may be located within the source-side via opening 51. A second stack including a crystalline drain region 72D comprising a second portion of the crystalline semiconductor material and a metallic drain electrode 56 may be located within the drain-side via opening 59. In one embodiment, a template crystalline source region 70S comprising a first portion of a crystalline oxide material that is different from the crystalline semiconductor material may contact a bottom surface of the crystalline source region 72S, and a template crystalline drain region 70D comprising a second portion of the crystalline oxide material may contact a bottom surface of the crystalline drain region 72D.

Referring to FIGS. 8A-8C, a second exemplary structure is illustrated after formation of a crystalline source region 72S, a crystalline drain region 72D, a metallic source electrode 52, and a metallic drain electrode 56. The second exemplary structure may be derived from the first exemplary structure by omitting formation of the template crystalline oxide layer 70L. Thus, the template crystalline source region 70S and the template crystalline drain region 70D are not present in the second exemplary structure. In this embodiment, the material of the crystalline semiconductor layer 72L and the deposition process that forms the crystalline semiconductor layer 72L are selected such that the crystalline semiconductor layer 72L is deposited as a crystalline material layer. Thus, a material that may be deposited as a crystalline material layer directly on amorphous surfaces (such as the physically exposed surfaces of the amorphous material of the active layer 20) may be selected as the material of the crystalline semiconductor layer 72L in this embodiment. In the second exemplary structure, the crystalline source region 72S contacts a top surface of the first end portion 20E1 of the active layer 20, and the crystalline drain region 72D contacts a top surface of the second end portion 20E2 of the active layer 20.

Figure 9C:
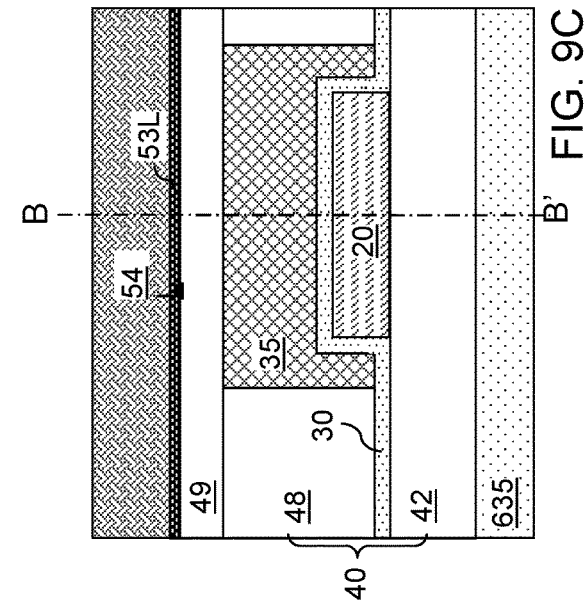
FIGS. 9A-9C are various views of a region of a third exemplary structure after formation of a template crystalline source region, a crystalline source region, a template crystalline drain region, a crystalline drain region, a metallic liner layer, and a metallic fill material layer according to an embodiment of the present disclosure.
Figure 9A:
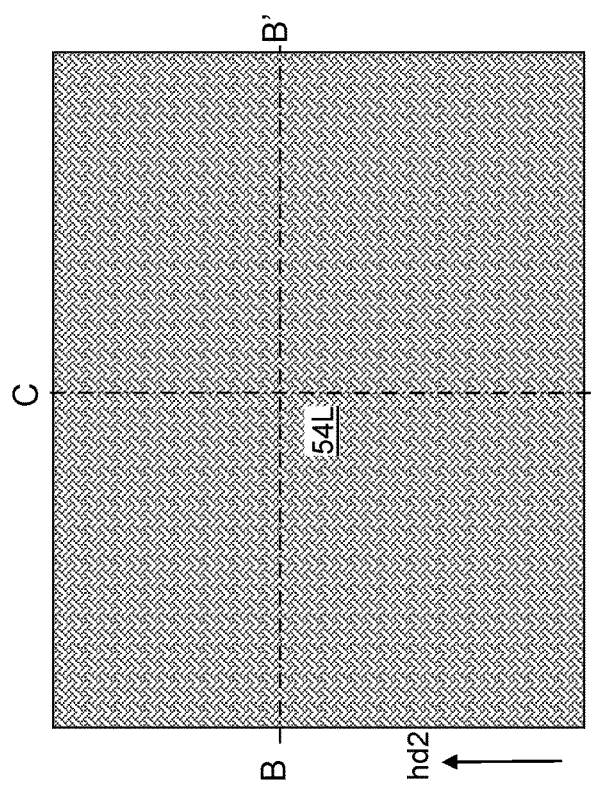
Figure 9B:
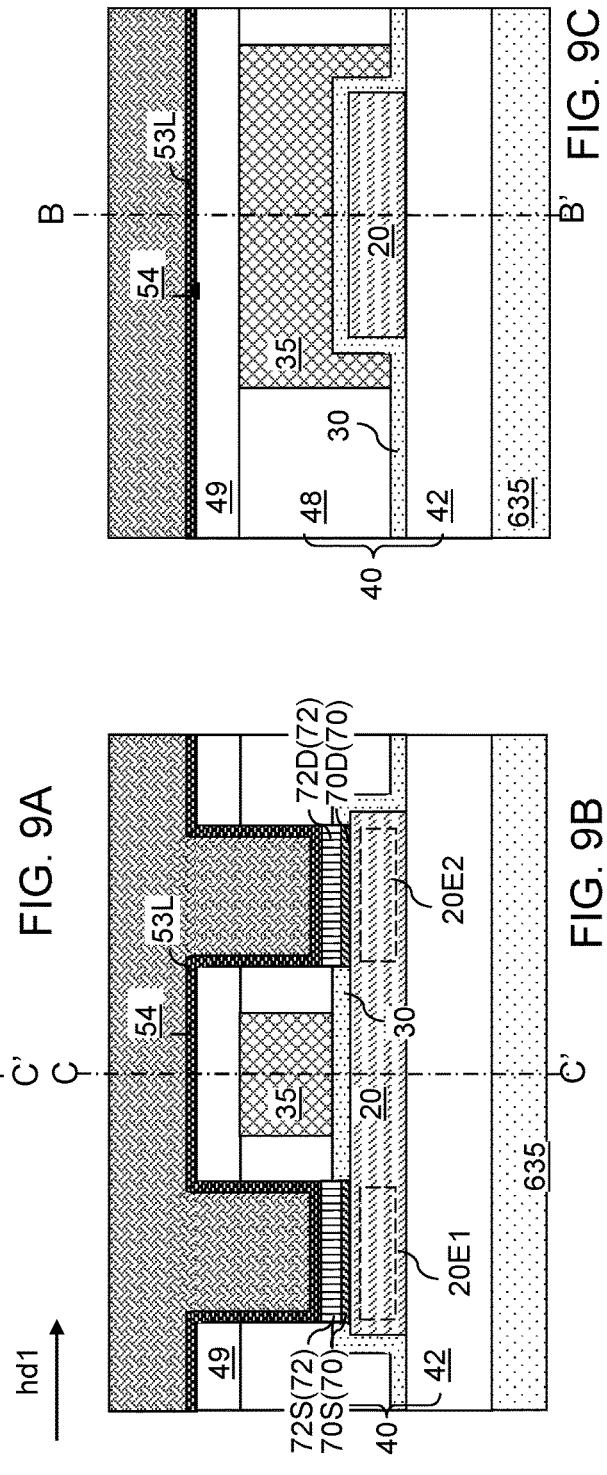

Referring to FIGS. 9A-9C, a third exemplary structure may be derived from the first exemplary structure by forming the template crystalline source region 70S, the template crystalline drain region 70D, the crystalline source region 72S, and the crystalline drain region 72D using selective deposition processes. A selective deposition process refers to a process in which a deposited material is grown only from surfaces of a first type and does not grow from surfaces of a second type.

Specifically, a first selective deposition process that grows a crystalline oxide material directly from physically exposed surfaces of the active layer 20 without growth of the crystalline oxide material from surface of the dielectric layer 48 or the dielectric cap layer 49 may be performed to form the template crystalline source region 70S and the template crystalline drain region 70D. The thickness and the material composition of the template crystalline source region 70S and the template crystalline drain region 70D may be the same as in the first exemplary structure.

A second selective deposition process that grows a crystalline semiconductor material directly from physically exposed surfaces of the template crystalline source region 70S and the template crystalline drain region 70D without growth of the crystalline oxide material from surface of the dielectric layer 48 or the dielectric cap layer 49 may be performed to form the crystalline source region 72S and the crystalline drain region 72D. In one embodiment, the dielectric layer 48 and the dielectric cap layer 49 comprise silicon oxide materials, and the crystalline source region 72S and the crystalline drain region 72D may be formed by a selective semiconductor deposition process that deposits the crystalline semiconductor material on crystalline metal oxide surfaces while suppressing growth of the crystalline semiconductor material from silicon oxide surfaces The thickness and the material composition of the crystalline source region 72S and the crystalline drain region 72D may be the same as in the first and second exemplary structures. A metallic liner layer 53L and a metallic fill material layer 54L may be desisted in the same manner as in the processing steps of FIGS. 6A-6C.

Referring to FIGS. 10A-10C, a planarization process may be performed to remove portions of the metallic liner layer 53L and the metallic fill material layer 54L that overlie a horizontal plane including a top surface of the dielectric layer 48. A contiguous remaining portion of the metallic liner layer 53L and the metallic fill material layer 54L located in the source-side via opening 51 constitutes a metallic source electrode 52, and a contiguous remaining portion of the metallic liner layer 53L and the metallic fill material layer 54L located in the drain-side via opening 59 constitutes a metallic drain electrode 56.

The metallic source electrode 52 is in contact with a top surface of the crystalline source region 72S, and the metallic drain electrode 56 is in contact with a top surface of the crystalline drain region 72D. The metallic source electrode 52 and the metallic drain electrode 56 are located within the dielectric layer 48. A periphery PS of a top surface of the crystalline source region 72S coincides with a periphery of a bottom surface of the metallic source electrode 52, and is in contact with the dielectric layer 48. A periphery PD of a top surface of the crystalline drain region 72D coincides with a periphery of a bottom surface of the metallic drain electrode 56, and is in contact with the dielectric layer 48.

Referring to FIGS. 11A-11C, a fourth exemplary structure is illustrated after formation of a crystalline source region 72S, a crystalline drain region 72D, a metallic source electrode 52, and a metallic drain electrode 56. The fourth exemplary structure may be derived from the third exemplary structure by omitting formation of the template crystalline source region 70S and the template crystalline drain region 70D. Thus, the template crystalline source region 70S and the template crystalline drain region 70D are not present in the fourth exemplary structure. In this embodiment, the material of the crystalline source region 72S and the crystalline drain region 72D and the selective deposition process that forms the crystalline source region 72S and the crystalline drain region 72D are selected such that the crystalline source region 72S and the crystalline drain region 72D are deposited as crystalline material portions. Thus, a material that may be selectively grown as a crystalline material layer directly on amorphous surfaces (such as the physically exposed surfaces of the amorphous material of the active layer 20) is selected as the material of the crystalline source region 72S and the crystalline drain region 72D in this embodiment. In one embodiment, the dielectric layer 48 and the dielectric cap layer 49 comprise silicon oxide materials, and the crystalline source region 72S and the crystalline drain region 72D may be formed by a selective semiconductor deposition process that deposits the crystalline semiconductor material on amorphous semiconductor surfaces while suppressing growth of the crystalline semiconductor material from silicon oxide surfaces. In the fourth exemplary structure, the crystalline source region 72S contacts a top surface of the first end portion 20E1 of the active layer 20, and the crystalline drain region 72D contacts a top surface of the second end portion 20E2 of the active layer 20.

Referring to FIGS. 12A-12C, a fifth exemplary structure may be derived from the first exemplary structure of FIGS. 5A-5C by depositing a crystalline oxide material in the source-side via opening 51 and in the drain-side via opening 59 such that the source-side via opening 51 and the drain-side via opening 59 are filled within the crystalline oxide material. The crystalline oxide material that fills the source-side via opening 51 and in the drain-side via opening 59 may be any material that may be used for the template crystalline source region 70S and the template crystalline drain region 70D in previously described exemplary structures. A planarization process such as a chemical mechanical polishing (CMP) process may be performed to remove portions of the crystalline oxide material that are formed above the horizontal plane including the top surface of the dielectric cap layer 49. A remaining portion of the crystalline oxide material that fills the source-side via opening 51 constitutes a template crystalline source via structure 70S'. A remaining portion of the crystalline oxide material that fills the drain-side via opening 59 constitutes a template crystalline drain via structure 70D'. The template crystalline source via structure 70S' and the template crystalline drain via structure 70D' are collectively referred to as template crystalline via structures (70S', 70D').

Referring to FIGS. 13A-13C, the template crystalline via structures (70S', 70D') are vertically recessed selective to the materials of the dielectric cap layer 49 and the dielectric layer 48 by a recess etch process. The recess etch process may comprise dry etch process (such as a reactive ion etch process or a chemical dry etch process) or a wet etch process. In one embodiment, the recess etch process may comprise a timed dry etch process. The remaining portions of the template crystalline via structures (70S', 70D') after the recess etch process comprise a template crystalline source via structure 70S and a template crystalline drain via structure 70D. The template crystalline source via structure 70S and the template crystalline drain via structure 70D of the fifth exemplary structure may have the same material composition and the same thickness range as the template crystalline source via structure 70S and the template crystalline drain via structure 70D of the first exemplary structure. The duration of the recess etch process may be selected such that the thickness of the template crystalline source via structure 70S and the template crystalline drain via structure 70D is in a range from 0.1 nm to 5 nm, such as from 0.2 nm to 3 nm and/or from 0.4 nm to 2 nm, although lesser and greater thicknesses may also be used.

Referring to FIGS. 14A-14C, a crystalline semiconductor material may be deposited in remaining volumes of the source-side via opening 51 and in the drain-side via opening 59 such that the source-side via opening 51 and the drain-side via opening 59 may be filled within the crystalline semiconductor material. The crystalline semiconductor material that fills the source-side via opening 51 and in the drain-side via opening 59 may be any material that may be used for the crystalline source region 72S and the crystalline drain region 72D in previously described exemplary structures. A planarization process such as a chemical mechanical polishing (CMP) process may be performed to remove portions of the crystalline semiconductor material that are formed above the horizontal plane including the top surface of the dielectric cap layer 49. A remaining portion of the crystalline semiconductor material that fills the source-side via opening 51 constitutes a crystalline source via structure 72S'. A remaining portion of the crystalline semiconductor material that fills the drain-side via opening 59 constitutes a crystalline drain via structure 72D'. The crystalline source via structure 72S' and the crystalline drain via structure 72D' are collectively referred to as crystalline via structures (72S', 72D').

Figure 15C:
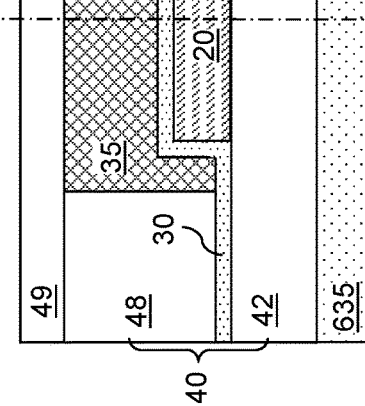
FIGS. 15A-15C are various views of a region of the fifth exemplary structure after formation of a crystalline source region and a crystalline drain region according to an embodiment of the present disclosure.
Figure 15A:
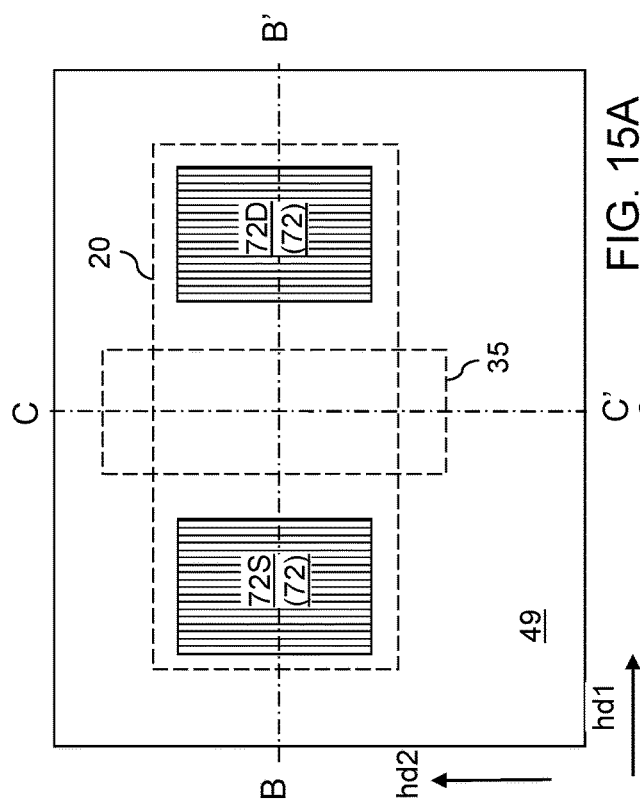
Figure 15B:
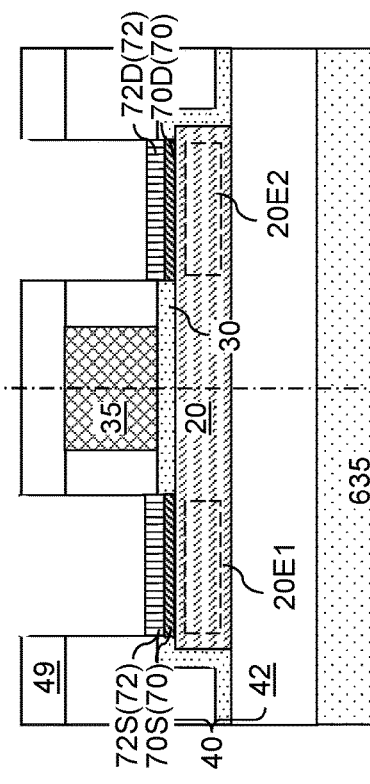

Referring to FIGS. 15A-15C, the crystalline via structures (72S', 72D') are vertically recessed selective to the materials of the dielectric cap layer 49 and the dielectric layer 48 by a recess etch process. The recess etch process may comprise dry etch process (such as a reactive ion etch process or a chemical dry etch process) or a wet etch process. In one embodiment, the recess etch process may comprise a timed dry etch process. The remaining portions of the crystalline via structures (72S', 72D') after the recess etch process comprise a crystalline source region 72S and a crystalline drain region 72D. The crystalline source region 72S and the crystalline drain region 72D of the fifth exemplary structure may have the same material composition and the same thickness range as the crystalline source region 72S and the crystalline drain region 72D of the first exemplary structure. The duration of the recess etch process may be selected such that the thickness of the crystalline source region 72S and the crystalline drain region 72D is in a range from 0.1 nm to 10 nm, such as from 0.2 nm to 6 nm, and/or from 0.4 nm to 4 nm, although lesser and greater thicknesses may also be used.

Referring to FIGS. 16A-16C, a metallic liner layer 53L and a metallic fill material layer 54L may be desisted in the same manner as in the processing steps of FIGS. 6A-6C.

Referring to FIGS. 17A-17C, a planarization process may be performed to remove portions of the metallic liner layer 53L and the metallic fill material layer 54L that overlie a horizontal plane including a top surface of the dielectric layer 48. The fifth exemplary structure may be substantially the same as the third exemplary structure illustrated in FIGS. 10A-10C. A contiguous remaining portion of the metallic liner layer 53L and the metallic fill material layer 54L located in the source-side via opening 51 constitutes a metallic source electrode 52, and a contiguous remaining portion of the metallic liner layer 53L and the metallic fill material layer 54L located in the drain-side via opening 59 constitutes a metallic drain electrode 56.

The metallic source electrode 52 is in contact with a top surface of the crystalline source region 72S, and the metallic drain electrode 56 is in contact with a top surface of the crystalline drain region 72D. The metallic source electrode 52 and the metallic drain electrode 56 are located within the dielectric layer 48. A periphery PS of a top surface of the crystalline source region 72S coincides with a periphery of a bottom surface of the metallic source electrode 52, and is in contact with the dielectric layer 48. A periphery PD of a top surface of the crystalline drain region 72D coincides with a periphery of a bottom surface of the metallic drain electrode 56, and is in contact with the dielectric layer 48.

Referring to FIGS. 18A-18C, a sixth exemplary structure is illustrated after formation of a crystalline source region 72S, a crystalline drain region 72D, a metallic source electrode 52, and a metallic drain electrode 56. The sixth exemplary structure may be derived from the fifth exemplary structure by omitting the processing steps of FIGS. 12A-12C and FIGS. 13A-13C, and may be substantially the same as the fourth exemplary structure illustrated in FIGS. 11A-11C. Thus, the template crystalline source region 70S and the template crystalline drain region 70D are not present in the sixth exemplary structure. In this embodiment, the material of the crystalline source via structure 72S' and the crystalline drain via structure 72D' and the deposition process that forms the crystalline source via structure 72S' and the crystalline drain via structure 72D' are selected such that the crystalline source via structure 72S' and the crystalline drain via structure 72D' are deposited as crystalline material portions. Thus, a material that may be grown as a crystalline material layer directly on amorphous surfaces (such as the physically exposed surfaces of the amorphous material of the active layer 20) is selected as the material of the crystalline source via structure 72S' and the crystalline drain via structure 72D' (and thus, as the material of the crystalline source region 72S and the crystalline drain region 72D) in this embodiment. In one embodiment, the dielectric layer 48 and the dielectric cap layer 49 comprise silicon oxide materials, and the crystalline source via structure 72S' and the crystalline drain via structure 72D' may be formed by a semiconductor deposition process that deposits the crystalline semiconductor material on amorphous semiconductor surfaces. In the sixth exemplary structure, the crystalline source region 72S contacts a top surface of the first end portion 20E1 of the active layer 20, and the crystalline drain region 72D contacts a top surface of the second end portion 20E2 of the active layer 20.

Referring to FIGS. 19A-19C, a seventh exemplary structure may be derived from the first exemplary structure of FIG. 1. In this embodiment, a metal interconnect structure such as a metal line structure or a metal via structure may be located within a region of the insulating matrix layer 635 over which a gate electrode of a thin film transistor is to be subsequently formed. In the illustrative example, a second metal via structure 632 may be located within the insulating matrix layer 635.

An insulating layer 42 may be deposited over the insulating matrix layer 635. The insulating layer 42 includes an insulating material such as undoped silicate glass, a doped silicate glass, silicon oxynitride, silicon nitride, silicon carbide nitride, organosilicate glass, or a combination or a stack thereof. The thickness of the insulating layer 42 may be in a range from 10 nm to 300 nm, such as from 30 nm to 100 nm, although lesser and greater thicknesses may also be used.

A recess region may be formed within a portion of the insulating layer 42 in which a gate electrode is to be subsequently formed. For example, a photoresist layer (not shown) may be applied over the top surface of the insulating layer 42, and may be lithographically patterned to form an opening in the area in which the gate electrode is to be subsequently formed, and an anisotropic etch process may be performed to transfer the pattern of the opening in the photoresist layer through the insulating layer 42, thereby forming a recess region. A top surface of a metal interconnect structure (such as a top surface of a second metal via structure 632) may be physically exposed at the bottom of the recess region. The photoresist layer may be subsequently removed, for example, by ashing.

The recess region may be filled with at least one metallic material to form a gate electrode 15. In one embodiment, the at least one metallic fill material may comprise a combination of a metallic liner layer including a metallic barrier material and a metallic fill material layer including a metallic fill material. The metallic liner layer may comprise a metallic barrier material such as TiN, TaN, WN, TiC, TaC, WC, or a stack thereof, and may be deposited by physical vapor deposition of chemical vapor deposition. The thickness of the metallic liner layer may be in a range from 1 nm to 30 nm, although lesser and greater thicknesses may also be used. The metallic fill material layer may comprise W, Cu, Al, Co, Ru, Mo, Ta, Ti, TiN, TaN, alloys thereof, and/or combinations thereof. A planarization process, such as a chemical mechanical polishing (CMP) process, may be performed to remove portions of the metallic liner layer and the metallic fill material layer that overlie the horizontal plane including the top surface of the insulating layer 42. Each remaining portion of the at least one metallic material comprises a gate electrode 15. The top surface of the gate electrode 15 may be within the same plane as the top surface of the insulating layer 42.

Figure 20C:
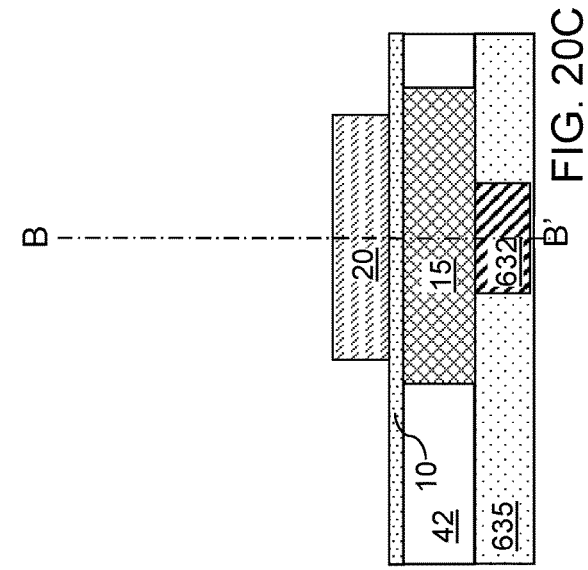
FIGS. 20A-20C are various views of a region of the seventh exemplary structure after formation of a gate dielectric and an active layer according to an embodiment of the present disclosure.
Figure 20A:
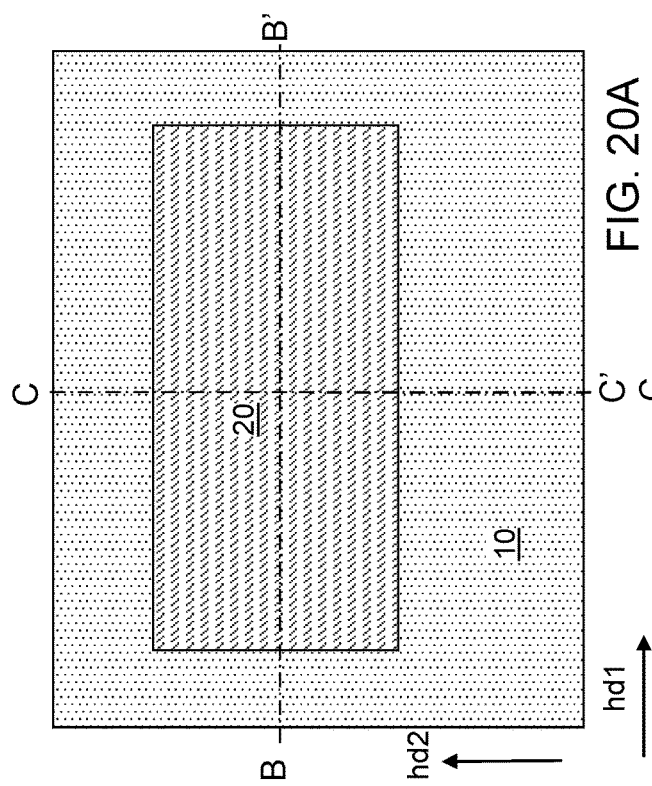
Figure 20B:
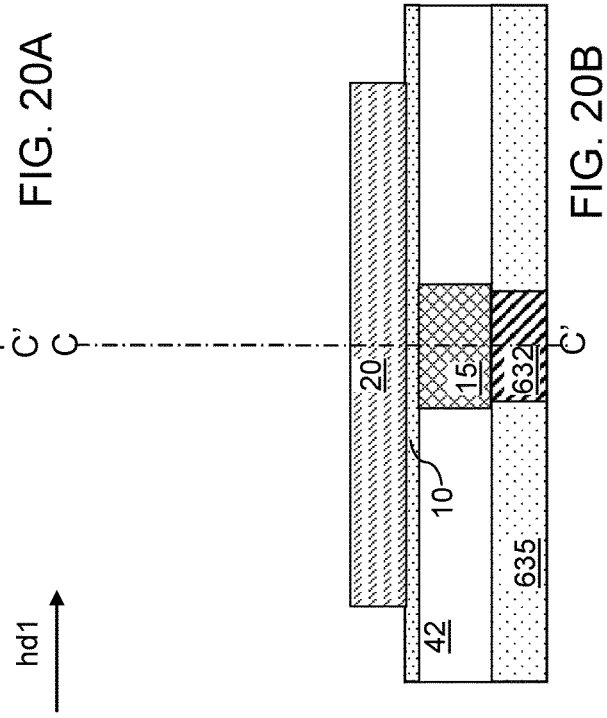

Referring to FIGS. 20A-20C, a gate dielectric 10 may be formed over the insulating layer 42 and the gate electrode 15 by deposition of at least one gate dielectric material. The at least one gate dielectric material may include, but is not limited to, silicon oxide, silicon oxynitride, a high-k dielectric metal oxide (such as hafnium oxide, zirconium oxide, hafnium zirconium oxide, titanium oxide, tantalum oxide, yttrium oxide, lanthanum oxide, aluminum oxide, etc.), or a stack thereof. Other suitable dielectric materials are within the contemplate scope of disclosure. The at least one gate dielectric material may be deposited by atomic layer deposition or chemical vapor deposition although other suitable deposition processes may be used. The thickness of the gate dielectric 10 may be in a range from 1 nm to 15 nm, such as from 2 nm to 6 nm, although lesser and greater thicknesses may also be used.

A continuous active layer including a semiconducting material is deposited over the gate dielectric 10. The continuous active layer may comprise any material that may be used for the continuous active layer that is formed at the processing steps of FIGS. 2A-2C during manufacture of the first exemplary structure. In one embodiment, the entirety of the continuous active layer may comprise, and/or may consist essentially of, an amorphous semiconducting material. The continuous active layer may be deposited by physical vapor deposition although other suitable deposition processes may be used. The thickness of the continuous active layer may be in a range from 1 nm to 100 nm, such as from 2 nm to 50 nm and/or from 3 nm to 20 nm, although lesser and greater thicknesses may also be used.

A photoresist layer (not shown) may be applied over the continuous active layer, and may be lithographically patterned to form discrete patterned photoresist material portions. Each patterned portion of the photoresist layer may be located within the area of a respective one of the unit device areas. The area of each patterned portion of the photoresist layer defines the area of a semiconducting metal oxide portion to be subsequently patterned from the continuous active layer. In one embodiment, each patterned portion of the photoresist layer may have a horizontal cross-sectional shape of a rectangle or a rounded rectangle.

The pattern in the photoresist layer may be transferred through the continuous active layer by performing an anisotropic etch process. Patterned portion of the continuous active layer comprise active layers 20, which may comprise semiconducting metal oxide plates having a uniform thickness throughout. The photoresist layer may be subsequently removed, for example, by ashing.

In one embodiment, each active layer 20 may have a horizontal cross-sectional shape of a rectangle or a rounded rectangle. In one embodiment, each active layer 20 may have a lateral dimension along the first horizontal direction hd1 in a range from 60 nm to 1,000 nm, such as from 100 nm to 300 nm, although lesser and greater lateral dimensions may also be used. In one embodiment, each active layer 20 may have a lateral dimension along the second horizontal direction hd2 in a range from 20 nm to 500 nm, such as from 40 nm to 250 nm, although lesser and greater lateral dimensions may also be used. The ratio of the lateral dimension along the first horizontal direction hd1 to the lateral dimension along the second horizontal direction hd2 in each active layer 20 may be in a range from 0.5 to 4, such as from 1 to 2, although lesser and greater ratios may also be used.

Generally, a vertical stack is formed, which includes, in order from bottom to top or from top to bottom, a gate electrode, a gate dielectric, and an active layer 20 comprising an amorphous semiconductor material. In one embodiment, the gate dielectric 10 contacts a top surface of the gate electrode 15 and a bottom surface of a middle portion of the active layer 20.

Referring to FIGS. 21A-21C, a dielectric layer 48 may be deposited over the gate dielectric 30. The dielectric layer 48 is also referred to as an electrode-level dielectric layer. The dielectric layer 48 includes a dielectric material such as undoped silicate glass, a doped silicate glass, organosilicate glass, silicon oxynitride, silicon oxynitride, or a stack thereof. Optionally, the dielectric layer 48 may be planarized to provide a flat top surface. The set of the insulating layer 42 and the dielectric layer 48 is herein referred to as a thin-film-transistor-level (TFT-level) dielectric layer 40, i.e., a dielectric layer that is located at the level of thin film transistors. The dielectric layer 48 may comprise the same dielectric material as, or may comprise a different dielectric material from, the dielectric material of the insulating layer 42. The thickness of the dielectric layer 48 as measured from above the gate dielectric 30 may be in a range from 1 nm to 1,000 nm, such as from 10 nm to 500 nm, and/or from 100 nm to 300 nm, although lesser and greater thicknesses may also be used.

A photoresist layer (not shown) may be applied over the TFT-level dielectric layer 40, and may be lithographically patterned to form discrete openings therein. The pattern of the openings in the photoresist layer include a pair of openings overlying end portions of the active layer 20. The pattern of the discrete openings in the photoresist layer may be transferred through the dielectric layer 48 by an anisotropic etch process to form a first via opening located over a first end portion 20E1 of the active layer 20 and a second via opening located over a second end portion 20E2 of the active layer 20. The first via opening is herein referred to as a source-side via opening 51, and the second via opening is herein referred to as a drain-side via opening 59. The anisotropic etch process may be selective to the material of the active layer 20. However, due to finite selectivity of the anisotropic etch process used to form the source-side via opening 51 and the drain-side via opening 59, surfaces of the active layer 20 may be vertically recessed underneath the source-side via opening 51 and the drain-side via opening 59. The vertical recess distance may be in a range from 0.1 nm to 6 nm, such as from 0.3 nm to 3 nm, although lesser and greater vertical recess distances may also be used. The photoresist layer may be subsequently removed, for example, by ashing.

Figure 22A:
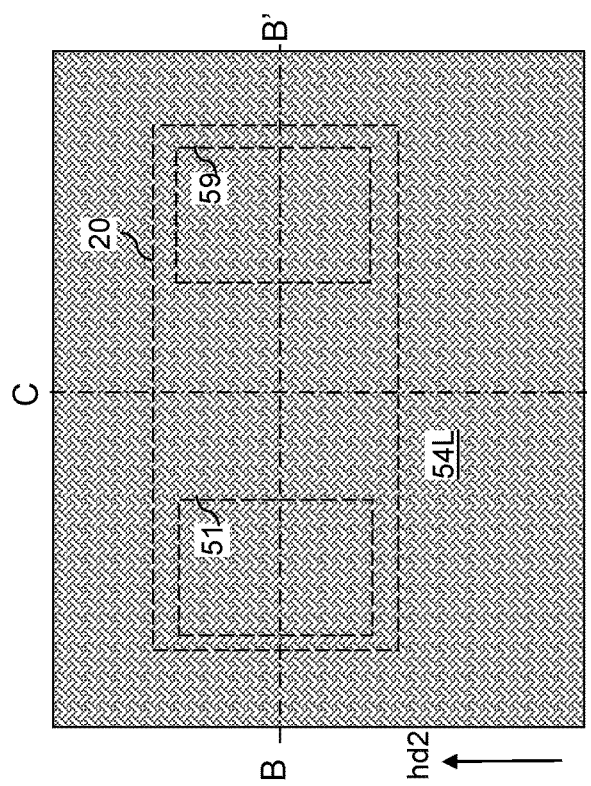
FIGS. 22A-22C are various views of a region of the seventh exemplary structure after formation of a template crystalline oxide layer, a crystalline semiconductor layer, a metallic liner layer, and a metallic fill material layer according to an embodiment of the present disclosure.
Figure 22C:
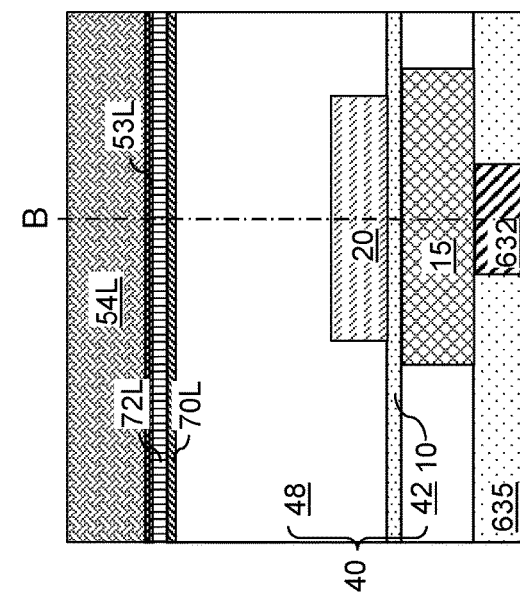
Figure 22B:
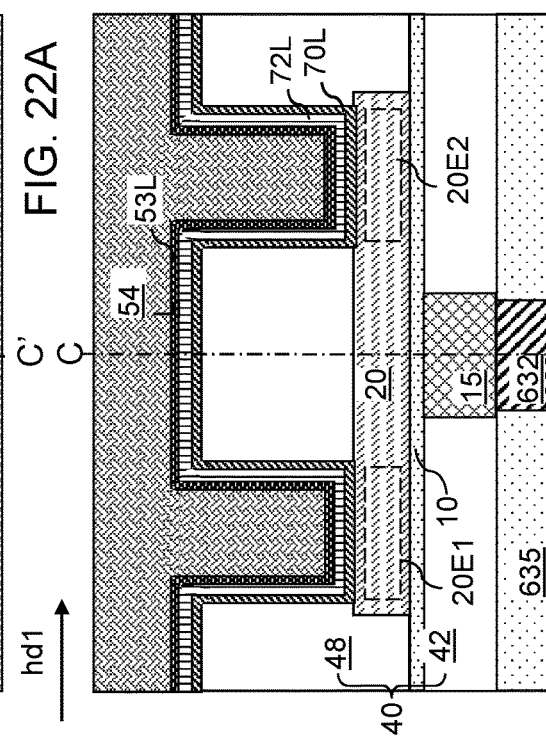

Referring to FIGS. 22A-22C, the processing steps of FIGS. 6A-6C may be performed to form a template crystalline oxide layer 70L, a crystalline semiconductor layer 72L, a metallic liner layer 53L, and a metallic fill material layer 54L.

Referring to FIGS. 23A-23C, the processing steps of FIGS. 7A-7C may be performed to form a template crystalline source region 70S, a crystalline source region 72S, a template crystalline drain region 70D, a crystalline drain region 72D, a metallic source electrode 52, and a metallic drain electrode 56.

Referring to FIGS. 24A-24C, an eighth exemplary structure is illustrated after formation of a crystalline source region 72S, a crystalline drain region 72D, a metallic source electrode 52, and a metallic drain electrode 56. The eighth exemplary structure may be derived from the seventh exemplary structure by omitting formation of the template crystalline oxide layer 70L. Thus, the template crystalline source region 70S and the template crystalline drain region 70D are not present in the eighth exemplary structure. In this embodiment, the material of the crystalline semiconductor layer 72L and the deposition process that forms the crystalline semiconductor layer 72L are selected such that the crystalline semiconductor layer 72L is deposited as a crystalline material layer. Thus, a material that may be deposited as a crystalline material layer directly on amorphous surfaces (such as the physically exposed surfaces of the amorphous material of the active layer 20) is selected as the material of the crystalline semiconductor layer 72L in this embodiment. In the eighth exemplary structure, the crystalline source region 72S contacts a top surface of the first end portion 20E1 of the active layer 20, and the crystalline drain region 72D contacts a top surface of the second end portion 20E2 of the active layer 20.

Figure 25C:
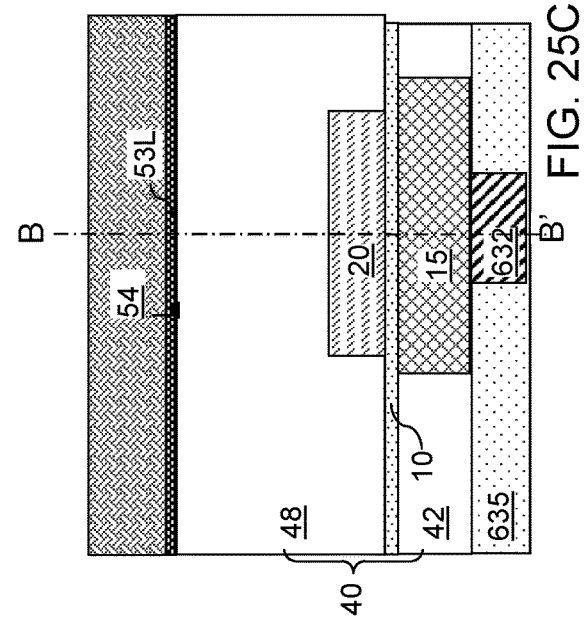
FIGS. 25A-25C are various views of a region of a ninth exemplary structure after formation of a template crystalline source region, a crystalline source region, a template crystalline drain region, a crystalline drain region, a metallic liner layer, and a metallic fill material layer according to an embodiment of the present disclosure.
Figure 25A:
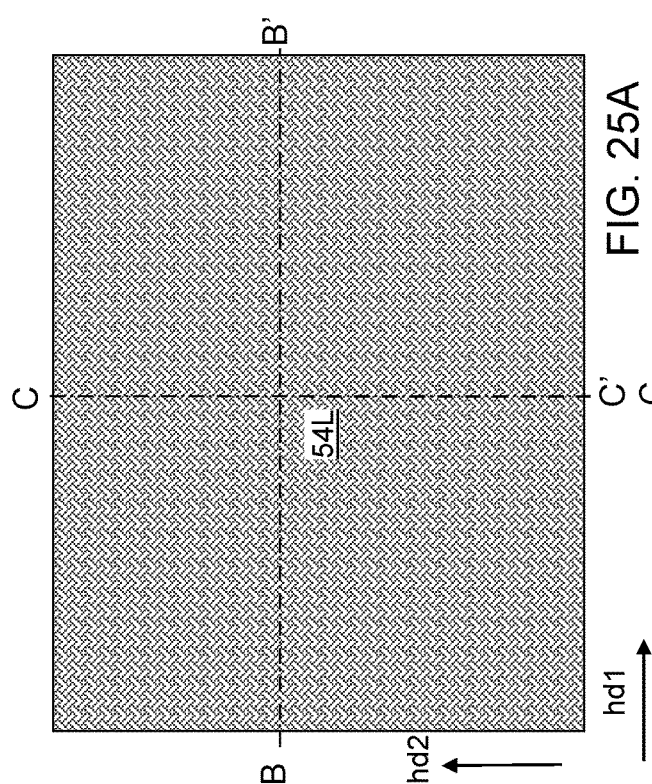
Figure 25B:
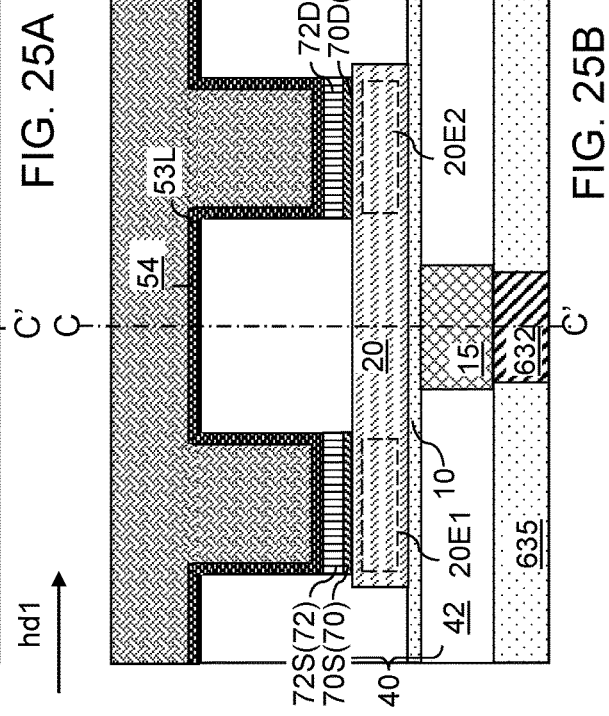

Referring to FIGS. 25A-25C, a ninth exemplary structure is illustrated, which may be derived from the seventh exemplary structure of FIGS. 21A-21C by performing a set of processing steps that is used to form the third exemplary structure illustrated in FIGS. 9A-9C. A template crystalline source region 70S, a crystalline source region 72S, a template crystalline drain region 70D, a crystalline drain region 72D, a metallic liner layer 53L, and a metallic fill material layer 54L may be formed.

Referring to FIGS. 26A-26C, the processing steps of FIGS. 10A-10C may be performed to form a metallic source electrode 52 and a metallic drain electrode 56.

Referring to FIGS. 27A-27C, a tenth exemplary structure may be derived from the ninth exemplary structure by omitting formation of the template crystalline source region 70S and the template crystalline drain region 70D. Thus, the template crystalline source region 70S and the template crystalline drain region 70D are not present in the tenth exemplary structure. In this embodiment, the material of the crystalline source region 72S and the crystalline drain region 72D and the selective deposition process that forms the crystalline source region 72S and the crystalline drain region 72D are selected such that the crystalline source region 72S and the crystalline drain region 72D are deposited as crystalline material portions. Thus, a material that may be selectively grown as a crystalline material layer directly on amorphous surfaces (such as the physically exposed surfaces of the amorphous material of the active layer 20) is selected as the material of the crystalline source region 72S and the crystalline drain region 72D in this embodiment. In one embodiment, the dielectric layer 48 and the dielectric cap layer 49 comprise silicon oxide materials, and the crystalline source region 72S and the crystalline drain region 72D may be formed by a selective semiconductor deposition process that deposits the crystalline semiconductor material on amorphous semiconductor surfaces while suppressing growth of the crystalline semiconductor material from silicon oxide surfaces. In the tenth exemplary structure, the crystalline source region 72S contacts a top surface of the first end portion 20E1 of the active layer 20, and the crystalline drain region 72D contacts a top surface of the second end portion 20E2 of the active layer 20.

Figure 28C:
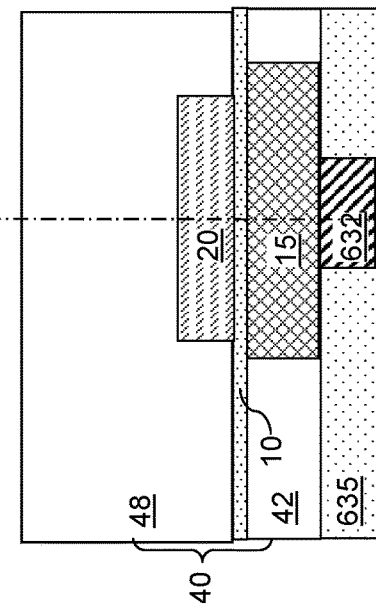
FIGS. 28A-28C are various views of a region of an eleventh exemplary structure after formation of a template crystalline source via structure and a template crystalline drain via structure according to an embodiment of the present disclosure.
Figure 28A:
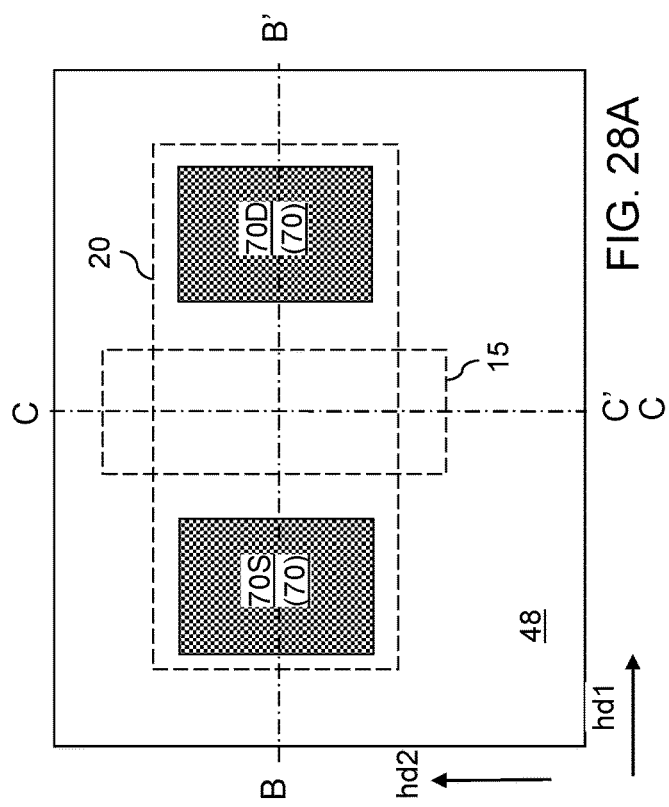
Figure 28B:
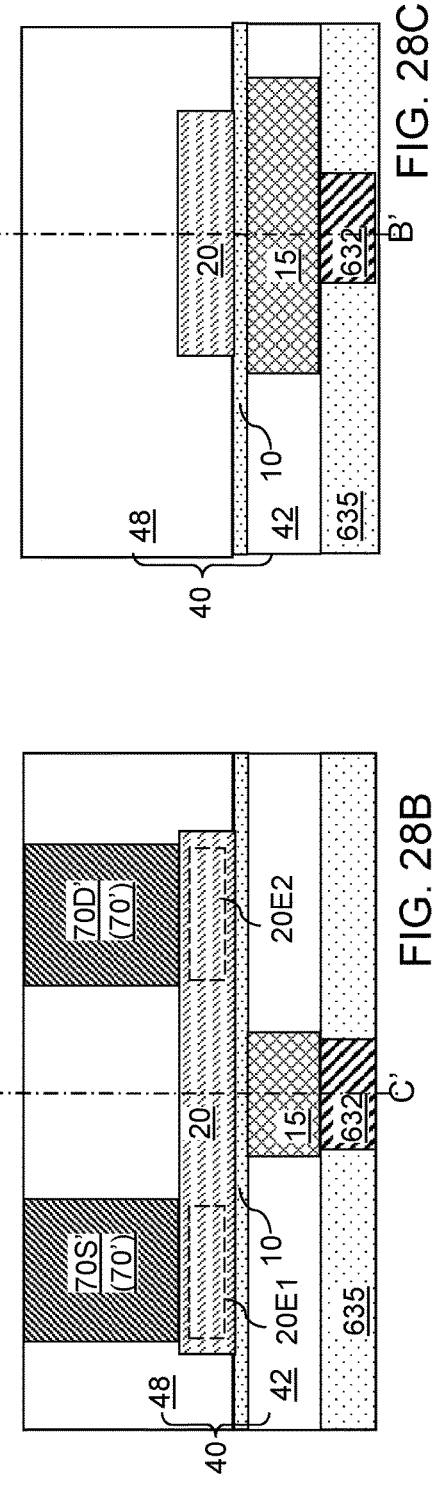

Referring to FIGS. 28A-28C, an eleventh exemplary structure may be derived from the seventh exemplary structure of FIGS. 21A-21C by performing the processing steps of FIGS. 12A-12C. A template crystalline source via structure 70S' and a template crystalline drain via structure 70D' may be formed.

Referring to FIGS. 29A-29C, the processing steps of FIGS. 13A-13C may be performed to form a template crystalline source region 70S and a template crystalline drain region 70D.

Referring to FIGS. 30A-30C, the processing steps of FIGS. 14A-14C may be performed to form a crystalline source via structure 72S' and a crystalline drain via structure 72D'.

Referring to FIGS. 31A-31C, the processing steps of FIGS. 15A-15C may be performed to form a crystalline source region 72S and a crystalline drain region 72D.

Referring to FIGS. 32A-32C, the processing steps of FIGS. 16A-16C may be performed to form a metallic liner layer 53L and a metallic fill material layer 54L.

Referring to FIGS. 33A-33C, the processing steps of FIGS. 17A-17C may be performed to form a metallic source electrode 52 and a metallic drain electrode 56. The eleventh exemplary structure at this processing step may have substantially the same structure as the ninth exemplary structure illustrated in FIGS. 26A-26C.

Referring to FIGS. 34A-34C, a twelfth exemplary structure is illustrated after formation of a crystalline source region 72S, a crystalline drain region 72D, a metallic source electrode 52, and a metallic drain electrode 56. The twelfth exemplary structure may be derived from the eleventh exemplary structure by omitting the processing steps of FIGS. 28A-28C and FIGS. 29A-29C, and may be substantially the same as the tenth exemplary structure illustrated in FIGS. 27A-27C. Thus, the template crystalline source region 70S and the template crystalline drain region 70D are not present in the twelfth exemplary structure. In this embodiment, the material of the crystalline source via structure 72S' and the crystalline drain via structure 72D' and the deposition process that forms the crystalline source via structure 72S' and the crystalline drain via structure 72D' are selected such that the crystalline source via structure 72S' and the crystalline drain via structure 72D' are deposited as crystalline material portions. Thus, a material that may be grown as a crystalline material layer directly on amorphous surfaces (such as the physically exposed surfaces of the amorphous material of the active layer 20) is selected as the material of the crystalline source via structure 72S' and the crystalline drain via structure 72D' (and thus, as the material of the crystalline source region 72S and the crystalline drain region 72D) in this embodiment. In one embodiment, the dielectric layer 48 and the dielectric cap layer 49 comprise silicon oxide materials, and the crystalline source via structure 72S' and the crystalline drain via structure 72D' may be formed by a semiconductor deposition process that deposits the crystalline semiconductor material on amorphous semiconductor surfaces. In the twelfth exemplary structure, the crystalline source region 72S contacts a top surface of the first end portion 20E1 of the active layer 20, and the crystalline drain region 72D contacts a top surface of the second end portion 20E2 of the active layer 20.

Figure 35:
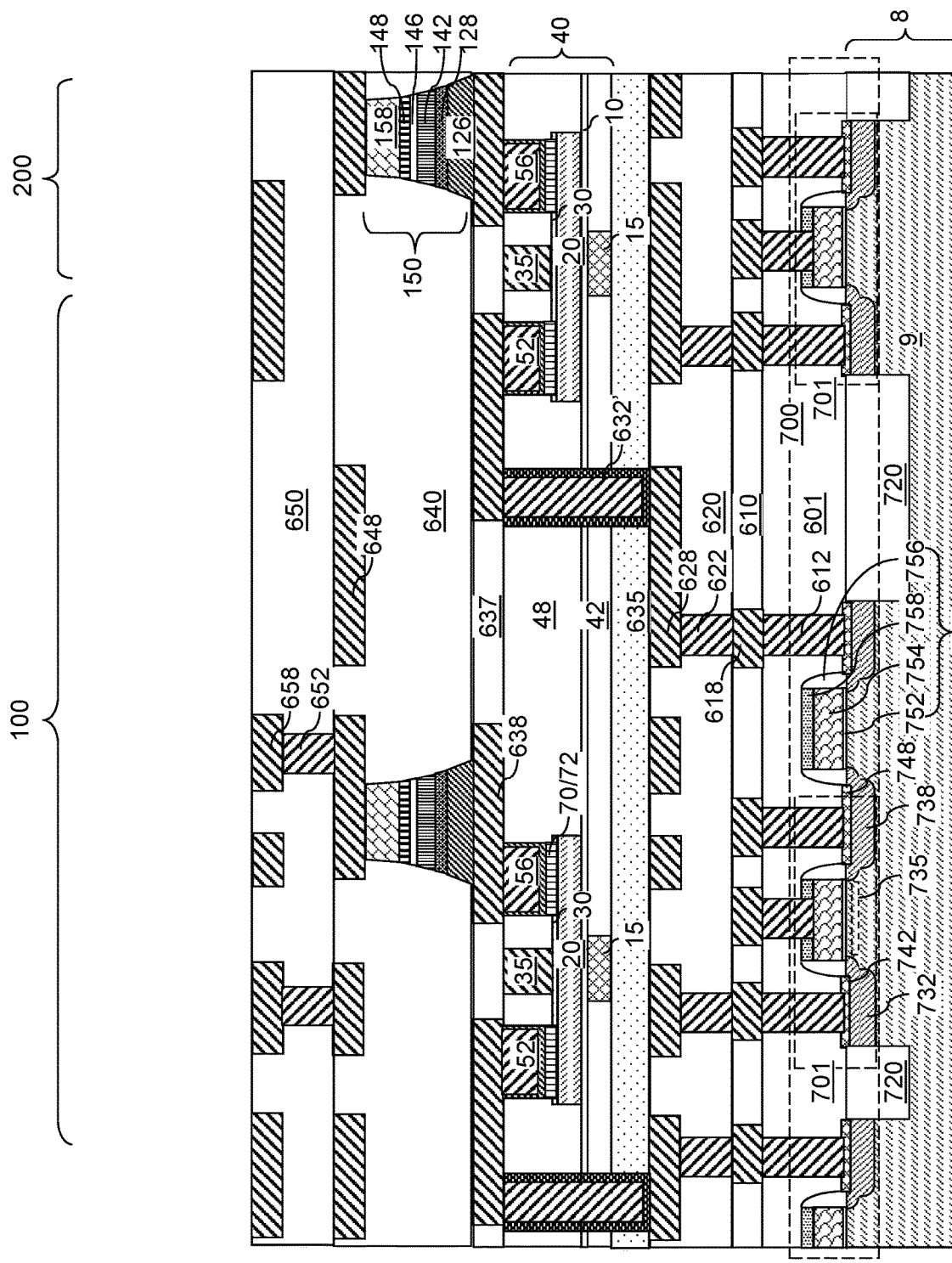
FIG. 35 is a vertical cross-sectional view of an exemplary structure after formation of a memory array and upper-level metal interconnect structures located in upper-level dielectric material layers according to an embodiment of the present disclosure.

Referring to FIG. 35, an exemplary structure is illustrated, which may be derived from any of the previously described exemplary structures by subsequently forming additional structures thereupon. For example, additional second metal via structures 632' may be formed may be formed through the TFT-level dielectric layer 40 and the insulating spacer layer 635 on a respective one of the second metal line structures 628 concurrent with, before, or after, formation of the metallic source electrodes 52 and the metallic drain electrodes 56.

A dielectric layer, which is herein referred to as a third line-level dielectric layer 637, may be deposited over the TFT-level dielectric layer 40. Third metal line structures 638 may be formed in the third line-level dielectric layer 637 on a respective one of the metallic structures (52, 56, 35, 15) embedded within the TFT-level dielectric layer 40.

Additional metal interconnect structures embedded in additional dielectric layers may be subsequently formed over the thin film transistors and the third line-level dielectric layer 637. In an illustrative example, the dielectric layers may include, for example, a fourth interconnect-level dielectric layer 640, a fifth interconnect-level dielectric layer 650, etc. The additional metal interconnect structures may include third metal via structures (not illustrated) and fourth metal lines 648 embedded in the fourth interconnect-level dielectric layer 640, fourth metal via structures 652 and fifth metal line structures 658 embedded in the fifth interconnect-level dielectric layer 650, etc.

Optionally, memory cells 150 may be formed below, above, or at the same level as, the thin film transistors. In embodiments in which the transistors are formed as a two-dimensional periodic array, the memory cells 150 may be formed as a two-dimensional periodic array of memory cells 150. Each memory cell 150 may include a magnetic tunnel junction, a ferroelectric tunnel junction, a phase change memory material, or a vacancy-modulated conductive oxide material portion. Further, each memory cell 150 may include a first electrode 126 including a metallic material, and a second electrode 158 including a metallic material and protecting an underlying data-storing portion of the memory cell 150. A memory element is provided between the first electrode 126 (i.e., the bottom electrode) and the second electrode 158 (i.e., the top electrode).

In an illustrative example, in embodiments in which the memory cell 150 includes a magnetic tunnel junction, the memory cell 150 may include a layer stack including, from bottom to top, a first electrode 126, a metallic seed layer 128 that facilitates crystalline growth of overlying material layers, a synthetic antiferromagnet (SAF) structure 142, a tunneling barrier layer 146, a free magnetization layer 148, and a second electrode 158. While the present disclosure is described using an embodiment in which the thin film transistors are used as access transistors for memory cells 150, embodiments are expressly contemplate herein in which the thin film transistors are used as logic devices, as components of a peripheral circuit for a memory array, or for any other semiconductor circuitry.

Referring collectively to FIGS. 1-35 and according to an aspect of the present disclosure, a transistor such as a thin film transistor is provided. The transistor may include: a vertical stack including, in order from bottom to top or from top to bottom, a gate electrode (15 or 35), a gate dielectric (10 or 30), and an active layer 20 and located over a substrate 8, wherein the active layer 20 may include an amorphous semiconductor material; a crystalline source region 72S may include a first portion of a crystalline semiconductor material and overlying, and electrically connected to, a first end portion 20E1 of the active layer 20; and a crystalline drain region 72D may include a second portion of the crystalline semiconductor material and overlying, and electrically connected to, a second end portion 20E2 of the active layer 20.

Referring collectively to FIGS. 1-35 and according to an aspect of the present disclosure, a transistor such as a thin film transistor is provided. The transistor may include: a vertical stack including, in order from bottom to top or from top to bottom, a gate electrode (15 or 35), a gate dielectric (10 or 30), and an active layer 20 and located over a substrate 8, wherein the active layer 20 may include an amorphous semiconductor material; a dielectric layer 48 laterally surrounding the active layer 20 and having a top surface that overlies a top surface of the active layer 20; a first stack including a crystalline source region 72S comprising a first portion of a crystalline semiconductor material and a metallic source electrode 52 located within the dielectric layer 48; and a second stack including a crystalline drain region 72D comprising a second portion of the crystalline semiconductor material and a metallic drain electrode 56 located within the dielectric layer 48.

Figure 36:
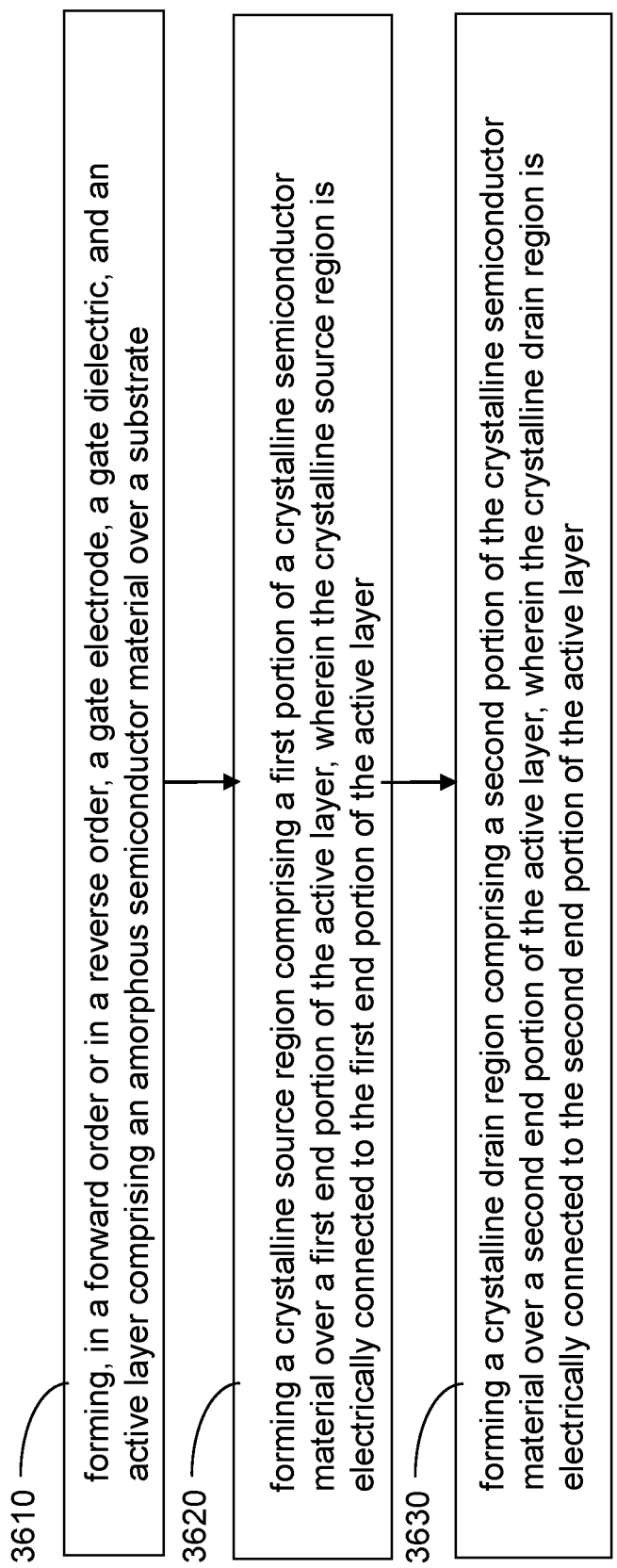
FIG. 36 is a flowchart that illustrates a set of processing steps that may be used to form any of the exemplary structures described above according to an embodiment of the present disclosure.

Referring to FIG. 36, a flow chart for a sequence of processing steps is illustrated, which may be used to form the exemplary structures of the present disclosure.

Referring to step 3610 and FIGS. 1-4C and 19A-20C, a gate electrode (15 or 35), a gate dielectric (10 or 30), and an active layer 20 that may include an amorphous semiconductor material may be formed over a substrate 8 in a forward order or in a reverse order.

Referring to step 3620 and FIGS. 5A-18C, 21A-34C, and 35, a crystalline source region 72S that may include a first portion of a crystalline semiconductor material may be formed over a first end portion 20E1 of the active layer 20, wherein the crystalline source region 72S is electrically connected to the first end portion 20E1 of the active layer 20.

Referring to step 3630 and FIGS. 5A-18C, 21A-34C, and 35, a crystalline drain region 72D that may include a second portion of the crystalline semiconductor material may be formed over a second end portion 20E2 of the active layer 20, wherein the crystalline drain region is electrically connected to the second end portion 20E2 of the active layer 20.

The crystalline materials within the devices of the present disclosure have a respective well defined structure in which all elements (including oxygen atoms) have energetically favorable positions, and thus, are not prone to outdiffusion. Thus, the thin film transistors of the present disclosure provide the benefit that the oxygen atoms in the crystalline oxide material of the template crystalline source region 70S and the template crystalline drain region 70D and the crystalline semiconductor material of the crystalline source region 72S and the crystalline drain region 72D do not easily diffuse into the metallic source electrode 52 or into the metallic drain electrode 56.

Thus, the various embodiments of the present disclosure may be used to provide a thin film transistor having lower contact resistance for the metallic source electrode 52 and the metallic drain electrode 56 compared to prior art thin film transistors. The contact resistance at the metal-semiconductor interfaces (i.e., between the crystalline source region 72S and the metallic source electrode 52, and between the crystalline drain region 72D and the metallic drain electrode 56) of devices of the present disclosure may be reduced by two mechanisms. The Schottky barrier height of devices of the present disclosure may be reduced across the metal-semiconductor interface due to reduction in oxygen diffusion into the metallic source electrode 52 and the metallic drain electrode 56. Further, the electrical doping in the crystalline source region 72S and the crystalline drain region 72D may be increased without affecting the overall dopant concentration in the active layer 20. A metal-crystalline oxide interfaces of the devices of the present disclosure may reduce the contact resistance for the metallic source electrode 52 and the metallic drain electrode 56 of the present disclosure.

In prior art thin film transistors, the semiconducting metal oxide material in the semiconductor channel is the same as the semiconducting metal oxide material that contacts a metallic source electrode and a metallic drain electrode. An attempt to reduce contact resistance by changing the dopant concentration in the portions of the semiconducting metal oxide material that contacts the metallic source electrode and the metallic drain electrode results in a collateral change in the dopant concentration in the semiconductor channel of the prior art thin film transistors.

According to another aspect of the present disclosure, the doping of the crystalline source region 72S and the crystalline drain region 72D and the doping of the active layer 20 may be independently controlled in the devices of the present disclosure. Amorphous and crystalline semiconducting metal oxide materials have different oxygen vacancy concentrations, and thus, may have different doping. Oxygen vacancy concentration, and as a result a dopant concentration, may be tuned independently during formation of the active layer 20 and during formation of the crystalline source region 72S and the crystalline drain region 72D by independently controlling deposition parameters. Further, post-deposition process parameters such as the process parameters of a post-deposition anneal process may be used to further optimize the electrical characteristics of the thin film transistors of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor comprising:
a vertical stack including, in order from bottom to top or from top to bottom, a gate electrode, a gate dielectric, and an active layer and located over a substrate, wherein the active layer comprises an amorphous semiconductor material;
a crystalline source region comprising a first portion of a crystalline semiconductor material and overlying, and electrically connected to, a first end portion of the active layer;
a crystalline drain region comprising a second portion of the crystalline semiconductor material and overlying, and electrically connected to, a second end portion of the active layer; and
a dielectric layer laterally surrounding the active layer, the crystalline source region, and the crystalline drain region, wherein:
the crystalline source region is located in a first via vertically extending from a top surface of the dielectric layer to a top surface of the active layer; and
the crystalline drain region is located in a second via vertically extending from the top surface of the dielectric layer to the top surface of the active layer.

2. The transistor of claim 1, wherein the gate dielectric contacts a top surface of the gate electrode and a bottom surface of the active layer.

3. The transistor of claim 1, wherein the gate dielectric contacts a bottom surface of the gate electrode and a top surface of a middle portion of the active layer that is located between the first end portion of the active layer and the second end portion of the active layer.

4. The transistor of claim 1, further comprising:
a metallic source electrode in contact with a top surface of the crystalline source region; and
a metallic drain electrode in contact with a top surface of the crystalline drain region.

5. The transistor of claim 4, wherein the crystalline source region comprises a tubular portion contacting an outer sidewall of the metallic source electrode and a bottom plate portion adjoined to a bottom end of the tubular portion and underlying the metallic source electrode.

6. The transistor of claim 5, wherein a top surface of the tubular portion of the crystalline source region is located within a same horizontal plane as a top surface of the metallic source electrode.

7. The transistor of claim 5, wherein:
the metallic source electrode and the metallic drain electrode are located in a dielectric layer; and
a periphery of a top surface of the crystalline source region coincides with a periphery of a bottom surface of the metallic source electrode and is in contact with the dielectric layer.

8. The transistor of claim 1, further comprising:
a template crystalline source region in contact with a bottom surface of the crystalline source region; and
a template crystalline drain region in contact with a bottom surface of the crystalline drain region.

9. The transistor of claim 8, wherein the template crystalline source region comprises a tubular portion contacting an outer sidewall of the crystalline source region and a bottom plate portion adjoined to a bottom end of the tubular portion of the template crystalline source region and underlying the crystalline source region.

10. The transistor of claim 9, wherein the tubular portion of the template crystalline source region has a top surface within a same horizontal plane as a top surface of the crystalline source region and the metallic source electrode.

11. The transistor of claim 8, wherein:
the template crystalline source region is in contact with a top surface of the first end portion of the active layer; and
the template crystalline drain region is in contact with a top surface of the second end of the active layer.

12. The transistor of claim 1, wherein:
the crystalline source region contacts a top surface of the first end portion of the active layer; and
the crystalline drain region contacts a top surface of the second end portion of the active layer.

13. A transistor comprising:
a vertical stack including, in order from bottom to top or from top to bottom, a gate electrode, a gate dielectric, and an active layer and located over a substrate, wherein the active layer comprises an amorphous semiconductor material;
a dielectric layer laterally surrounding the active layer and having a top surface that overlies a top surface of the active layer;
a first stack including a crystalline source region comprising a first portion of a crystalline semiconductor material and a metallic source electrode located within the dielectric layer; and
a second stack including a crystalline drain region comprising a second portion of the crystalline semiconductor material and a metallic drain electrode located within the dielectric layer.

14. The transistor of claim 13, further comprising:
a template crystalline source region comprising a first portion of a crystalline oxide material that is different from the crystalline semiconductor material and contacting a bottom surface of the crystalline source region; and
a template crystalline drain region comprising a second portion of the crystalline oxide material and contacting a bottom surface of the crystalline drain region.

15. A method of forming a transistor, comprising:
forming, in a forward order or in a reverse order, a gate electrode, a gate dielectric, and an active layer comprising an amorphous semiconductor material over a substrate;
forming a dielectric layer over the active layer;
forming a source-side via opening and a drain-side via opening through the dielectric layer;
forming a crystalline source region comprising a first portion of a crystalline semiconductor material over a first end portion of the active layer, wherein the crystalline source region is electrically connected to the first end portion of the active layer; and
forming a crystalline drain region comprising a second portion of the crystalline semiconductor material over a second end portion of the active layer, wherein the crystalline drain region is electrically connected to the second end portion of the active layer, and wherein the crystalline source region and the crystalline drain region are formed within the source-side via opening and the drain-side via opening, respectively.

16. The method of claim 15, further comprising:
forming a metallic source electrode on the crystalline source region in the source-side via opening; and
forming a metallic drain electrode on the crystalline drain region in the drain-side via opening.

17. The method of claim 15, further comprising:
forming a template crystalline source region comprising a first portion of a crystalline oxide material on a first surface of the active layer at a bottom of the source-side via opening, wherein the crystalline source region is formed on a top surface of the template crystalline source region; and
forming a template crystalline drain region comprising a second portion of the crystalline oxide material on a second surface of the active layer at a bottom of the drain-side via opening, wherein the crystalline drain region is formed on a top surface of the template crystalline drain region.

18. The method of claim 15, wherein the crystalline source region and the crystalline drain region are formed by a selective semiconductor deposition process that deposits the crystalline semiconductor material on semiconductor surfaces or crystalline metal oxide surfaces while suppressing growth of the crystalline semiconductor material from silicon oxide surfaces.

19. The transistor of claim 13, wherein a periphery of a top surface of the crystalline source region coincides with a periphery of a bottom surface of the metallic source electrode and is in contact with the dielectric layer.

20. The method of claim 15, wherein:
the crystalline source region is formed directly on the first end portion of the active layer; and
the crystalline drain region is formed directly on the second end portion of the active layer.

* * * * *